United States Patent
Fisher et al.

(10) Patent No.: US 11,649,995 B2
(45) Date of Patent: May 16, 2023

(54) DEVICES, SYSTEMS, AND METHODS FOR THE RAPID TRANSIENT COOLING OF PULSED HEAT SOURCES

(71) Applicant: Purdue Research Foundation, West Lafayette, IN (US)

(72) Inventors: Timothy Fisher, West Lafayette, IN (US); Jeffrey Engerer, Cedar Crest, NM (US)

(73) Assignee: Purdue Research Foundation, West Lafayette, IN (US)

(*) Notice: Subject to any disclaimer, the term of this patent is extended or adjusted under 35 U.S.C. 154(b) by 480 days.

(21) Appl. No.: 16/840,349

(22) Filed: Apr. 4, 2020

(65) Prior Publication Data
US 2020/0232684 A1    Jul. 23, 2020

Related U.S. Application Data

(63) Continuation of application No. 15/269,192, filed on Sep. 19, 2016, now Pat. No. 10,634,397.
(Continued)

(51) Int. Cl.
| | |
|---|---|
| F25B 23/00 | (2006.01) |
| F25B 49/00 | (2006.01) |
| F28F 13/18 | (2006.01) |
| F28F 13/00 | (2006.01) |
| H01L 23/473 | (2006.01) |
| F28D 15/02 | (2006.01) |

(52) U.S. Cl.
CPC ........... *F25B 23/006* (2013.01); *F25B 49/00* (2013.01); *F28D 15/0266* (2013.01);
(Continued)

(58) Field of Classification Search
CPC .... F25B 23/006; F25B 49/00; F25B 2600/01; F28D 15/0266; F28F 13/003; F28F 13/185; F28F 13/187; H01L 23/4735
See application file for complete search history.

(56) References Cited

U.S. PATENT DOCUMENTS

| | | | | |
|---|---|---|---|---|
| 4,352,392 A | * | 10/1982 | Eastman | ................ F28D 15/04 62/46.3 |
| 4,407,126 A | | 10/1983 | Aplenc | |

(Continued)

FOREIGN PATENT DOCUMENTS

CN    100456498 A    3/2015

OTHER PUBLICATIONS

WO-2021119390-A1 (Year: 2021).*
(Continued)

*Primary Examiner* — Jenna M Hopkins
(74) *Attorney, Agent, or Firm* — Reichel Stohry Dean LLP; Natalie J. Dean

(57) ABSTRACT

Heat transfer devices and systems are provided for the rapid cooling of pulsed high-powered, high-flux devices using flash boiling. Such devices comprise at least two fluidly connected chambers and a heat exchanger in thermal communication with a heat source. A flash boiling event is actively triggered at a location close to the heat source by rapid depressurization of the chamber containing a multiphase coolant. This boiling process allows for high heat transfer rates from the heat source into the chambers due to the latent heat of vaporization, which results in the rapid cooling of the heat source. A porous medium may also be positioned within a chamber of the device to enhance boiling nucleation and extended surface heat transfer. Methods of rapidly cooling pulsed heat sources are also provided using the devices and systems hereof.

19 Claims, 24 Drawing Sheets

Related U.S. Application Data

(60) Provisional application No. 62/219,737, filed on Sep. 17, 2015.

(52) U.S. Cl.
CPC .......... *F28F 13/003* (2013.01); *F28F 13/185* (2013.01); *F28F 13/187* (2013.01); *H01L 23/4735* (2013.01); *F25B 2600/01* (2013.01)

(56) References Cited

U.S. PATENT DOCUMENTS

| | | | | |
|---|---|---|---|---|
| 4,409,931 | A | 10/1983 | Lindberg | |
| 4,506,508 | A * | 3/1985 | Goers | F28B 9/06 60/659 |
| 4,603,685 | A | 8/1986 | Jean et al. | |
| 4,630,169 | A * | 12/1986 | Kelly | B05B 5/025 239/690 |
| 4,741,385 | A * | 5/1988 | Bergles | G01R 31/282 374/45 |
| 4,827,733 | A | 5/1989 | Dinh | |
| 4,882,654 | A * | 11/1989 | Nelson | H01L 23/433 361/689 |
| 4,897,762 | A * | 1/1990 | Daikoku | H01L 23/4735 361/689 |
| 4,940,085 | A * | 7/1990 | Nelson | H01L 23/467 165/185 |
| 5,021,924 | A * | 6/1991 | Kieda | H01L 23/4336 361/698 |
| 5,027,891 | A | 7/1991 | Fulford et al. | |
| 5,127,471 | A | 7/1992 | Weislogel | |
| 5,220,804 | A * | 6/1993 | Tilton | B64G 1/50 257/E23.088 |
| 5,333,677 | A | 8/1994 | Molivadas | |
| 5,349,831 | A * | 9/1994 | Daikoku | H01L 23/427 165/80.4 |
| 5,491,363 | A * | 2/1996 | Yoshikawa | H01L 23/4332 257/E23.091 |
| 5,522,452 | A * | 6/1996 | Mizuno | H01L 23/427 165/286 |
| 5,968,312 | A | 10/1999 | Sephton | |
| 5,987,892 | A * | 11/1999 | Watanabe | A47G 29/141 62/434 |
| 6,264,113 | B1 | 7/2001 | Dingler | |
| 6,330,153 | B1 * | 12/2001 | Ketonen | H05K 7/20145 361/689 |
| 6,431,260 | B1 | 8/2002 | Agonafer et al. | |
| 6,442,951 | B1 | 9/2002 | Maeda et al. | |
| 6,793,007 | B1 | 9/2004 | Kramer et al. | |
| 6,827,135 | B1 * | 12/2004 | Kramer | H01L 23/4735 174/15.1 |
| 6,836,131 | B2 * | 12/2004 | Cader | G01R 1/0458 324/750.08 |
| 6,996,996 | B1 * | 2/2006 | Cader | G01R 31/2874 62/118 |
| 7,086,455 | B1 * | 8/2006 | Tilton | F28F 7/02 165/104.33 |
| 7,114,550 | B2 * | 10/2006 | Nakahama | F28F 3/12 361/689 |
| 7,159,407 | B2 * | 1/2007 | Chen | F25B 1/00 62/100 |
| 7,213,636 | B2 * | 5/2007 | Bhatti | H01L 23/4735 165/80.4 |
| 7,224,586 | B2 | 5/2007 | Fustaniwskyi et al. | |
| 7,254,957 | B2 | 8/2007 | Weber et al. | |
| 7,308,801 | B1 | 12/2007 | Tilton et al. | |
| 7,331,377 | B1 * | 2/2008 | Toy | F28F 13/185 257/714 |
| 7,607,475 | B2 | 10/2009 | Weber | |
| 7,610,769 | B2 * | 11/2009 | Tain | H01L 23/4735 165/80.4 |
| 7,684,194 | B2 * | 3/2010 | Natarajan | H01L 23/473 361/698 |
| 7,885,070 | B2 * | 2/2011 | Campbell | H05K 7/20809 361/698 |
| 7,908,874 | B2 | 3/2011 | Weber et al. | |
| 7,992,626 | B1 * | 8/2011 | Tilton | H01L 23/4735 361/25 |
| 8,944,151 | B2 * | 2/2015 | Flotta | H05K 7/20772 165/80.4 |
| 9,219,022 | B2 * | 12/2015 | Parida | H05K 7/20218 |
| 9,648,781 | B2 * | 5/2017 | Yang | H05K 7/20345 |
| 9,677,817 | B1 | 6/2017 | Dudis et al. | |
| 9,903,664 | B2 * | 2/2018 | Joshi | H01L 23/4735 |
| 10,028,410 | B2 * | 7/2018 | Parida | B23P 15/26 |
| 10,051,762 | B2 * | 8/2018 | Yang | F28D 20/0034 |
| 10,096,537 | B1 | 10/2018 | Chen et al. | |
| 10,321,609 | B2 * | 6/2019 | Hirai | H05K 7/20236 |
| 10,622,329 | B2 * | 4/2020 | Law | H01L 23/4735 |
| 10,665,529 | B2 * | 5/2020 | Smith | H01L 23/4735 |
| 10,798,851 | B1 * | 10/2020 | Weber | H05K 7/20327 |
| 2002/0163782 | A1 | 11/2002 | Cole et al. | |
| 2003/0098588 | A1 | 5/2003 | Yazawa et al. | |
| 2003/0226371 | A1 * | 12/2003 | Rini | F28F 13/02 62/304 |
| 2004/0018305 | A1 | 1/2004 | Pagano et al. | |
| 2004/0037045 | A1 | 2/2004 | Phillips et al. | |
| 2004/0089008 | A1 * | 5/2004 | Tilton | F28D 15/0258 62/304 |
| 2004/0168685 | A1 | 9/2004 | Lange | |
| 2004/0194929 | A1 | 10/2004 | Ippoushi et al. | |
| 2004/0250562 | A1 | 12/2004 | Adiga et al. | |
| 2005/0024831 | A1 | 2/2005 | Phillips et al. | |
| 2005/0067155 | A1 | 3/2005 | Thayer et al. | |
| 2005/0155744 | A1 | 7/2005 | Ippoushi et al. | |
| 2006/0117782 | A1 * | 6/2006 | Rini | F25B 19/02 62/304 |
| 2006/0162365 | A1 | 7/2006 | Hoang et al. | |
| 2007/0028960 | A1 * | 2/2007 | Royne | H01L 31/0521 257/E23.093 |
| 2008/0173260 | A1 | 7/2008 | Lange | |
| 2008/0210406 | A1 * | 9/2008 | Rini | F25B 1/00 165/104.19 |
| 2009/0050294 | A1 | 2/2009 | Fedorov | |
| 2009/0121038 | A1 * | 5/2009 | Wurz | B05B 7/2489 239/602 |
| 2009/0314467 | A1 * | 12/2009 | Campbell | H01L 23/4735 165/80.4 |
| 2010/0269501 | A1 | 10/2010 | Parrella | |
| 2010/0270001 | A1 | 10/2010 | Parrella | |
| 2010/0328888 | A1 | 12/2010 | Campbell et al. | |
| 2012/0018133 | A1 | 1/2012 | Postma et al. | |
| 2012/0097374 | A1 | 4/2012 | Altman | |
| 2012/0120604 | A1 | 5/2012 | Hao et al. | |
| 2013/0233523 | A1 | 9/2013 | Parida | |
| 2014/0204534 | A1 | 7/2014 | Choudhury et al. | |
| 2014/0252864 | A1 | 9/2014 | Kulkarni et al. | |
| 2014/0284029 | A1 | 9/2014 | Yoshida | |
| 2014/0318731 | A1 | 10/2014 | Mucciardi et al. | |
| 2015/0007965 | A1 * | 1/2015 | Joshi | H01L 23/4735 165/185 |
| 2015/0068170 | A1 | 3/2015 | Collet | |
| 2015/0072424 | A1 * | 3/2015 | Ma | F25D 3/10 62/304 |
| 2015/0226472 | A1 | 8/2015 | Scherer | |
| 2015/0238986 | A1 | 8/2015 | Hasselschwert | |
| 2015/0289413 | A1 | 10/2015 | Rush et al. | |
| 2015/0330670 | A1 | 11/2015 | Wynn, Jr. | |
| 2016/0120059 | A1 | 4/2016 | Shedd et al. | |
| 2017/0056974 | A1 | 3/2017 | Miyashita et al. | |
| 2017/0069606 | A1 | 3/2017 | Gould et al. | |
| 2017/0146273 | A1 * | 5/2017 | Spitzner | H05K 7/20336 |
| 2018/0368289 | A1 | 12/2018 | Wang | |

OTHER PUBLICATIONS

EP-3171111-A1 (Year: 2017).*
WO-03063241-A2 (Year: 2003).*
DE-10333877-A1 (Year: 2005).*

* cited by examiner

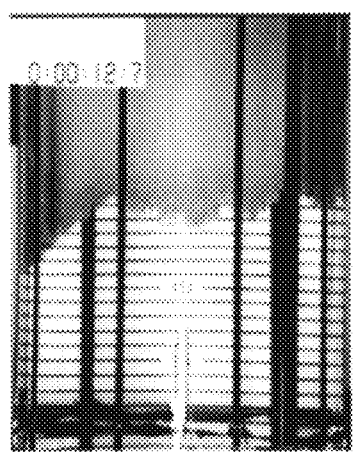 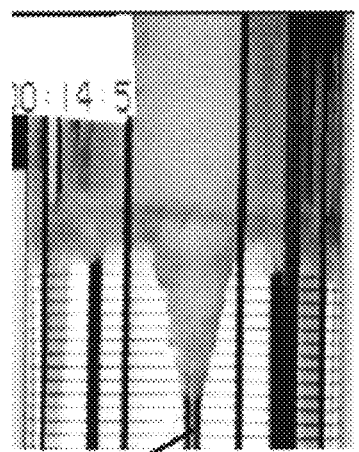 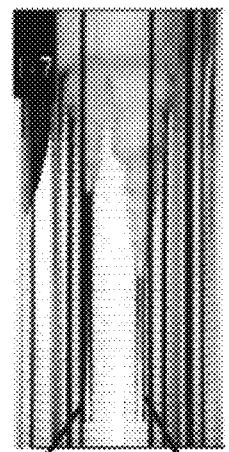
SS - tube     SS - rod    Cu - rod
FIG. 1G      FIG. 1H      FIG. 1I
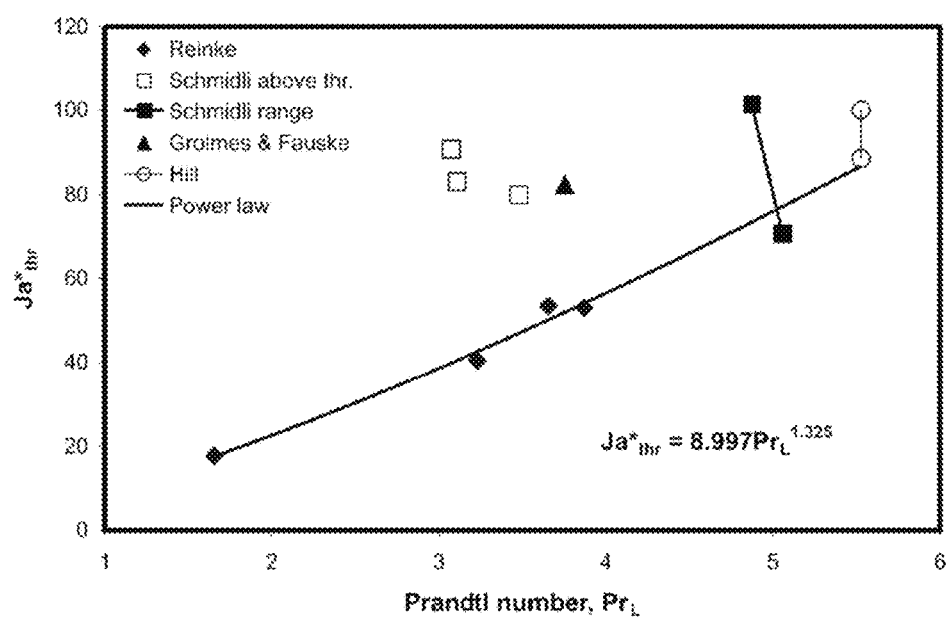
FIG. 1J (a) Bi=0.1

(b) Bi=1

(c) Bi=10

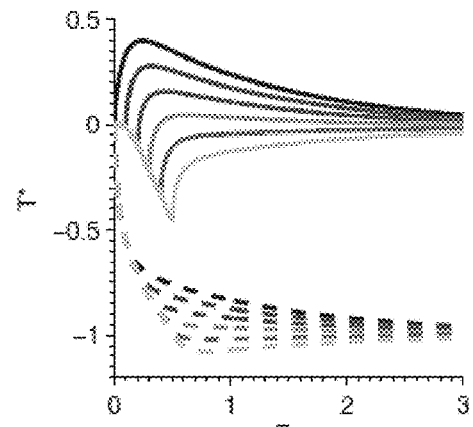
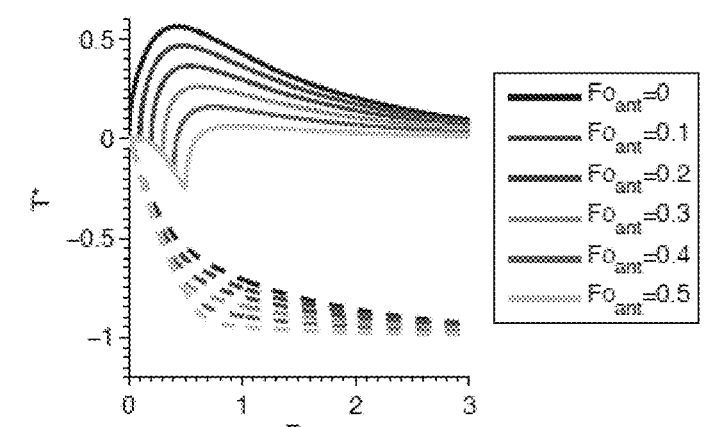
FIG. 26A    FIG. 26B
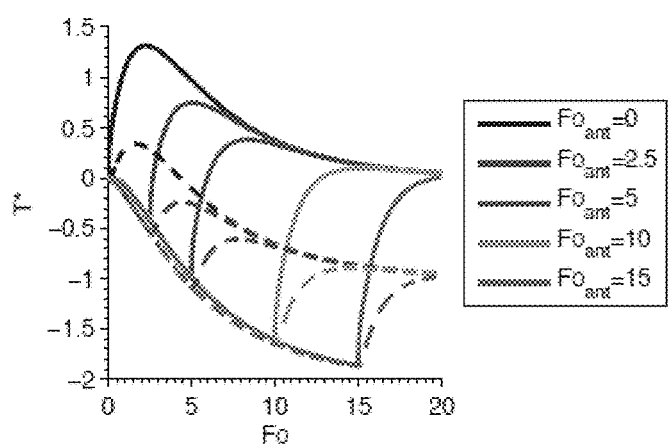
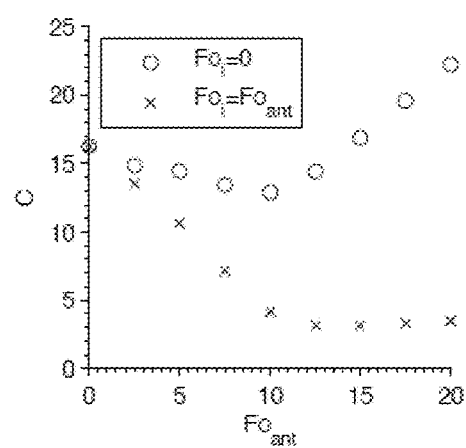
FIG. 27A    FIG. 27B (a) Temperature for $U = 0.1$ m/s (b) Heat Flux at Base (a) Temperature for $u = 0.1$ m/s (b) Heat Flux at Base (a) Nitrogen Isotherm (b) BET Plot (a) Nitrogen Isotherm (b) BET Plot (a) Active-desorption length (b) Heat flux at base (a) Active-desorption length (b) Heat flux at base

DEVICES, SYSTEMS, AND METHODS FOR THE RAPID TRANSIENT COOLING OF PULSED HEAT SOURCES

PRIORITY

This application is related to, a U.S. continuation application of, and claims priority benefit of U.S. patent application Ser. No. 15/269,192 to Fisher et al, filed Sep. 19, 2016, which is related to and claims the priority benefit of U.S. Provisional Patent Application Ser. No. 62/219,737 to Fisher et al., filed Sep. 17, 2015. The entire contents of each of the aforementioned priority applications are hereby incorporated by reference in their entireties into this disclosure.

BACKGROUND

Cooling mechanisms are commonly implemented to constrain the temperature of high-heat-flux devices within an allowable range. Thermal drift can result in various negative consequences, including decreased efficiency, reduced life, and even device failure. When a high-power device actuates in a transient manner, the challenge of maintaining stable temperature is considerably more difficult, especially if the thermal time constant of the device is relatively small. Indeed, the cooling must be cycled very rapidly to match the pulsed heat load.

For example, laser diode arrays require uniform temperature, both spatially and temporally, to reduce wavelength shift and spectral broadening. A lasing event is commonly implemented as a series of high current density quasi-continuous-wave pulses that are between 10 µs to 1 ms in duration and induce a local temperature change of 1-10° C. This short timescale thermal behavior is overlaid on a longer timescale response resulting from the average power (~100 ms). The spectral output of an 808 nm GaAs quantum-well semiconductor laser shifts by 0.27 nm ° $C.^{-1}$ as the mean temperature of the device drifts.

In this and similar applications, the objective is to keep the device at a near-constant temperature throughout the duration of device actuation. To achieve this, the cooling mechanism must be tuned to the thermal mass and heat output of the device. A higher initial rate of cooling would offset the thermal mass of the device, preventing thermal overshoot during the transient start-up period, while ongoing cooling could ensure stable temperature after the initial thermal transients die out.

Under such conditions, a cooling mechanism designed for transient performance can significantly improve device performance. Of the commonly employed cooling approaches capable of moderate-to-high heat flux, some are better suited to transient actuation than others. While pool/flow-boiling processes typically have long start-up periods that are not ideal, other methods such as jet-impingement, spray, and microchannel cooling are more promising candidates for transient performance. Nevertheless, none of these conventional cooling techniques rely on inherently transient phenomena—indeed, they assume steady state and are only initiated and then sustained continually. With conventional techniques, even if the cooling mechanism can be activated in a stepwise manner, the thermal resistance and capacitance of the system results in thermal fluctuations that cannot be entirely eliminated.

Conversely, flash boiling of a liquid pool is unique in that the phenomenon is inherently transient, with phase-change typically initiating at a maximum and decaying with time. In contrast, phase change in many conventional architectures is limited to a thermal boundary layer near the heated surface, characterized by the wall superheat.

The term "flash boiling" includes a number of different phase-change processes that initiate from a pressure drop, whether due to the fluid flowing through a pressure gradient or the depressurization of an otherwise stationary body of fluid. This rapid depressurization to a condition below the saturation pressure causes the vapor pressure of the liquid to meet or exceed the pressure of its environment and results in a body of liquid that is uniformly superheated. The liquid superheat, which is not easily attainable in traditional boiling hierarchies and is typically characterized by the Jakob number, provides the requisite latent enthalpy for rapid phase change and, as a result, high rates of expansion and cooling.

The flash boiling of a stream of fluid, i.e., a flashing flow, is commonly used for atomization processes in which a liquid is injected into an environment where the pressure is at or below the vapor pressure of either the fluid or one of its constituents. Typically, upon injection the flashing fluid is in a significantly superheated state, resulting in a rapid phase-change process and an associated fine dispersion. This technique is considered to be one of the more effective methods of atomizing a fluid and its use ranges from domestic aerosols to direct fuel injection.

The alternate scenario, in which a body of fluid is depressurized, has been studied at widely varying degrees of nonequilibrium ranging from highly restricted venting of pressurized vessels to explosive homogenous nucleation at the superheat limit. As it does with flashing flows, the rate and the magnitude of the pressure drop significantly alters the nature of the phase-change process experienced by the fluid. If the rate of depressurization is sufficiently low, the liquid-gas system can be considered to remain in thermodynamic equilibrium throughout the entire event, and the phase change can be treated as a thermodynamically limited process. More commonly however, a certain degree of superheat will be attained by the liquid as controlled by the kinetics of the phase-change process.

Once the fluid attains a certain level of superheat, heterogeneous boiling may initiate depending on the size and density of nucleation sites available and, in transient processes, the amount of time the fluid dwells at the given level of superheat. Higher levels of superheat will typically result in a faster heterogeneous boiling process as more nucleations sites become active. These nucleation sites can include surface defects that are not fully wetted and absorbed gas within the liquid. A liquid can remain in this metastable state for a practically indefinite amount of time if no sufficient sites are available.

If the superheat is attained quickly enough as determined by the nucleation sites available, the fluid can reach the superheat limit and initiate homogeneous boiling. At this limit, the fluid reaches a point of thermodynamic instability, and boiling occurs volumetrically throughout the fluid irrespective of the presence of nucleation sites.

Flash boiling of a pool of liquid can also occur at intermediate levels of superheat. Upon depressurization, the phase-change process commonly is manifested as a boiling front that propagates from the liquid-gas interface downwards through the liquid. Alternately, the boiling event can initiate and propagate from the surfaces of the vessel.

Despite the finite duration of the event, flash-boiling may still be suitable for transient applications that require pulsed cooling for time periods in the range of 100 milliseconds to 10 seconds. In particular, the flash results in an initial peak cooling that wanes to a quasi-steady state value, which may be useful for counteracting the thermal mass of a heated device to achieve a more constant transient temperature. What is needed are heat management methods that apply flash boiling to heat-heat-flux cooling, as well as convective cooling systems that utilize flash boiling—or similar transient phenomena—to efficiently transfer heat from a hot body via a phase change and/or conduction.

BRIEF SUMMARY

The present disclosure includes disclosure of a heat transfer device, comprising a first chamber and at least one second chamber, the first chamber in fluid communication with each of the at least one second chambers via one or more transverse ports, defining an interior, and comprising a top, a bottom and at least one inlet port, and each of the at least one second chambers in fluid communication with an exit port; and a heat exchanger in thermal communication with one or more heat sources and the first chamber, the heat exchanger for receiving heat energy from the one or more heat sources and uniformly distributing the heat energy and positioned adjacent to the bottom of the first chamber and one or more of the transverse ports; wherein when fluid is received within the interior of the first chamber and the chamber is depressurized, a flash boiling event can occur within the first chamber and a convective transfer of heat energy from the one or more heat sources into the fluid results.

The present disclosure includes disclosure of a heat transfer device, wherein the at least one inlet port of the first chamber is positioned to promote a flow of fluid into the interior, toward the bottom of the first chamber, and through the one or more transverse ports; and the exit port is in communication with a vacuum source such that suction can be applied therethrough to pull the flow of fluid through the at least one second chamber and the exit port.

The present disclosure includes disclosure of a heat transfer device, further comprising a porous medium positioned within the interior of the first chamber, the porous medium comprising a morphology that provides enhanced nucleate boiling characteristics.

The present disclosure includes disclosure of a heat transfer device, wherein the morphology comprises pores, channels, microchannels, minichannels, fins, surface fins, and/or slate fins.

The present disclosure includes disclosure of a heat transfer device, wherein the porous medium is configured to absorb fluid therein such that when a flash boiling event occurs within the first chamber, an increase in enthalpy results.

The present disclosure includes disclosure of a heat transfer device, wherein the porous medium comprises a body extending between a first end and a second end; the morphology of the porous medium comprises a hierarchical pore size distribution ranging from a smallest pore size to a largest pore size along the length of the porous medium, with the smallest pore size positioned at or near the second end of the porous medium; and the second end of the porous medium is adjacent to the bottom of the inner chamber.

The present disclosure includes disclosure of a heat transfer device, wherein the porous medium comprises a body extending between a first end and a second end and the morphology of the first end of the porous medium comprises a borehole capable of retaining a pool of fluid.

The present disclosure includes disclosure of a heat transfer device, wherein the porous medium comprises a body comprising a center and extending between a first end and a second end; the morphology of the porous medium decreases in porosity radially to direct the flow of fluid absorbed therein toward the center and second end of the porous medium; and the second end of the porous medium is adjacent to the heat exchanger and at least one heat source.

The present disclosure includes disclosure of a heat transfer device, wherein the morphology of the porous medium comprises a plurality of pores, each pore defining an inner surface, and at least some of the pores comprising a synthesized nanostructure on the inner surface.

The present disclosure includes disclosure of a heat transfer device, wherein the heat exchanger is in fluid communication with the interior of the first chamber and the porous medium is coupled with the heat exchanger by a braze joint.

The present disclosure includes disclosure of a heat transfer system, a heat transfer system comprising a heat transfer device, comprising a first chamber and at least one second chamber, the first chamber in fluid communication with each of the at least one second chambers via one or more transverse ports, defining an interior, and comprising a top, a bottom and at least one inlet port, and each of the at least one second chambers in fluid communication with an exit port, and a heat exchanger in thermal communication with one or more heat sources and the first chamber, the heat exchanger for receiving heat energy from the one or more heat sources and uniformly distributing the heat energy and positioned adjacent to the bottom of the first chamber and one or more of the transverse ports, wherein when fluid is received within the interior of the first chamber and the chamber is depressurized, a flash boiling event can occur within the first chamber and a convective transfer of heat energy from the one or more heat sources into the fluid results; a first low pressure reservoir in fluid communication with the exit port of the heat transfer device via a first tubing and a vacuum pump via a second tubing, the first tubing comprising at least one first valve for isolating the first low pressure reservoir from the heat transfer device when closed; and a supply of phase change fluid, the supply in fluid communication with the at least one inlet port of the first chamber of the heat transfer device and a pump.

The present disclosure includes disclosure of a heat transfer system, wherein the at least one first valve of the first tubing comprises a pneumatically actuated valve.

The present disclosure includes disclosure of a heat transfer system, further comprising a second low pressure reservoir in fluid communication with the first low pressure reservoir via a third tubing, the third tubing comprising a second valve for isolating the second low pressure reservoir from the first low pressure reservoir when closed, and wherein the second low pressure reservoir comprises a greater volume than the first low pressure reservoir.

The present disclosure includes disclosure of a heat transfer system, wherein the supply of phase change fluid comprises a storage reservoir and the vacuum pump is in fluid communication with the storage reservoir via a fourth tubing such that vapor pulled from the exit port of the heat transfer device can flow through the vacuum pump, the forth tubing, and into the storage reservoir.

The present disclosure includes disclosure of a heat transfer system, further comprising a means for rapidly refilling the inner chamber of the heat transfer device to allow for a cyclic introduction of phase change fluid from the supply of phase change fluid into the heat transfer device in synchrony with a cyclic heating event of the one or more heat sources of the heat transfer device.

The present disclosure includes disclosure of a heat transfer system, wherein the heat transfer device further comprises a porous medium positioned within the interior of the first chamber, the porous medium comprising a morphology that provides enhanced nucleate boiling characteristics.

The present disclosure includes disclosure of a method for rapidly cooling a heat source, the method comprising the steps of providing a heat transfer device comprising a first chamber and at least one second chamber, the first chamber in fluid communication with each of the at least one second chambers via one or more transverse ports, defining an interior, and comprising a top, a bottom and at least one inlet port, and each of the at least one second chambers in fluid communication with an exit port, and a heat exchanger in thermal communication with one or more heat sources and the first chamber, the heat exchanger for receiving heat energy from the one or more heat sources and uniformly distributing the heat energy and positioned adjacent to the bottom of the first chamber and one or more of the transverse ports, wherein when fluid is received within the interior of the first chamber and the chamber is depressurized, a flash boiling event can occur within the first chamber and a convective transfer of heat energy from the one or more heat sources into the fluid results; filling the first chamber of the heat transfer device with an amount of a phase change fluid; and rapidly cooling the one or more heat sources through convective heat transfer by rapidly depressurizing the inner chamber of the heat transfer device such that a rapid temperature drop in the phase change fluid results; wherein the step of rapidly cooling the one or more heat sources is actively triggered in connection with an actual or anticipated heat pulse from the one or more heat sources and the one or more heat sources maintains a substantially even temperature during the heat pulse.

The present disclosure includes disclosure of a method for rapidly cooling a heat source, wherein the heat transfer device further comprises a porous medium positioned within the interior of the first chamber, the porous medium comprising a morphology that provides enhanced nucleate boiling characteristics; and the amount of phase change fluid used to fill the first chamber only partially fills the inner chamber of the heat transfer device such that the fluid does not fully immerse the porous medium positioned within the interior of the first chamber; and further comprising the step of promoting the downward flow of the phase change fluid through the interior of the inner chamber such that the rapid temperature drop occurs adjacent to the one or more heat sources.

The present disclosure includes disclosure of a method for rapidly cooling a heat source, wherein the amount of phase change fluid used to fill the first chamber is selected to match a total energy of a heat pulse from the heat source.

The present disclosure includes disclosure of a method for rapidly cooling a heat source, wherein the step of rapidly depressurizing the inner chamber of the heat transfer device is actively triggered in advance of the heat pulse by 10-1000 milliseconds.

BRIEF DESCRIPTION OF THE DRAWINGS

The disclosed embodiments and other features, advantages, and aspects contained herein, and the matter of attaining them, will become apparent in light of the following detailed description of various exemplary embodiments of the present disclosure. Such detailed description will be better understood when taken in conjunction with the accompanying drawings, wherein:

FIGS. 1G-1I show photographs of evaporation waves with and without metallic rods;

FIG. 1J shows a graph of a correlation for the absolute threshold for evaporation waves;

FIGS. 26A and 26B show graphical depictions of data related to the intensified temperature overshoot when the cooling mechanism cannot be actuated instantly, with FIG. 26A where the fluid temperature was assumed to be constant and FIG. 26B where the fluid temperature was initially zero before reaching the steady-state value;

FIGS. 27A and 27B show graphical depictures of data related to the intensified temperature overshoot when the cooling mechanism actuates very slowly, with FIG. 27A where transient fluid temperature is displayed for varying anticipation and FIG. 27B where the value of the cost function is shown with additional points to fill in the curve;

Figure 1A:
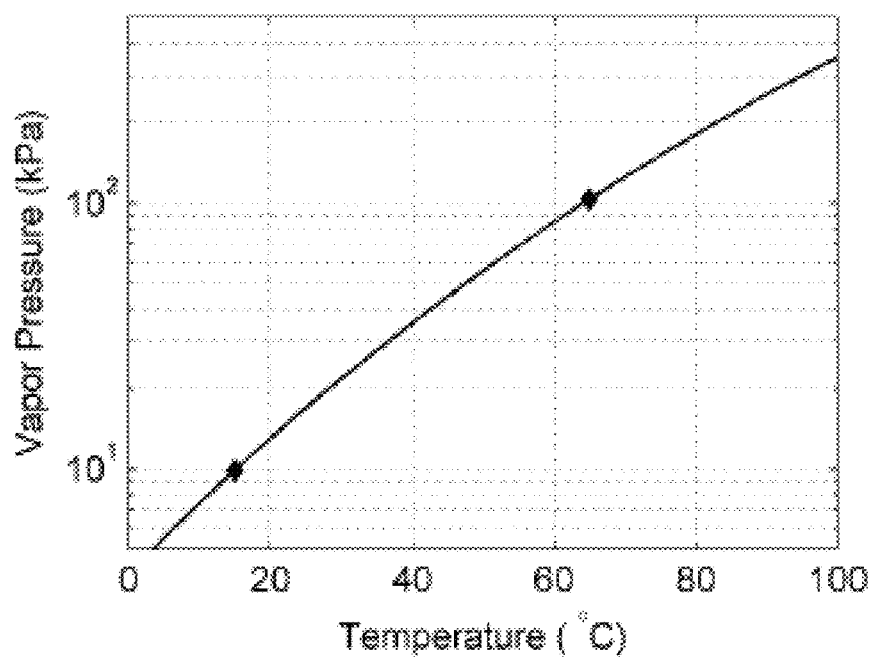
FIG. 1A displays the vapor pressure curve for methanol at varying temperatures.

While the present disclosure is susceptible to various modifications and alternative forms, exemplary embodiments thereof are shown by way of example in the drawings and are herein described in detail.

DETAILED DESCRIPTION

For the purposes of promoting an understanding of the principles of the present disclosure, reference will now be made to the embodiments illustrated in the drawings and specific language will be used to describe the same. It will nevertheless be understood that no limitation of scope is intended by the description of these embodiments. On the contrary, this disclosure is intended to cover alternatives, modifications, and equivalents as may be included within the spirit and scope of this application as defined by the appended claims. As previously noted, while this technology may be illustrated and described in one or more preferred embodiments, the compositions, systems and methods hereof may comprise many different configurations, forms, materials, and accessories.

In the following description, numerous specific details are set forth in order to provide a thorough understanding of the present disclosure. Particular examples may be implemented without some or all of these specific details. Although any methods and materials similar to or equivalent to those described herein can be used in the practice or testing of the subject of the present application, the preferred methods and materials are described herein.

Furthermore, wherever feasible and convenient, like reference numerals are used in the figures and the description to refer to the same or like parts or steps. The drawings are in a simplified form and not to precise scale. It is understood that the disclosure is presented in this manner merely for explanatory purposes and the principles and embodiments described herein may be applied to devices and/or system components that have dimensions/configurations other than as specifically described herein. Indeed, it is expressly contemplated that the size and shapes of the composition and system components of the present disclosure may be tailored in furtherance of the desired application thereof.

Unless defined otherwise, all technical and scientific terms used herein have the same meaning as commonly understood by one of skill in the relevant arts. Although any methods and materials similar to or equivalent to those described herein can be used in the practice or testing of the subject of the present application, the preferred methods and materials are described herein. Additionally, as used in this specification and the appended claims, the singular forms "a", "an" and "the" include plural referents unless the content clearly dictates otherwise. Furthermore, unless specifically stated otherwise, the term "about" refers to a range of values plus or minus 10% for percentages and plus or minus 1.0 unit for unit values, for example, about 1.0 refers to a range of values from 0.9 to 1.1.

Embodiments of the present disclosure provide various devices, systems, and methods relating to a novel heat transfer technique achieved via a phase-change fluid. Generally, many high-powered, pulsed high-heat-flux devices—such as laser diode arrays, radio frequency integrated circuit chips, and high burst radar devices—include energizing heat sources that are transient or last for around 1+ second(s) (i.e. they turn on and off in rapid succession), but also require a uniform temperature even while the device itself is producing heat. Active cooling mechanisms are commonly included with these devices to keep their temperature within an allowable range as thermal drift can result in a variety of negative consequences. However, when a high-power device actuates in a transient manner, the challenge of maintaining a stable temperature is significant, especially where the thermal time constant of the device is relatively small.

The majority of conventional cooling solutions assume steady state (e.g., convective cooling (gas or liquid) and pool boiling (liquid-vapor phase change (phase-change promotes convection and cools the working fluid)). While steady-state methods can be directly applied to transient cooling scenarios, time constants may not be appropriate and you miss out on the opportunity to engineer thermal storage. These disadvantages encourage the cooling technology to be reimagined and optimized for new, transient applications.

The systems, devices, and methods of the present disclosure provide a transient, effective, and actively controlled cooling approach through the use of the flash boiling process that is capable of: 1) absorbing a high incident heat flux; 2) tuning the cooling rate to match heat load; 3) rapidly responding to thermal load; and 4) imposing minimal constraints on the main system. Leveraging the high heat transfer rates associated with flash boiling, the inventive concepts hereof are useful to cool a heat source for a fixed duration of time and can be matched to, for example, a pulsed heat source such as laser diode arrays that drive pulsed lasers and other electronic devices that have pulsed power duty cycles. Indeed, the devices and systems hereof provide a much improved response time constant over those of conventional systems, with the novel systems and methods hereof reaching full cooling capacity extremely rapidly relative to the thermal event. Furthermore, such novel approaches allow for thermal storage through the use of desorption. Perhaps more specifically, by performing actively controlled flash boiling events within a flash chamber, the significant change of fluid temperature induced by the flash boiling process can be used to pull heat away from the hot body/heat source of interest (i.e. a high-heat-flux device) and achieve thermal latency.

A general description of flash boiling is now provided, followed by in-depth descriptions of the novel devices, systems, and methods of the present disclosure. To further facilitate a clear understanding of the present disclosure, experimental data and representative examples then follow, as well as a detailed description of the mathematical framework associated with the underlying concepts of this inventive technology.

Flash Boiling

In comparison to common cooling techniques for high-power-density electronics, flash boiling is distinguished by its inherently transient nature. Whereas other cooling mechanisms are appropriate for steady-state heat generation, sudden depressurization of the working fluid results in extensive phase change over a time period on the order of 100 ms. As the flash evolves, the fluid is chilled by the latent heat of vaporization as it rapidly accelerates. Both of these effects are highly favorable for convective heat transfer, thereby motivating the focus on this phenomenon for transient cooling.

As an example, FIG. 1 shows the variation of the vapor pressure of methanol with temperature. When methanol is initially heated to its boiling point (65° C.) at atmospheric pressure is depressurized to 0.1 bar, the saturation temperature of the new pressure condition is only 15° C. Assuming the liquid vessel was depressurized at a rate significantly faster than phase-change, the majority of the liquid remains at the initial temperature, which is now 50° C. above the boiling point. The amount by which the liquid temperature is above its saturation temperature is referred to as "superheat." The highly non-equilibrium state induces phase-change, and the superheat of the liquid subsequently decreases until saturation temperature is reached. Depending on what phase-change mechanisms are active, equilibration of the liquid and vapor phases may proceed rapidly (<1 s) or take a much longer time (>1 min).

Superheated Liquids. The concept of superheat is useful when discussing complex phase-change systems because it describes both the pressure and temperature of the transient system in a manner highly relevant to the phase-change mechanisms. A liquid can become superheated either by rapid heating or by depressurization.

Superheated liquids are not unique to flash boiling systems. In any engineering system involving liquid-vapor phase change, some degree of superheat exists in the liquid before vaporization occurs. In the case of pool boiling, the superheat of the liquid in a thermal boundary layer near the heated surface determines the rate of vaporization. The superheat of a pool-boiling system is most commonly monitored by measuring the degree to which the wall temperature exceeds the saturation temperature of the fluid. What distinguishes flash boiling is the fact that the entirety of the liquid is superheated upon depressurization, whereas only a thin boundary layer near the heated surface is superheated for pool boiling.

As the superheat of the liquid increases, so does rate at which phase change occurs. At higher superheats, thermal energy is provided to the liquid-vapor interface, where latent heat is required, at a faster rate. In addition, higher superheat will generally activate more nucleation sites. Both of these concepts are highly relevant when analyzing flash-boiling cooling systems and are discussed later in more detail.

A superheated liquid exists in a metastable state, meaning that if allowed enough time, the superheated liquid will reach a saturated liquid-vapor state. For example, even in the absence of nucleation sites, a pool of superheated liquid vaporizes from the free surface. This process is relatively slow, however, since the latent heat of vaporization produces a thermal boundary layer that impedes further phase change. In contrast, nucleate boiling prevents stagnation by the constant generation of interfacial area via bubble growth and departure.

Figure 1B:
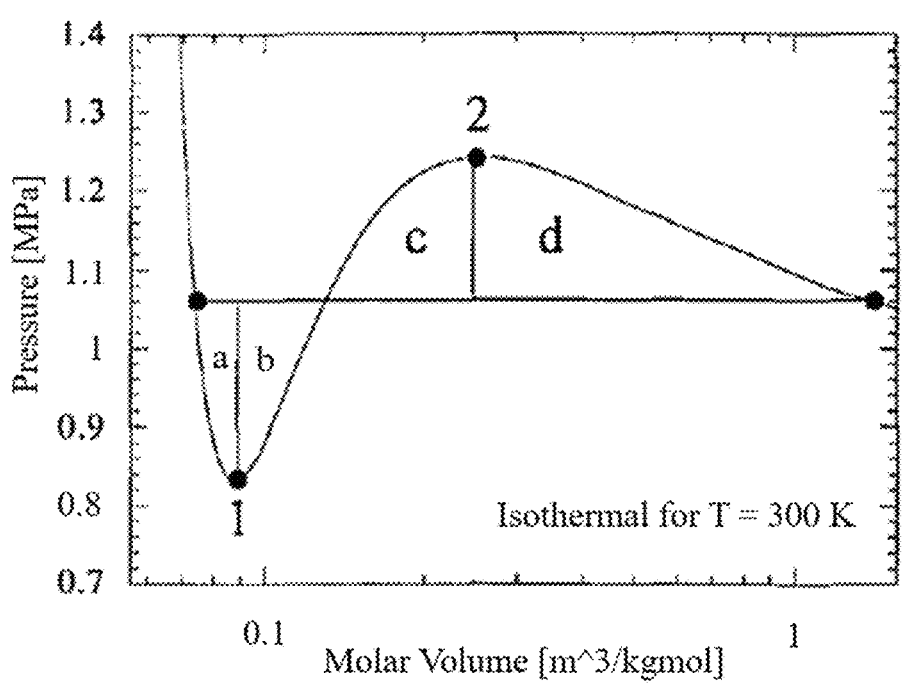
FIG. 1B displays the van der Waals equation of state for Refrigerant 22.

FIG. 1B displays the van der Waals equation of state for Refrigerant 22. The extreme left and right points mark the saturated liquid and vapor states respectively, which form the boundaries of the vapor dome. Region 'a' represents the superheated liquid state. The liquid pressure in this region falls below the saturation pressure (horizontal line).

The superheat of the liquid is limited by point 1 in FIG. 1B, which is known as the thermodynamic superheat limit. When heated or depressurized to the thermodynamic superheat limit, the liquid enters into unstable regions 'b' and 'c.' Phase-change in this limit is referred to as homogeneous, since it no longer relies on the presence of a liquid-vapor interface (heterogeneous phase change). The processes described herein are performed far from the thermodynamic superheat limit. For example, the temperature at the superheat limit of methanol at atmospheric pressure is 190° C., which equates to a superheat of 125° C.

Thermal Characteristics of Flash Boiling. The rapid vaporization during a flash derives the requisite thermal energy from the superheat of the liquid. As a result, some of the total cooling available due to phase change is lost to the specific heat of the liquid. If the excess specific heat of the superheated liquid is comparable in magnitude to the latent heat, then the total cooling effect will be reduced. To analyze this effect, it is informative to consider the Jakob number:

$$Ja_h = \frac{c_{p,l}(T_l - T_{sat}(P_l))}{h_{fg}} \quad (1.1)$$

where $c_{p,l}$ is the specific heat of the liquid, $T_l$ is the temperature of the liquid, $T_{sat}$ is the saturation temperature at the given pressure for the liquid, $P_l$, and $h_{fg}$ is the latent heat of the working fluid.

The Jakob number, in the form above, relates the thermal energy of the superheated liquid to the latent heat. In this sense, the Jakob number is a percentage of the latent heat that must be expended to cool the bulk liquid. It should be noted here that there are two common definitions of the Jakob number, both of which are used in this document. For the sake of distinguishing between these two, the subscript 'h' in the above equation denotes the above quantity as the 'enthalpic' Jakob number.

If a saturated liquid pool of methanol initially at 25° C. is rapidly depressurized to 4.1 kPa ($T_{sat}$=0° C.), the enthalpic Jakob number of the superheated liquid is $Ja_h$=0.054. This value indicates that approximately 5.4% of the latent heat will be consumed by the excess specific heat of the superheated liquid. Note that Equation (1.1) assumes that the specific and latent heats are constant. Large variations in temperature and pressure require the use of the actual enthalpy of the initial and final states.

Accordingly, at higher Jakob numbers, and therefore higher superheats, the first-law efficiency of a flash-boiling cooling mechanism is reduced. However, higher superheats result in more nucleation and faster vaporization. One objective considered in engineering the flash-boiling cooling devices and systems hereof was to reduce the initial superheat required to maintain a given amount of vaporization and active nucleation sites.

Figure 1C:
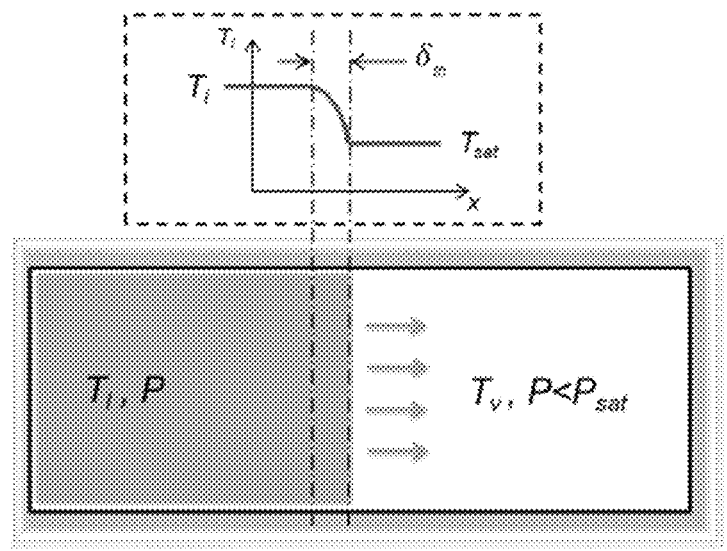
FIG. 1C shows a schematic representation of the vaporization from a planar liquid-vapor interface.

Phase Change Mechanisms. Regardless of the initial superheat, vaporization occurs from the liquid-vapor interface (i.e., the free surface) as soon as the liquid is depressurized. Provided that the generated vapor can freely leave the surface, the temperature at the interface quickly drops to the saturation temperature due to the cooling effect of the latent heat of vaporization. From this point, the amount of vaporization taking place at the surface is limited by the rate of heat conduction to the surface. As depicted in FIG. 1C, a thermal boundary layer quickly develops and grows as time passes, thereby quenching further phase change. Eventually, second-order effects, such as natural convection, may become significant. Often, schlieren patterns become visible after the liquid-vapor interface cools.

In engineering systems involving the vaporization of a pool of liquid, the dominant phase change mechanism involves nucleation and bubble growth. This mechanism is characterized by a continual generation of many bubbles interspersed throughout the liquid medium. These bubbles drastically increase the total amount of interfacial area available for vaporization. In addition, since the interfacial area is constantly being generated by new bubbles, the process does not stagnate from the growth of a thermal boundary layer. Because of their relevance to flash-boiling, the conditions governing the growth of a bubble within a superheated liquid is discussed in more detail below.

Due to surface tension, bubbles are mechanically unstable at very small radii. In order for phase change to occur via bubble growth, the nucleation sites present in the system must be capable of generating bubbles larger than a critical radius. The critical bubble radius depends on the balance of the pressure and surface tension forces of the bubble, and is given by:

$$r^* = \frac{2\sigma}{P_v - P_\infty} \quad (1.2)$$

where is the surface tension, $P_v$ is the pressure of the vapor inside the bubble, and $P_l$ is the pressure of the surroundings. Active nucleation sites are those capable of generating bubbles larger than the critical radius.

As the superheat of the liquid increases, the vapor pressure also increases. As a result, more nucleation sites present in the system are activated. Typically, these nucleation sites are features at the solid-liquid interface that trap some amount of vapor due to surface tension. Surfaces can be engineered to provide nucleation sites that are active at lower or higher superheat depending on what the desired performance characteristics are for the system.

Other than nucleation on the solid-liquid interface, heterogeneous phase change can also occur due to a process known as secondary nucleation. Secondary nucleation is initiated when some perturbation occurs at the free surface such that vapor bubbles become entrained within the superheated liquid. These bubbles then expand until buoyancy forces drive them back to the surface. Upon reaching the surface, the bubbles will further perturb the surface, thereby entraining more vapor nuclei within the liquid.

Figure 1D:
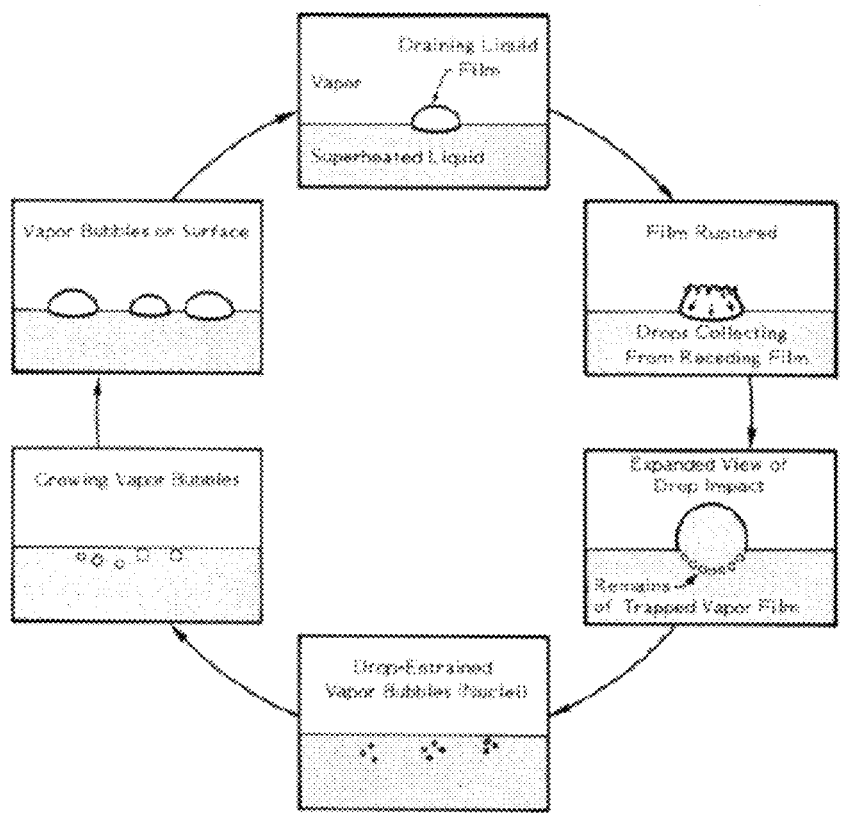
FIG. 1D shows a diagram representative of the secondary nucleation cycle as hypothesized by Mesler.

This cycle, depicted in FIG. 1D, leads to a phenomenon known as an evaporation wave or a boiling front. Once initiated, the evaporation wave propagates through and consumes the superheated liquid. Depending on the initial superheat of the liquid, the evaporation wave may or may not entrain liquid droplets; resultantly, the exit flow is either a two-phase mixture or a single-phase vapor. If the evaporation wave occurs without significant droplet-entrainment, the process is self-extinguishing since the liquid pool is cooled via phase change.

Secondary nucleation only occurs when triggered by a perturbation of the free surface. Such perturbations could arise from a droplet or other body impacting the surface. Alternately, the initial perturbation could result from Darrieus-Landau instabilities if the expansion from the interface due to vaporization is sufficient to disturb the surface. At a planar liquid-vapor interface, Darrieus-Landau instabilities are not expected to occur unless the superheat is relatively high.

Bubble Growth Equations. Bubbles larger than the critical radius expand within the superheated liquid. The rate of expansion is dictated by an interrelated set of thermal and mechanical conditions. Under the mechanical set of conditions, the growth of the bubble is determined by the balance of the excess pressure of the bubble, the surface tension, and the inertial resistance of the surrounding liquid. Under the thermal set of conditions, the growth of the bubble is determined by the rate of heat conduction to interface, where the latent heat of vaporization is required.

Figure 1E:
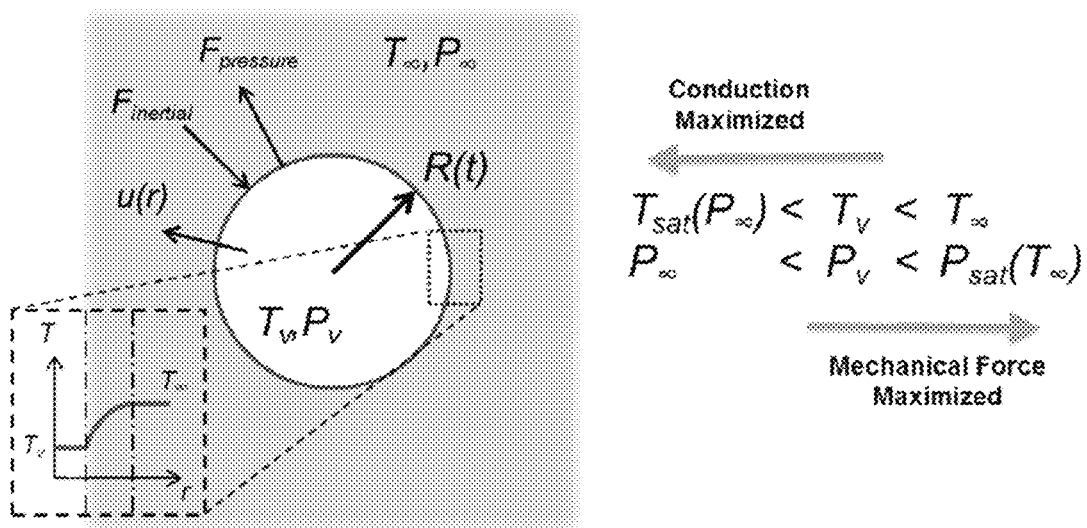
FIG. 1E illustrates factors that affect bubble growth.

These conditions determine the thermodynamic state of the vapor in the bubble. The vapor in the bubble is assumed to be in a saturated state; therefore, the vapor temperature and pressure depend on one another. If the bubble is in a high-temperature, high-pressure state, the mechanical force is maximized, but the temperature gradient is minimized. Conversely, a low-temperature, low-pressure vapor bubble exerts a lesser force on the liquid phase, but maximizes thermal conduction. These factors as depicted in FIG. 1E.

The thermodynamic state of the expanding bubble will be somewhere between these two extremes; however, in the limit of very small or very large radii, the state of the vapor bubble is approximated as existing at one of these limits. For very small bubbles, heat is readily supplied to the interface since the thermal boundary layer has not yet developed. Because the provision of thermal energy to the surface is not a significant constraint, the bubble exists at the high pressure state where the temperature is approximately that of the surroundings, and the governing relation is the mechanical energy balance:

$$R(t) \approx \left[\frac{2}{3}\frac{h_{fg}\rho_v}{\rho_l}\frac{T_\infty - T_{sat}}{T_{sat}}\right]^{1/2} t \qquad (1.3)$$

For large bubbles, the thermal boundary layer has become relatively thick, and consequently the temperature of the bubble approaches the saturation temperature in order to maximize the thermal gradient. In this limit, the relation for bubble growth is:

$$R(t) \approx Ja\sqrt{\frac{12\alpha t}{\pi}} \qquad (1.4)$$

where $\alpha$ is the thermal diffusivity, and Ja is given by:

$$Ja = \frac{\rho_l c_{p,l}(T_\infty - T_{sat})}{\rho_v h_{fg}} \qquad (1.5)$$

The Jakob number in the above equation governs the dynamics of nucleate phase change, differentiating it from the enthalpic form of the Jakob number mentioned previously. These common forms of the Jakob number differ by the density ratio between the liquid and vapor phases.

In order to describe the growth rate at any bubble size, an approximate combined solution by Mikic et al. was derived:

$$R^+ \approx \frac{2}{3}[(t^+ + 1)^{3/2} - (t^+)^{3/2} - 1] \qquad (1.6)$$

where $R^+ = \frac{AR}{B^2}$, $t^+ = \frac{A^2 t}{B^2}$, $A = \sqrt{\frac{2\rho_c h_{fg}(T_\infty - T_{sat})}{3\rho_l T_{sat}}}$, $B = \sqrt{\frac{12\alpha}{\pi}} Ja$ At the limits of very large and very small bubble radii, this equation matches the growth rates predicted by the thermal and mechanical energy equations. Comparison to experimental results has shown that the growth rate predicted by this equation is reasonable.

Flash Boiling from Liquid Pools. Flash boiling of liquid pools is commonly studied within the context of a loss-of-containment event. In such scenarios, a liquid is unintentionally released from a pressurized vessel, typically to atmospheric pressure, such that the liquid is suddenly in a superheated state. Rapid phase-change ensues having many potential negative consequences. The event is commonly termed a boiling-liquid expanding-vapor explosion, particularly in regard to accidents involving the transport of pressure-liquefied gas, such as propane. Similarly, the loss of coolant water from the reactors of nuclear power plants can be a concern.

Evaporation waves, sometimes referred to as boiling fronts, represent a field of this research describing a phase-change mechanism dependent on secondary nucleation from the free surface of a pool of superheated liquid. Generally, this phase-change mechanism is only observed when other faster-acting mechanisms, such as nucleation from a solid surface, are suppressed.

Figure 1F:
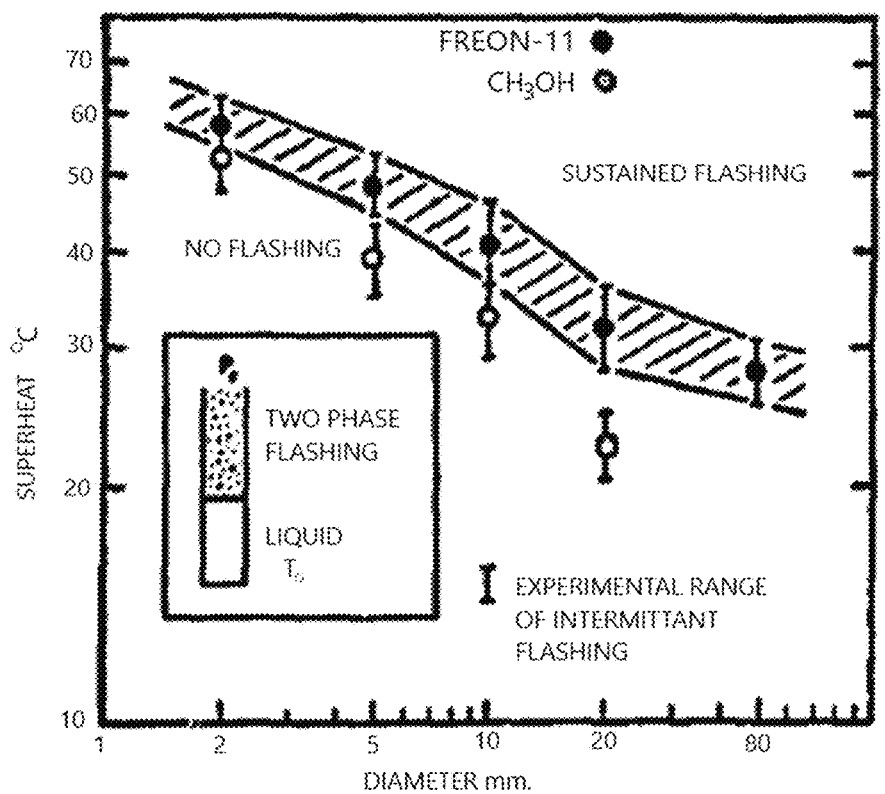
FIG. 1F shows a graph depicting data related to phase-change transitions for evaporation waves.

Grolmes and Fauske are commonly credited as the first to observe evaporation waves, finding a transition region that was dependent on diameter of the vessel. Below a certain superheat value, only quiescent evaporation was noted to occur. Above this value, a transition region existed, in which free-surface boiling was 'intermittent and unsustained.' At superheats higher than this transition region, sustained two-phase flashing occurred. The graph depicting these results is shown in FIG. 1F. Nucleation from the solid-liquid interface was only suppressed after thoroughly cleansing the test chamber and degassing the fluid via vigorous boiling.

Different modes of initiation for evaporation waves have been noted including nucleation uniformly across the surface and from the liquid-vapor-container contact line. The latter could be distributed either uniformly or only across several points. Higher superheats generally resulted in more uniform nucleation. The inventors hereof note that nucleation occurring from the liquid-vapor-container contact line may be due to nucleation sites due to insufficient cleaning or polishing of the test chamber. It has previously been suggested that this may be the cause of the diameter-dependence of results seen in the past.

Upon depressurization, prior to the initiation of phase change, a fog was noted to appear in the vapor phase for certain fluids, indicative of a significant degree of expansion cooling. The fog is then pushed upward, presumably by quiescent evaporation from the liquid-vapor interface, before explosive boiling was initiated—a delay on the order of a few milliseconds. Additionally, when evaporation waves were initiated by relatively few sites near the walls, the event was characterized by a start-up period during which relatively calm boiling occurred at the surface for 10-100 ms before intensifying and entraining liquid droplets with the exit flow. In one case, this transition was noted to take 350 ms.

Studies have been conducted on flash boiling while attempting to determine the parameters that result in the largest degree of repressurization, motivated primarily by examining the nature of boiling-liquid expanding-vapor explosions. This research also included results near the superheat limit. Evaporation waves were noted to occur at lower superheat; meanwhile, at higher superheat, nucleation occurred from the solid-liquid interface, which would then dominate the event.

In additional research, evaporation waves were studied under conditions where the exit flow was more constricted such that the depressurization of the test chamber occurred over a time period on the order of a second. The superheat necessary to initiate evaporation waves was found to be independent of the diameter of the chamber over a range of 32-252 mm. The inventors hereof suggest that the diameter-dependence found in these studies could have been due to flow restrictions between the reservoir and the flash chamber, thus resulting in lower values of superheat as experienced by the fluid than was indicated by the reservoir pressure.

Studies have also been performed on flash boiling in the presence of metallic rods intended to enhance nucleation. Here, 'pre-depressurization-steps' were utilized to expand and thus remove parasitic nucleation sites. When metallic rods (both copper and stainless steel) were introduced, the nucleation was nearly always initiated from the liquid-vapor-metal contact line and propagate downward along the surface of the rod as shown in FIGS. 1G-1I. Similar propagation of boiling fronts were obtained with horizontal heated tubes, although this boiling was from a heated surface (rather than uniformly superheated fluid).

Research has also been conducted where evaporation waves were initiated by impinging droplets that were intentionally injected during steady depressurization. A significant amount of variation can be seen in the recorded values for the superheat threshold.

Furthermore, in certain studies, nucleation sites along the gas container were suppressed by prior evacuation of the chamber and the use of a buffer liquid, which was utilized to fill up potential nucleation sites along the wall and bottom of the container. Nucleation sites may still exist at the liquid-vapor-container contact line, since nucleation was observed to initiate here at moderate superheats.

Additionally, an experimental correlation for the absolute threshold for sustained evaporation waves was determined after considering several non-dimensional numbers. The correlation used the Jakob number (with density ratio) and Prandtl number of the liquid phase to describe the response of all four fluids studied. The correlation, shown in FIG. 1J, compared favorably with other data in the literature. When calculating the non-dimensional numbers, the gas properties were best predicted by the saturation temperature and the liquid properties by the initial temperature. No dependence on diameter was found, but the size of the vessels was relatively large (14-80 mm) as compared to that used in other studies (e.g., 2-50 mm).

Heat Transfer Devices, Systems, and Methods

Figure 2A:
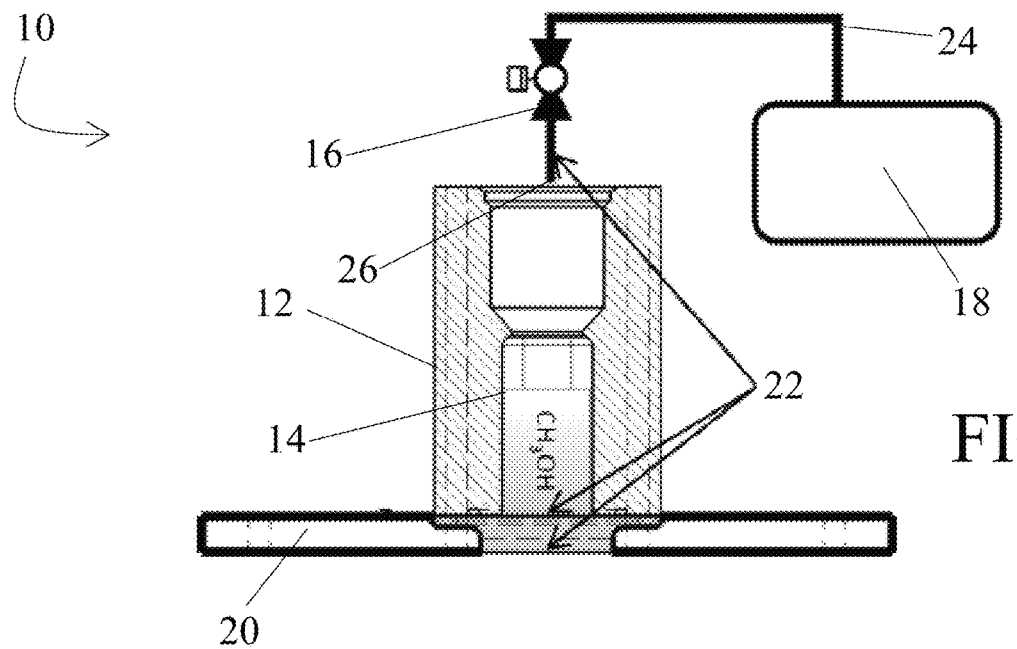
FIG. 2A shows a schematic diagram of at least one embodiment of a simplified heat transfer device according to the present disclosure.

Now referring to FIG. 2A, a schematic diagram of at least one embodiment of a simplified heat transfer device 10 is shown. The simplified heat transfer device 10 was created for the purpose of collecting experimental data on the phase-change mechanisms relevant to a flash-boiling transient cooling system and is described herein to facilitate understanding of the concepts underlying the inventive heat transfer devices, systems, and methods provided.

The heat transfer device 10 comprises a chamber 12 for housing fluid, a tank 14 at a low-pressure state positioned within the chamber 12 (e.g., a 30-gallon tank), and a valve 16 that isolates a vacuum tank 18 from the flash chamber 12. The chamber 12 is mounted on a ceramic spacer (not shown) with a plate 20 and at least two thermocouples 22 (e.g., grounded K-type) are embedded at the center of the top and bottom of the plate 20—in at least one embodiment, approximately 0.5 mm below the surface thereof. A pressure transducer (not shown) and a thermocouple 22 may also be positioned just above the exit port 26 of the flash chamber 12 such that the exit flow static pressure and centerline temperature can be measured.

In at least one embodiment, the chamber 12 comprises a clear flash chamber fabricated from a polycarbonate with an internal cavity measuring 2×2×4 cm, and the plate comprises an 8 mm thick sterling silver plate that weighs approximately 83 g and consists of a round body with a 2.85 cm diameter transitioning into a 5 cm square flange with a thickness of 2 mm (see, e.g., FIGS. 3A and 3B). Furthermore, the ceramic spacer baseplate may comprise a 15 cm square that is 8 mm thick and the line 24 leading from the flash chamber 12 to the vacuum tank 18 may be fabricated from 2.54 cm (1 inch) stainless steel tubing.

Figure 2B:
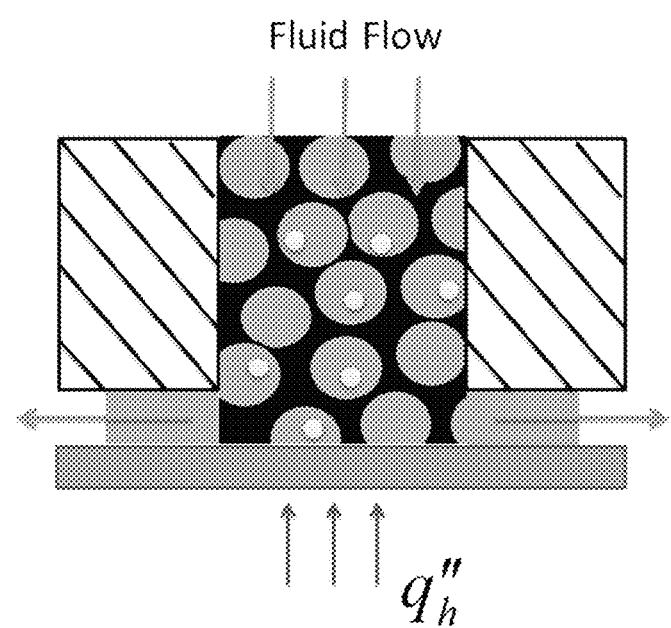
FIG. 2B shows a diagram of the heat and fluid flow within a heat transfer device of the present disclosure during a flash event.

In operation, the fluid within the tank 14 is initially at ambient temperature, but experiences a temperature drop when it is rapidly depressurized within the tank 14 (depressurization achieved through use of the vacuum tank 18 and valve 16). This rapid depressurization actively triggers the flash boiling process—a rapid phase change via bubble growth—which can be controlled in a variety of ways known to a person having ordinary skill in the art and leveraged as described herein to pull heat away from a hot body. The rapid phase change incites a rapid temperature drop to $T_{sat}$, which induces convective heat transfer with any heat source(s) positioned nearby. Furthermore, as discussed below, a porous medium (not shown) may be positioned within the tank 14 to further facilitate desorption. FIG. 2B graphically illustrates the heat and fluid flow associated with a flash initiated within at least one embodiment of the heat transfer device 10.

Figure 3:
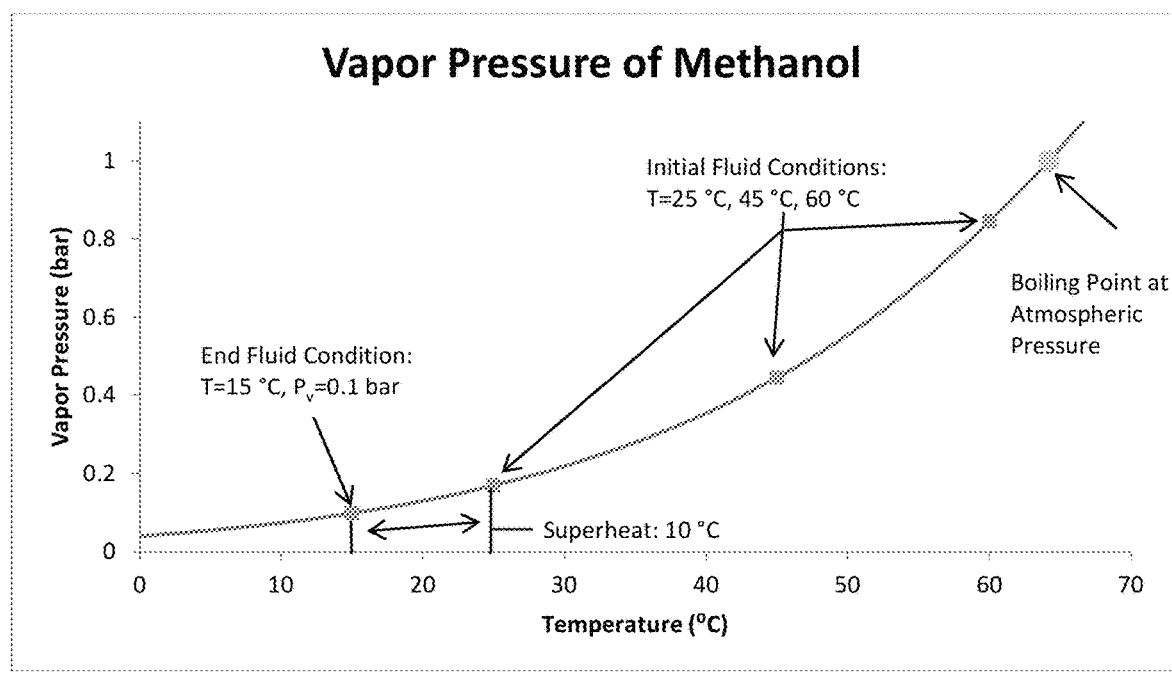
FIG. 3 displays the vapor pressure curve for methanol.

In collecting experimental data to validate the design of the heat transfer device 10, methanol was used as the working fluid as its boiling point is near ambient conditions (both temperature and pressure) and it has high latent heat. Additionally, the small size of the molecule and its hydroxyl group (O—H bond) are favorable for adsorption applications. FIG. 3 displays the vapor pressure curve for methanol, which illustrates that the boiling point of methanol at 1 atm (101 kPa) is 65° C. and at 0.1 atm (10.1 kPa) is 15° C. Nevertheless, it will be appreciated that methanol was selected merely for convenience and no limitation is intended by the use of methanol in connection with the description of any embodiments described herein as any liquid that changes phase may be used with the devices, systems, and methods hereof. Indeed, the phase change fluid may be methanol, water, ammonia, common refrigerants, cryogenic liquids (such as liquid helium, liquid nitrogen, or the like), or a variety of coolant or other fluids now known or hereinafter discovered or developed that are capable of changing phase.

Prior to testing, the device 10 was purged by flowing nitrogen through the chamber 12 and past the bottom o-ring for several minutes. The chamber 12 was filled with methanol using a fill port (not shown) just above the exit of the flash chamber. To prevent air from entering the fill port (not shown) during this process, the device 10 was lightly pressurized with a flow of nitrogen. In order to de-gas the fluid prior to each test, the chamber 12 was filled with methanol and a flash from 1 atm to 0.1 atm (101 kPa to 10.1 kPa) was performed, allowing the fluid remaining within the chamber 12 to boil at vacuum for several minutes. This step was found to be necessary to prevent nucleation from initiating from the o-ring at the bottom of the chamber 12.

Simplified device 10 was sufficient for acquiring data and controlling the experiment; however, the methanol had to be exposed to the atmosphere prior to testing. As a result, it was likely that air and/or water was absorbed into the methanol prior to testing. Additionally, methanol was exposed to nitrogen inside the device 10, which also could be absorbed into the liquid phase. To prevent these possible adverse effects, a new experimental facility was constructed that handles the methanol in a closed loop, thereby avoiding exposure to the atmosphere.

Figure 4A:
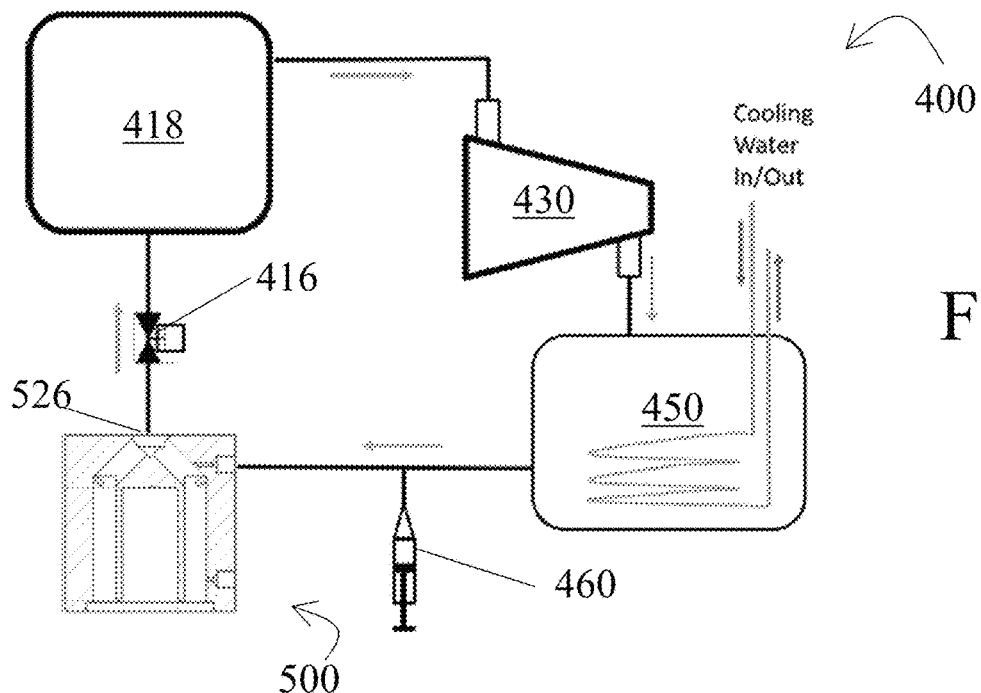
FIG. 4A shows a simplified plumbing and instrumentation diagram for a flash-boiling experimental system of the present disclosure.
Figure 4B:
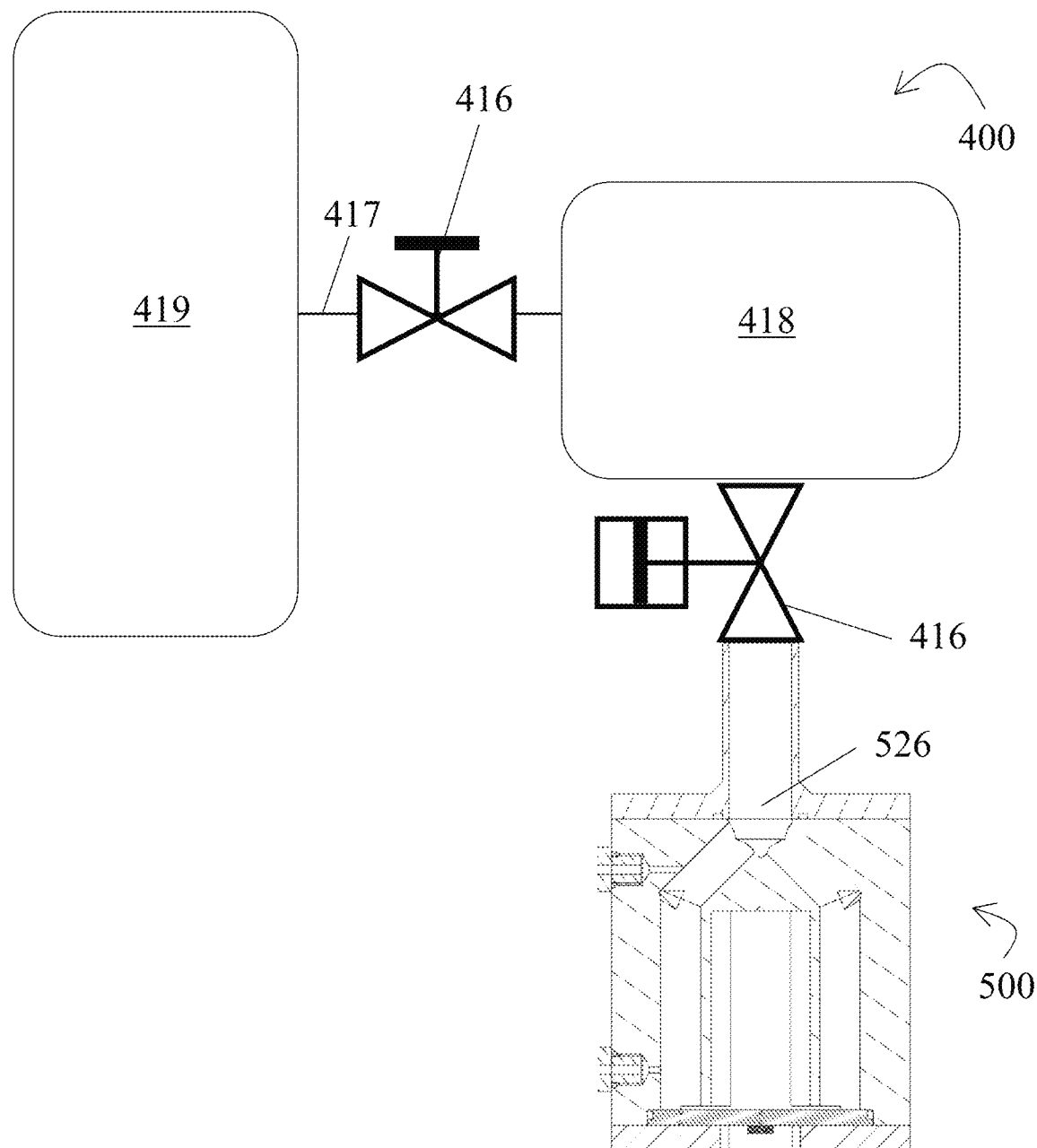
FIG. 4B shows a simplified plumbing and instrumentation diagram of the flash-boiling experimental system of FIG. 4A, where the system further comprises an additional larger tank to increase the volume of the low pressure reservoir.

Now referring to FIG. 4A, the primary components of a flash boiling system 400 are shown in the simplified plumbing and instrumentation diagram. The system 400 comprises an updated heat transfer device 500, which will be described in greater detail below in connection with FIGS. 5A-5D. The exit port 526 at the top of the heat transfer device 500 leads, via tubing, to a valve 416 (e.g., a 2.54 cm (1") pneumatically actuated valve), which isolates the flash-boiling housing 512 from a vacuum tank 418 (e.g., 11.4 L (3 gal)), used to provide the low pressure for the flash and to contain the flashed fluid. The system 400 also comprises a vacuum pump 430 (also connected via tubing), the outlet of which leads to a storage tank 450, where the collected vapor re-condenses. A syringe pump 460 (or the like) may also be used to dose the liquid into the flash-boiling housing 512 of the device 500. Furthermore, to optionally increase the volume of the low pressure reservoir within the device 500, the system 400 may further comprise a larger tank 419 (e.g., 30 gal) connected with the vacuum tank 418 via tubing 417, but that can be isolated from the vacuum tank 418 by a valve 416 as shown in FIG. 4B. The tubing and tanks of the system 400 may be fabricated from 316 stainless steel other than the flash chamber device 500, which may comprise polycarbonate, and a small length of tubing on either side of the vacuum pump 430, which may comprise PTFE.

In at least one embodiment, the flash boiling system 400 is a closed-loop, transient implementation of a vapor compression cycle, where the vacuum pump 430 acts as the compressor, the storage tank 450 acts as the condenser, and the flash chamber 500 acts as both the expansion valve and the evaporator. Accordingly, in operation, fluid is pumped from the storage tank 450 into the inner chamber 514 of the heat transfer device 500 (e.g., via at least one inlet port 580), and then rapidly depressurized using the vacuum pump 430 and the valve(s) 416. The resulting vapor is then pulled up through the external chamber 572 and exit port 526 and into the storage tank 450, where it is allowed to re-condense. In at least one exemplary embodiment of the system 400, the tubing (or a portion thereof) between the heat transfer device 500 and the storage tank 450 may be heated to prevent the vapor from re-condensing prior to entering the storage tank 450. Notably, flash-boiling is actively controlled—the entirety of the liquid within the inner chamber 514 is superheated upon depressurization, which induces the start of boiling within 10-100 ms of depressurization.

In an alternate approach, the system 400 can be implemented as an open-system, with the phase change fluid ejected therefrom after use, using a vacuum source in some instances (e.g., with sub-atmospheric operating pressures), rather than recycling to the storage tank 450 as previously described. This alternative arrangement can be implemented in systems 400 where handling and/or storing large volumes of gas is problematic.

System 400 may additionally comprise a variety of balance-of-plant arrangements, primarily involving rapid condensation and refilling of the inner chamber 514 of the device 500 to enable cyclic applications. For example, where the system 400 is used to cool a pulsed device, the system 400 must be configured to allow for the cyclic reintroduction of the phase change fluid into the device 500 in manner that is synchronized with the cyclic heating event. Such balance-of-plant arrangements may comprise a condenser, a compressor, a pump, and other recirculation components known in the art.

As briefly mentioned above, the system 400 was designed to avoid the need to de-gas the working fluid prior to each experiment. In traditional nucleate boiling experiments, it is widely recognized that degassing plays a fundamental role in ensuring the repeatability of experiments. Performing experiments without degassing can artificially activate nucleation sites in a manner not representative of a closed system. Typically, degassing of the working fluid is achieved by boiling the liquid for about 30 min prior to the collection of experimental data. This also allows the cooling system to reach steady state. Because degassing via continuous boiling is inappropriate for the transient applications of interest, the methanol was degassed in bulk before being transferred to the flash-boiling housing 512. To accomplish this objective, helium gas was integrated into the system 400 both for displacing air and for sparging, which is a viable technique for degassing, although the preferred method is refluxing. Helium was chosen because it is both inert and has low solubility in liquids, and thus is easier to remove from the system 400.

However, degassing alone is not sufficient to remove miscible liquids, such as water, from the methanol. The addition of methanol to the storage tank 450 was performed by the following procedure. First, the air in the system 400 was purged by a flow of helium. The system 400 was then evacuated for several hours to vaporize any water that may remain, after which the system 400 was re-pressurized with helium gas. Then, methanol was added to the tank 450 from new sealed bottles while the tank 450 was maintained at slightly positive pressure with a light flow of helium. This procedure minimized the exposure of the methanol with the atmosphere.

Now referring to FIGS. 5A-5D, exemplary embodiments of a heat transfer device 500 are shown. Similar to device 10, device 500 comprises a heat spreader 520 positioned within a flash-boiling housing 512. The housing 512 comprises at least one exit port 526 and one or more inlet ports 580 and is configured to contain the working fluid (e.g., methanol) prior to the flash. The inlet port(s) 580 are configured for taking measurements of, filling, and/or inserting instrumentation into the interior of the housing 512 and, in at least one embodiment, are in fluid communication with an inner chamber 514. The exit port 526 may be positioned at the top of the flash-boiling housing 512 and, when used in a system, leads to a valve as previously described in connection with system 400 (see valve 416 of system 400). In at least one embodiment, the housing 512 is formed of polycarbonate.

The heat spreader 520 comprises any heat spreader known in the art that is capable of moving heat between a heat source (i.e. a heat body 513) and a secondary heat exchanger (i.e. the inner chamber 514 and the porous medium 515 optionally therein). The heat spreader 520 may be a plate made of a metal or other material having high thermal conductivity. In at least one embodiment, the heat spreader 520 comprises a copper heat spreader. Furthermore, the heat spreader 520 may be affixed to a baseplate 595 (see FIGS. 5B-5D), which provides thermal insulation from the surroundings in addition to stabilization. In at least one exemplary embodiment, the heat spreader 520 is constructed from a copper heat spreader with one or more resistance heater(s) soldered to the bottom thereof and a porous medium or material 515 (such as, for example, graphitized carbon foam) is brazed to the top. Additionally or alternatively, the baseplate 595 is a 4 mm polyetherimide (ULTEM™1000) baseplate, which has a thermal conductivity of 0.22 $Wm^{-1}K$, a density of 1270 kg $m^{-3}$, and a specific heat of 2000 J $kg^{-1}K^{-1}$.

The heat spreader 520 is in thermal communication with one or more hot body(ies) 513 (i.e. a heater or heat source). For example, and without any intended limitation, the embodiments of the device 500 shown in FIGS. 5A and 5D comprise two hot bodies 513, whereas the embodiment of the device 500 shown in FIG. 5B comprises a single hot body 513. Likewise, FIG. 5C shows a device 500 configured to couple with hot bodies 513 in two distinct positions on the heat spreader 520. In at least one embodiment, each hot body 513 is soldered to the heat spreader using 60/40 SnPb Solder (k=50 W/mK) or as is otherwise known in the art. It will be understood that a hot body 513 hereof may be any high-heat-flux device, such that device 500 comprises the cooling mechanism thereof.

Within the housing 512 is inner chamber 514 that may optionally be centered therein and/or comprise the following dimensions: 50 mm tall by 25 mm wide by 10 mm deep. The inner chamber 514 is designed to contain the working fluid prior to the flash and, in at least one embodiment, may house a porous material or medium 515 (such as graphitized carbon foam, for example). At least two channels 570 leading to, and in fluid communication with, the exit port 526 are also positioned within the housing 512 and, taken together, form an external chamber 572. A flow path leads from inner chamber 514, through transverse exit ports 590, and into the external chamber 572 such that the chambers 512, 572 are in fluid communication with each other. As used herein and unless otherwise indicated, the term "chambers" means and includes both the inner and external chambers 514, 572, collectively. In at least one embodiment, each exit port 590 is 5 mm high height and each channel 570 has a circular cross section of 10 mm diameter.

Figure 5A:
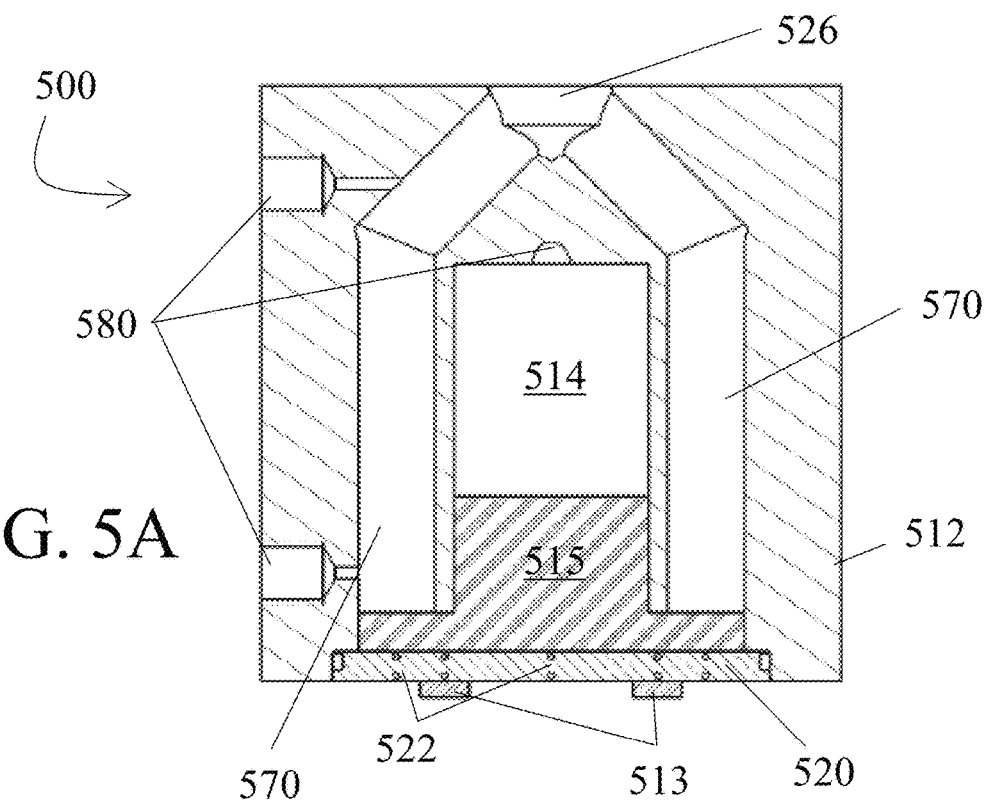
FIGS. 5A-5C show cross-sections of at least one exemplary embodiment of a heat transfer device pursuant to the present disclosure (FIGS. 5A and 5B) and a three-dimensional, perspective view of the same heat transfer device.
Figure 5B:
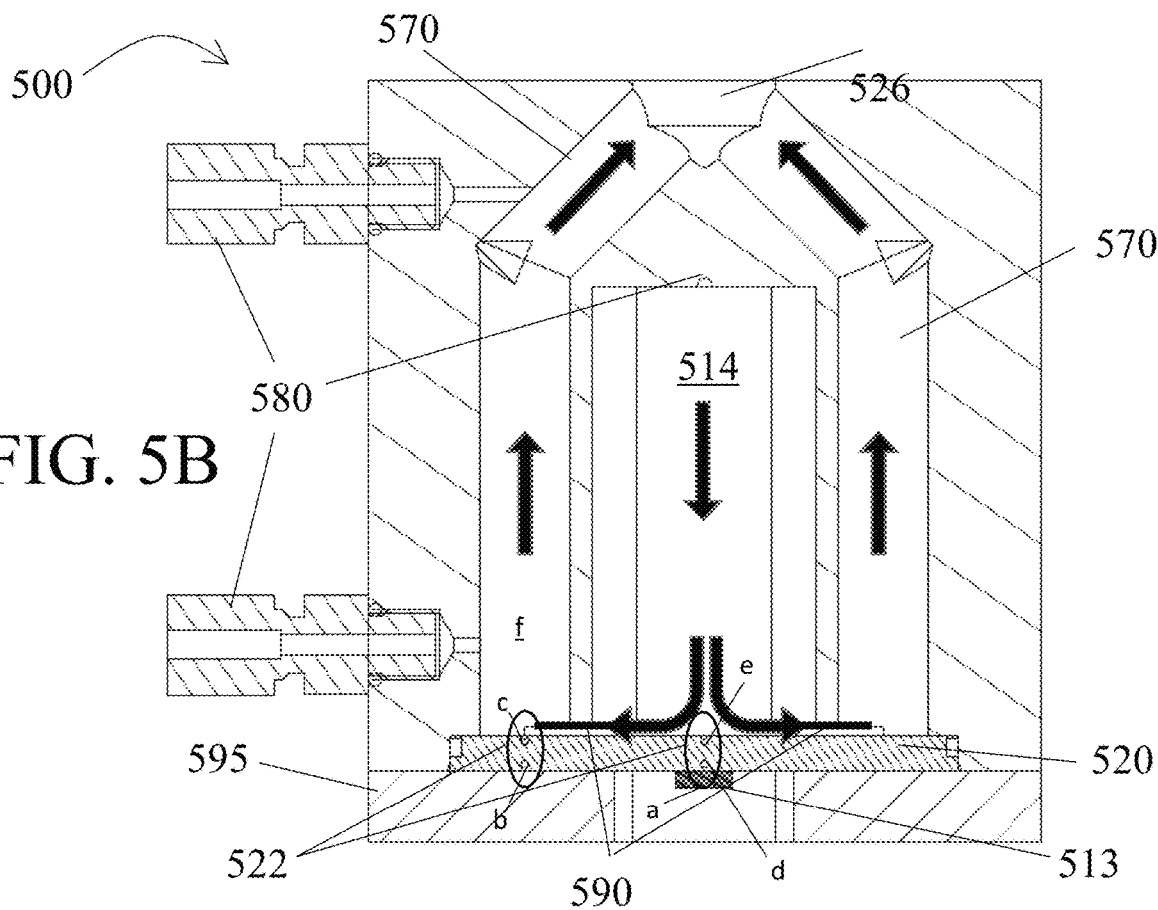
Figure 5C:
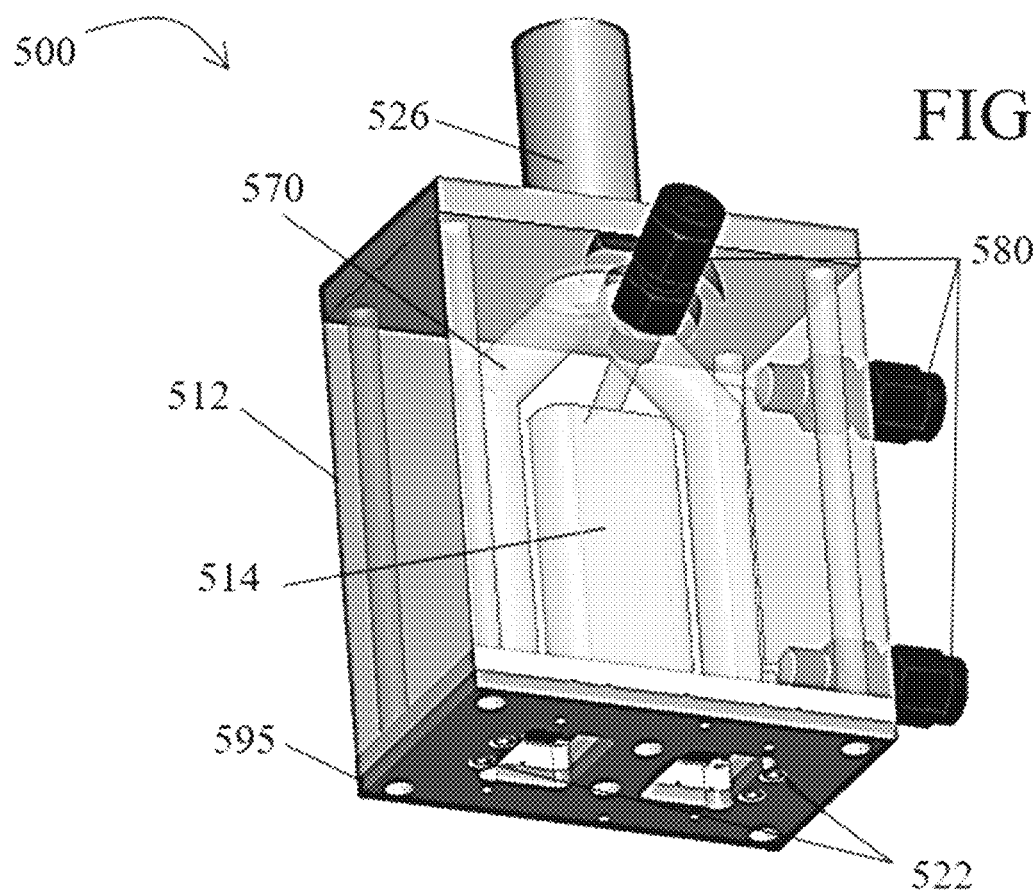
Figure 5D:
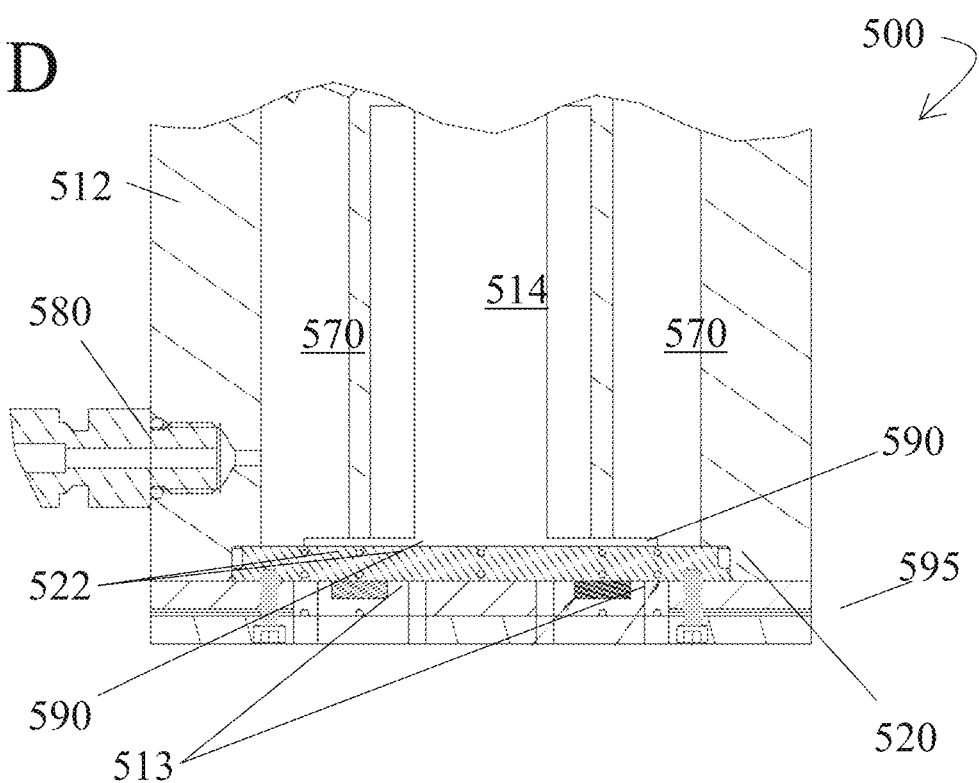
FIG. 5D shows a cross-section of the lower portion of a heat transfer device according to the present disclosure.

Now referring to FIG. 5B, the chambers are designed to first direct flow from inlet 580 toward the heated surface (i.e. the heat spreader 520), with transverse exit ports 590 off of the inner chamber, followed by flow out of the housing 512 through the exit port 526 and to an exhaust chamber (not shown). This approach enables rapidly cooled fluid to impinge or otherwise interact thermally with the heat body(ies) 513 and heat spreader 520.

In those embodiments comprising a porous medium 515 within the inner chamber 514, the porous medium 515 may comprise any medium that is open-cell, microporous, and capable of conducting heat. Other characteristics to consider in selecting a particular porous medium 515 are pore size (e.g., between about 0.1 to 500 microns) and high absorptivity, surface area, and porosity (0.4 to 0.95). In at least one embodiment, the porous medium 515 exhibits a low thermal mass and, thus, a high thermal diffusivity and/or comprises a plurality of pores, channels, microchannels, minichannels, fins, surface fins, slate fins, and/or other synthesized nanostructures to increase and/or maximize its surface area. The porous medium 515 may be engineered such that it is configured to absorb coolant and provide additional enthalpy change upon the flash event to further enhance the thermal transfer efficiency.

For example, in at least one embodiment, the porous medium 515 is arranged to have a hierarchical pore size distribution, with smaller pores near the heat spreader 520 and transverse exist ports 590. This hierarchical pore size distribution is one design solution to providing an increased surface area, higher effective thermal conductivity, and deeper penetration of the flash boiling in the inner chamber 514. Similarly, the porous medium 515 may also or alternatively comprise a bored-out region at the top-center of the inner chamber 514 where the phase change fluid can pool before the flash event. In at least one alternative embodiment, porosity can be decreased radially in order to direct the flow toward the middle of the heat spreader 520 and hot body(ies) 513. Furthermore, synthesized nanostructures provided on the inner surfaces of the pores can also increase surface area while maintaining similar overall fluid-thermal transport behavior.

Figure 6A:
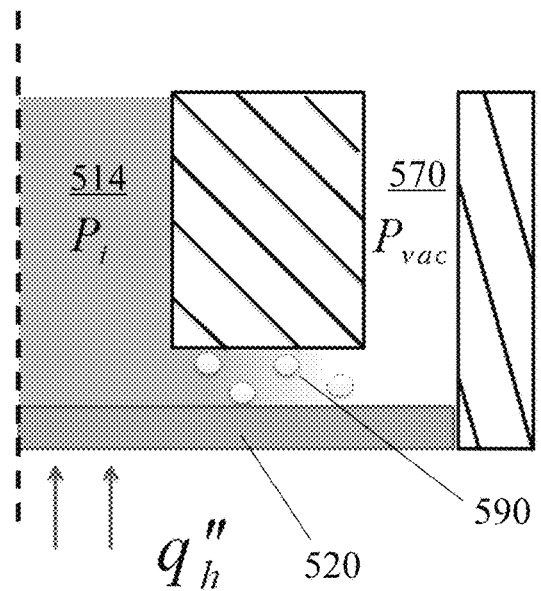
FIG. 6A shows a cross-section of the lower portion of an embodiment of a heat transfer device according to the present disclosure that does not comprise a porous medium within the inner chamber thereof and illustrates a phase change occurrence therein.
Figure 6B:
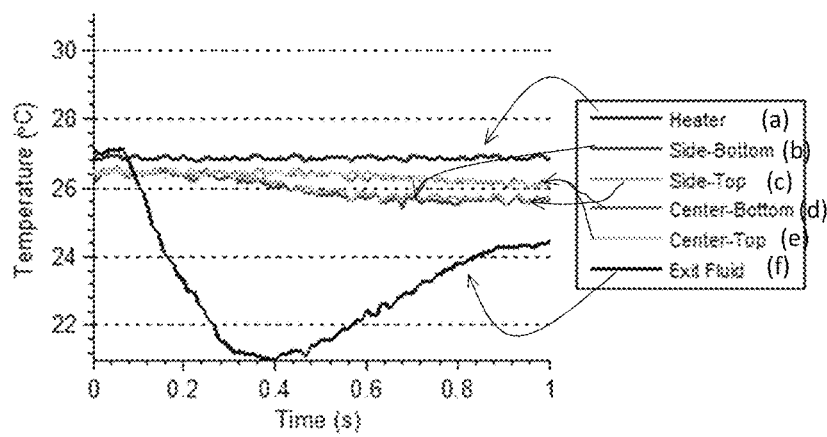
FIGS. 6B and 6C are graphical representations of temperature data related to the phase change occurrence depicted in FIG. 6A.
Figure 6C:
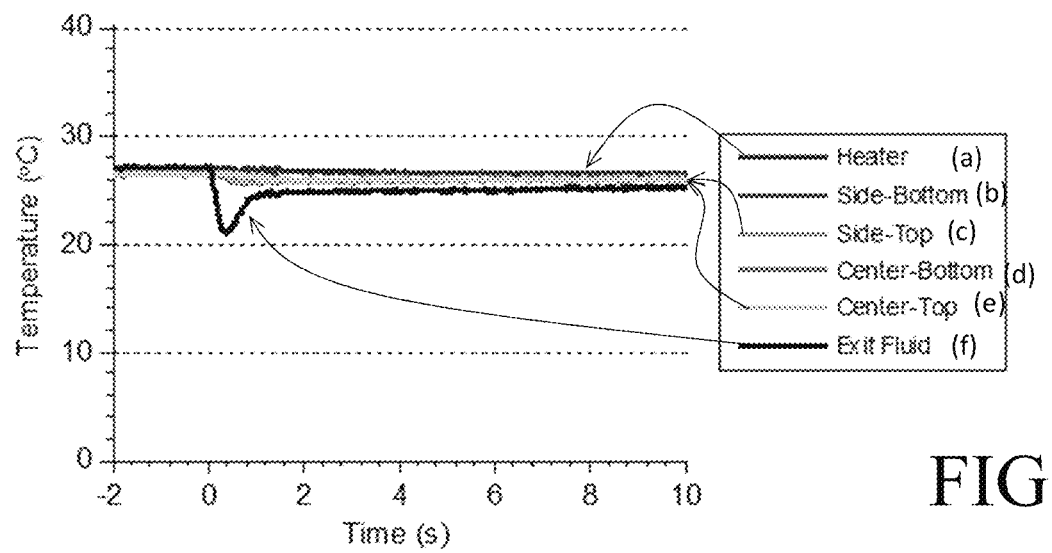

The inclusion of the porous medium 515 within the inner chamber 514 provides multiple advantages. Primarily, the porous medium 515 assists in the nucleation process when the phase-change fluid changes phases as a result of flash boiling. Specifically, if the inner chamber 514 is only filled with the phase change fluid (i.e. not a porous medium 515), the phase change may occur non-uniformly, thereby resulting in sub-optimal heat transfer efficiency. For example, it was observed that where porous medium was not included within the inner chamber 514, the pressure drop—and thus phase change—localized at the transverse exit ports 590 (not within the inner chamber 514 itself). Because the fluid temperature did not drop until near the exit ports 590 (after the phase change starts), relatively little cooling occurred and most was at the edges of the heat spreader 520, which is not optimal for heat transfer from the hot body 513. FIG. 6A provides a graphic illustration of this occurrence, while the graphs of FIGS. 6B and 6C depict the data collected in connection with such flashes (note the locations monitored are labelled on FIG. 5B).

Figure 7A:
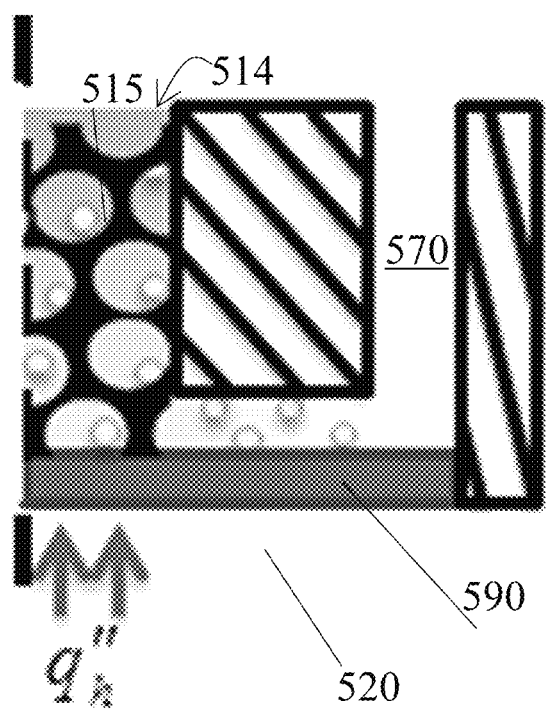
FIG. 7A shows a cross-section of the lower portion of an embodiment of a heat transfer device according to the present disclosure where the device comprises a porous medium within the inner chamber thereof and illustrate a phase change occurrence therein.
Figure 7B:
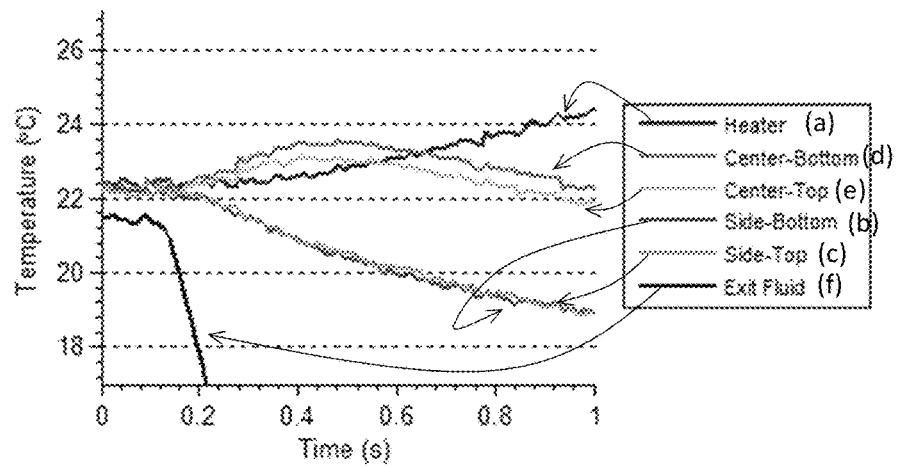
FIGS. 7B and 7C are graphical representations of temperature data related to the phase change occurrence depicted in FIG. 7A.
Figure 7C:
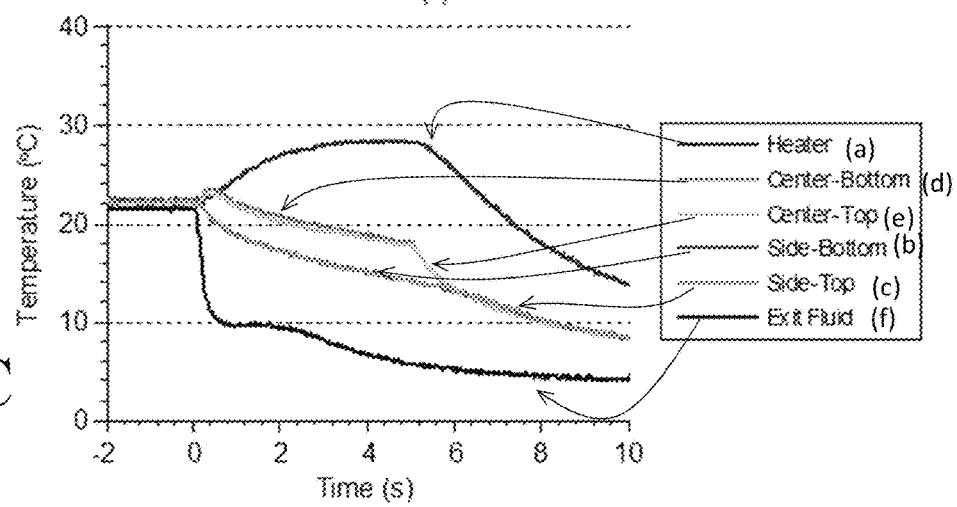

The addition of a porous medium 515 within the inner chamber 514 not only nucleates boiling events within the inner chamber 514 itself, but also causes the nucleation to be distributed within the inner chamber 514 as well as within the transverse exit ports 590. FIG. 7A provides a graphic illustration of this occurrence, while the graphs of FIGS. 7B and 7C depict the temperature data collected in connection with such flashes (note the locations monitored are labelled on FIG. 5B). Accordingly, where a porous medium 515 is employed, the fluid temperature drops prior to reaching the heat spreader 520, resulting in dramatically enhanced cooling (see Heater (a) data of FIG. 7C as compared to that of FIG. 6C). Notably, this cooling enhancement effect was consistently observed even in experiments where desorption and extended surface effects were negligible, evidencing that the enhancement is related to the altered phase-change.

The porous medium 515 also provides the additional advantage of supplying an extended surface to enhance the overall efficiency of the cooling scheme. Perhaps more specifically, the porous structure of the porous medium 515 provides extended heat transfer surface area into the coolant region, thereby increasing the net amount of desorption cooling that can be achieved.

The particular type of porous medium 515 should be chosen such that it does not significantly restrict flow through the inner chamber 514 and a significant pressure drop can be achieved therethrough. In at least one embodiment, the porous medium 515 is an atomizer and promotes nucleation of the phase change process volumetrically (i.e. throughout the volume of fluid within the inner chamber 514). In at least one exemplary embodiment, the porous medium 515 is carbon-based, comprises a foam (such as a graphitic carbon foam, for example), has a porosity between about 0.4 to 0.95, has an average pore size between about 0.1 and 500 microns, and/or comprises a solid material (ranging from carbons to metals).

The porous medium 515 may be brazed to the heat spreader 520 of the device 500. Here, a good braze joint is important to achieve optimal overall thermal performance of the device 500. Furthermore, to prevent fluid from routing around the porous medium 515, a brazing feature may be used to ensure the porous medium 515 is centered on the heat spreader 520 (e.g., to within ±0.025 mm (±0.001")). In order to obtain a high level of accuracy when shaping the porous medium 515, the brazing fixture may also function as a die that cuts the porous material 515 to the desired shape, with the resulting block sufficiently matched in size to the internal cavity of the flash chamber 514 to provide a friction fit.

Referring back to the hot bodies 513, the arrangement of the one or more hot bodies 513 on the heat spreader 520 may be specifically selected to enhance heat transfer. The arrangement shown in FIG. 5B depicts a device 500 comprising a single hot body 513 that is substantially centered beneath the inner chamber 514 (i.e. the location where the flash will occur, especially where the inner chamber 514 comprises a porous medium 515 therein). In at least one alternative embodiment, the hot body(ies) 513 are positioned on the heat spreader 520 substantially directly below the exit ports 590 of the fluid passages (see FIGS. 5A, 5C, and 5D). This placement can further enhance the boiling process and improve temperature control of the hot body 513 by placing it closer (thermally and spatially) to a location where peak convective-cooling is anticipated (such as in where the inner chamber 514 does not comprise a porous medium 515). Notably, placement of the hot body(ies) 513 is not expected to change the boiling process itself significantly since it is primarily pressure-induced, but may have significant impact on temperature control and heat transfer.

As previously noted, in addition to being thermally coupled with a hot body 513 and thermally and fluidly coupled with the inner chamber 514, the heat spreader 520 of the device 500 also comprises one or more thermocouples 522 for measuring temperature at the heat spreader 520. In at least one embodiment, the thermocouples may be embedded within the top and/or bottom of the heat spreader 520 and may comprise any type of thermocouples now known or hereinafter developed that may be suited to this art. For example, and without limitation, the thermocouples 522 may comprise type-T thermocouples. Additional thermocouples 522 may also be used in or adjacent to other components of the device 500, as well as one or more pressure transducers (not shown). For example, in at least one exemplary embodiment, the heat transfer device 500 additionally comprises pressure transducers for the inner and external chambers 514, 572. Further, the device 500 may comprise type-T thermocouples, grounded K-type, thermocouples, or any other thermocouples known in the art or hereinafter developed to measure the temperature of the working fluid at an instrumentation port 580 of the housing 512.

Figure 8:
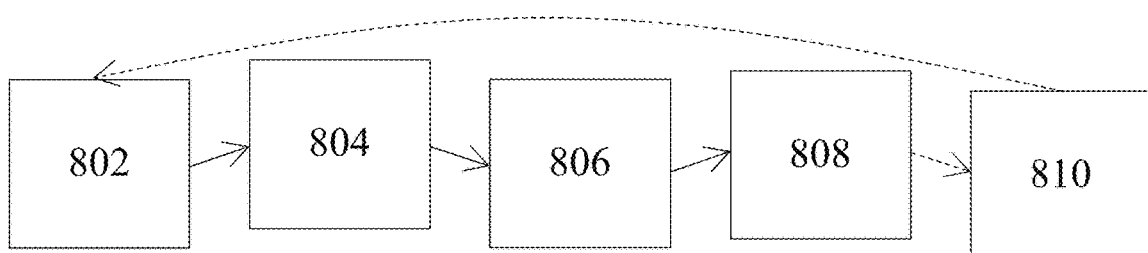
FIG. 8 shows a flow chart representative of a method for rapidly cooling a heat source using the heat transfer device of FIGS. 5A-5D.

Now referring to FIG. 8, a flow chart representative of a method 800 for rapidly cooling a heat source using the flash boiling system 400 and/or the heat transfer device 500 is provided. At step 802, a phase change fluid is injected (or otherwise added) into the inner chamber 514 through an inlet port 580. In at least one embodiment, the heat spreader 520, inner chamber 514 and/or the fluid therein are at a uniform near- or at-ambient temperature (and, optionally, pressure) at step 802.

Furthermore, the amount of phase change fluid used to fill the inner chamber 514 may be selected pursuant to user preference and to modify the efficiency of the system 400. For example, in at least one embodiment, the inner chamber 514 may only be partially filled at step 802 such that the fluid wets the surface at the top of any porous medium 515 positioned therein, but does not immerse it fully. Such partial submersion techniques can improve control, speed, and thermal efficiency of the flash process. Additionally or alternatively, the amount of fluid injected into the inner chamber 514 at step 802 can be selected to match the total energy of the heat pulse (power x duration) to minimize volume, weight and material.

When a cooling effect is desired, the inner chamber 514 is rapidly depressurized (e.g., by opening valve 416 and operating vacuum pump 430) at step 804, which induces the start of boiling. In at least one exemplary embodiment, boiling initiates within 10-1000 ms of depressurization. Notably, this step 804 is actively triggered, which allows for greater control over the process and its application.

The boiling process allows for high heat transfer rates through the heat spreader 520 due to the latent heat of vaporization. Perhaps more specifically, the rapid phase change of the fluid caused by the depressurization step 804, incites a rapid temperature drop in the fluid, which induces convective heat transfer with the heat source 513. Accordingly, at step 806, heat from the heat source 513 is convectively transferred through the heat spreader 520 and into the fluid (now gas) within the chambers 572 of the device 500. Furthermore, the downward flow of the phase change fluid through the inner chamber 514 allows the boiling/vaporization to occur near the heat source 513, which increases the efficiency of the cooling effect. In at least one embodiment, a vacuum is applied (via vacuum pump 430 or otherwise) to the exit ports 526, 595 to facilitate the downward flow of the phase change fluid through the inner chamber 514, and to pull the fluid up through the exterior chambers 570 and out through the exit port 526. In various embodiments, valve 416 would be closed to avoid an insufficient pressure drop, but the system could be used as referenced above for longer duration pulses.

At step 808, the resulting vapor flows through exit port 526 and either into the storage tank 450 where it re-condenses (if the system 400 comprises a closed configuration), or exits the system 400 (if the system 400 comprises an open configuration).

Referring back to FIG. 7B, the effect of heat transfer from the bottom center of the inner chamber 514 of the heat transfer device 500 is depicted as a function of time. The exit-fluid thermocouple 522 ((f)) demonstrates how rapidly the flash-boiling process induces cooling in the bulk fluid over tens of milliseconds (ms). The center-top and center-bottom thermocouples 522 ((d) and (e)), which are located directly over the heater 513 (see FIG. 5B), exhibit minimal fluctuation throughout the duration of the flash-boiling event. This demonstrates the ability of the cooling system 400 to respond rapidly to pulsed heat sources.

By performing method 800, the system 400 and/or heat transfer device 500 can provide cooling for a fixed duration of time that can be matched to, for example, a pulsed heat source such as laser diode arrays that drive burst radar, pulsed lasers, and other electronic devices that have pulsed power duty cycles. The described depressurization (step 804) can be actively triggered and timed to control temperature changes of the heat source 513 and heat spreader 520 on a cyclical basis. Additionally, and importantly, the trigger can be provided in advance of the application of the heat pulse by 10 to 1000 msec. This "thermal anticipation" can produce an even more uniform temperature-time behavior. In at least one exemplary embodiment, the thermal anticipation time comprises between 128 and 190 ms.

Where the method 800 is used in a cyclic application—for example, in connection with a sensitive high-power electronic device with short duty cycles—and the system 400 further comprises one or more balance-of-plant arrangements, method 800 may further comprise step 810 and continuously cycle in synchronization with the cyclic heating event. Step 810 comprises operation of any balance-of-plant arrangements (e.g. a condenser to promote rapid condensation of phase change fluid vapor received within the storage tank 450, a compressor, a pump, and/or any other recirculation components) to ensure repetition of the method 800 steps in synchrony with the heating event.

Experimental Examples and Mathematical Framework

At least one exemplary embodiment of the heat transfer device 500 was tested, the device 500 comprising a heat spreader 520 that was 4 mm thick, weighed approximately 23 g, and comprising 50Ω resistors rated for power output in excess of 150 W. The 2.1 g carbon foam block was formed from KFOAM grade P1 produced by Koppers, Inc, is over 75% porous, and has an out-of-plane thermal conductivity of 120 W m$^{-1}$ K$^{-1}$. Furthermore, the area of the foam base 515 was four times that of the heaters ($A_{base}/A_h$=4).

Because shaping porous mediums (here, carbon foams were used) generate a large amount of particulate matter, the foams were thoroughly cleaned prior to use. Cleaning of the foams reduces the flow restriction during the flash and improves the mechanical and thermal performance of the brazed joint. The process consisted of first removing particulates blocking the pores on the surfaces with adhesive tape followed by rinsing with solvents in an ultra-sonic cleaner.

The foam was brazed with TiCuSil from Morgan Technical Ceramics that is comprised of 4.5%, 26.7%, and 68.8% by weight of titanium, copper, and silver, respectively. Approximately 0.45 g of the −325 mesh paste was applied directly to the bottom of the foam before being assembled with the heat spreader and heated to 925° C. under high-purity nitrogen. This braze was discovered to be vastly superior mechanically and thermally to an 88% aluminum 12% silicon braze previously employed.

Additionally, ten type-T thermocouples were embedded in the copper heat spreader 520. Two more type-T thermocouples were soldered to the ceramic covers of the resistance heaters. The inner chamber 514 was instrumented with a 414 kPa and a 207 kPa pressure transducer for the inner and external chambers 514, 572, respectively, to measure the temperature of the working fluid. Another 34 kPa pressure transducer was also included to record the pressure of the vacuum tank. Each of these had a 1 ms response time and 0.25% full scale accuracy. Then type-T thermocouples were soldered to the ceramic covers of the resistance heaters using S-Bond® 140 from S-Bond Technologies, LLC, and another type-T thermocouple measures the temperature of the working fluid at the lower instrumentation/inlet port 580 of the housing 512.

The thermocouples 522 were calibrated using ice- and steam-point measurements prior to installation. The pressure transducers were calibrated using the atmospheric pressure immediately before the series of experiments. High-speed video recordings of the flash-boiling event were obtained for every test. Video capture was triggered concurrently with the pneumatic valve, recording the initial 1 s of the experiment at 4000 fps.

Prior to testing, the carbon foam 515 was degassed by heating to 40° C. under a light flow of helium gas for 20 min. The helium was then displaced from the flash chamber 514 by boiling 10 mL of methanol under vacuum. The plumbing directly adjacent to the flash-chamber 514 is heated to 50° C. using line heaters to ensure the vapor does not re-condense. Furthermore, for each test, the fluid, heat spreader 520, and inner chamber 514 were at a uniform initial temperature of 25° C.

For each experimental run, the remaining liquid from the previous run was boiled off under light heating and vacuum 430 until the flash chamber 514 would no longer repressurize when the valve 416 was closed. The methanol was then dosed into the evacuated flash chamber 514 using a light vacuum (e.g., syringe 460). The liquid was drawn into the inner chamber 514 by opening the pneumatic valve and applying a light vacuum (evacuate 33 gal vacuum tank to 0.58 psi (4.0 kPa)). After a parametrically varied delay (e.g., between about 0-500 ms), the heat transfer device was heated under a light load of 1 W until the starting temperature was reached. The temperature and pressure of the gas phase were monitored to ensure equilibrium conditions prior to the start of the test. Because the total volume of the flash chamber 514 along with the directly connected tubing was only r::30 cm$^3$, the amount of liquid methanol that evaporates during equilibration is expected to be less than 0.01 mL. The increment of time by which the valve 416 opened prior to heater activation (i.e. the heat pulse) is designated the "anticipation time."

Figure 9:
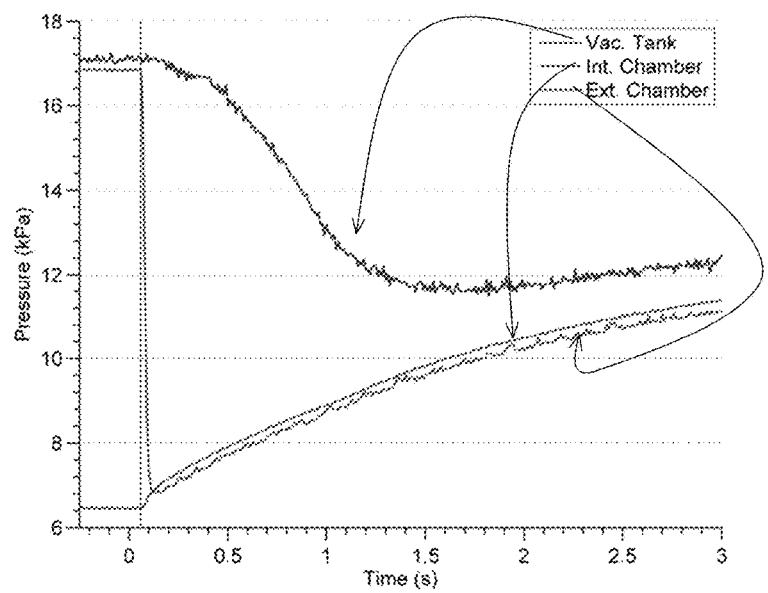
FIG. 9 graphically depicts pressure data for run 6 (41 W $cm^{-2}$, 190 ms, 6 mL, 0.93 kPa) (note the delay before the external chamber pressure falls sharply, indicated by the vertical line)

During the experiments, a small lag of about 60 ms existed between the time the pneumatic valve was actuated and when the pressure in the external chamber sharply dropped, as shown in FIG. 9. Because the pressure transducers were rated for a response time of 1 ms, this disparity was determined to be due to the mechanical-actuation time of the valve. As a result, the reported values for the anticipation were calculated using the time of the above-mentioned pressure drop in lieu of the prescribed actuation time. Note that the disparity between the vacuum reservoir and external chamber pressures was within the ±0.52 kPa tolerance of the external-chamber pressure transducer.

Figure 10A:
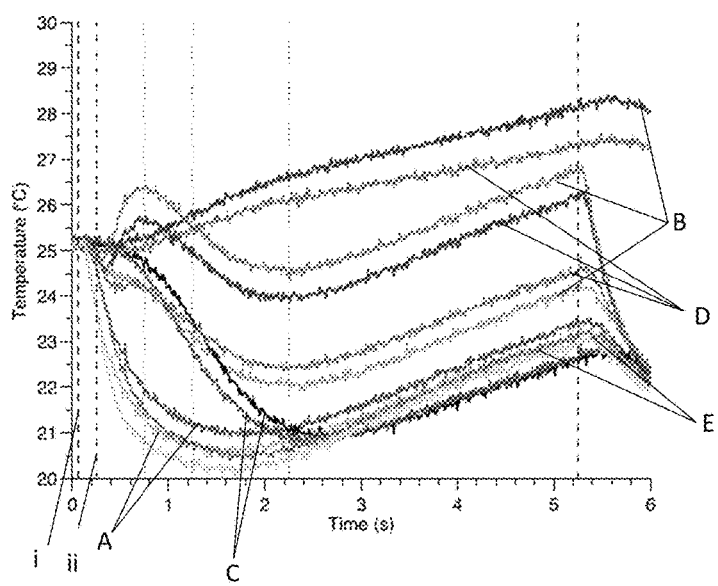
FIG. 10A shows a graph related to the thermal response during run 6, with event timing shown by vertical lines: valve opening (i)
Figure 10B:
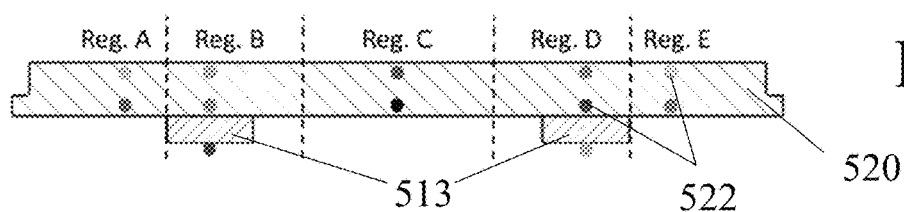
FIG. 10B provides a diagram related to the naming convention for the different regions in a heat spreader of the present disclosure, the letter labels corresponding to the curves in FIG. 9A.

The internal chamber 514 pressure was elevated relative to the external chamber 572 for approximately 1 s. The thermal behavior for run 6 (41 W cm$^{-2}$, 190 ms, 6 ml, 0.93 kPa) is shown in FIG. 10A. The naming convention for the different regions in the heat spreader is shown in FIG. 10B. Most thermocouples 522 had a response time of ~10 ms except for those soldered to the ceramic cover of the heater 513, which had a relatively long response time (~1 s). Although the design of the flash inner chamber 514 in this embodiment was symmetric, the temperature readings of regions A and B of the heat spreader 520 were generally 0.5-1° C. higher than the corresponding locations in D and E. It is likely that this asymmetry arises from the disordered nature of the porous medium 515, which could affect the local flow resistance and thereby the local flow rate. Alternatively, the thermal performance of the brazed interface may vary spatially. A notable exception to this trend was the top thermocouples in regions B and D.

As shown in FIG. 10A, the thermal response varies with time during the highly transient event. First, since the anticipation time was 190 ms in this case, the cooling precedes heating resulting in a sharp drop in plate 520 temperatures that generally are seen in regions A and E slightly ($\approx$10 ms) before B and D. At the onset of heating, the temperatures at the bottom of regions B and D sharply rise; however, this rise is reversed after a few hundred milliseconds. The oscillations in temperature over the first 1 s of heating are likely induced by the thermal mass of the heat spreader. Shortly after 2 s, the rate of cooling decreases due to the re-pressurization of the vacuum tank. At 5.35 s, the heater 513 turns off, and the thermal gradients in the heat spreader quickly dissipate as the mean temperature drops.

Because the response time of the thermocouples 522 soldered to the heater covers is prohibitively slow for transient analysis, the temperature of the heaters 513, and therefore the performance of the cooling mechanism, is best described by the thermocouples located at the bottom of regions B and D. In order to analyze the performance of each run, these two transient temperature readings were averaged and subsequently evaluated.

The pressure gradient was expected to increase the flow velocity through the 5 mm gap (transverse exit ports 590), which may enhance convection; however, the higher internal chamber pressure suppresses the saturation temperature, likely reducing the initial rate of cooling in Regions B, C, and D. In support of this conclusion, the cooling provided to regions B and D appears to reach its peak value at approximately 1.1 s.

The temperature variations noted in run 6 are likely the culmination of three transient effects, namely: transient heat conduction across the thickness and length of the heat spreader (~10-100 ms), pressure equilibration of the internal and external chambers ($\approx$1 s), and pressurization of the vacuum tank ($\approx$5 s). The magnitude and timing of these effects could be engineered by modifying the geometric parameters of the heat spreader 520 and/or inner chamber 514, as well as the capacity of the vacuum tank 418.

The polycarbonate flash chamber 512 was initially at the same initial temperature, 25° C., as the rest of the system 400. Over the course of an experiment, both the heat spreader 520 and the fluid experience non-negligible thermal interaction with the inner chamber 514. Heat transferred with the heat spreader 520 increases or decreases the apparent effectiveness of the cooling source, depending on whether the mean temperature of the heat spreader rises or falls during a given experiment. Heat transferred with the fluid increases the amount of vaporization, ultimately affecting the first-law efficiency of the mechanism. Due to the nature of transient heat conduction, these effects are the largest at the beginning of the experiment and wane with time. Calculations approximating the inner chamber 514 as a semi-infinite solid predict the losses are about one order of magnitude lower than the effects of the heaters and the cooling mechanism.

Thermal Metrics for Transient Cooling Systems—Mathematical Framework

As previously discussed, it is difficult to manage the temperature of pulsed high-heat-flux devices. When operating at steady-state, the cooling mechanism solely needs to offset the energy produced by the heat source; however, during the transient start-up period the thermal resistance and capacitance of the solid result in transient temperature variation, even for an idealized cooling scenario. The nature of these transient temperature variations is described in detail below.

The majority of high-energy-density applications solely require that the device remain below an upper temperature threshold. As a result, when evaluating a cooling system with a surrogate heat source, the maximum temperature reached by the surrogate device is a viable metric for the performance of the cooling mechanism. Similarly, the minimum temperature can also be used. However, the extrema do not fully describe the performance of a given cooling mechanism. Indeed, to more fully describe the transient performance of the cooling mechanism, at least one additional thermal metric is required. For example, one could evaluate how quickly the temperature changes or how close the temperature remains near an optimal value. Due to the wide variety of high-energy-density devices, there may not be a single answer as to what this metric should be.

Whatever additional metric is chosen for evaluating the transient performance of the cooling mechanism, it should be relevant to the physics of the possible applications. For example the maximum temperature is a clear choice, since many devices will fail if their internal temperature becomes too high. To ascertain the desired metric, the thermal requirements of a diode-pumped solid-state laser are first considered. This system was chosen due to its pulsed operation, high power density, and thermal sensitivity.

Laser diode arrays require uniform temperature, both spatially and temporally, to reduce wavelength shift and spectral broadening. A lasing event is commonly implemented as a series of high current density (about 100 A cm$^{-2}$) quasi-continuous-wave pulses that are about 10 seconds (s) to 1 millisecond (ms) in duration and induce a local temperature change of 1-10° C. This short timescale thermal behavior is overlaid on a longer timescale (about 100 ms) response resulting from the average power. The spectral output of an 808 nm GaAs quantum-well semiconductor laser shifts by 0.27 nm ° C.$^{-1}$ as the mean temperature of the device drifts.

To evaluate thermal performance, objective function was derived to approximate the effect of temperature drift on the performance of a diode-pumped solid-state laser. The diode bar and the solid-state laser exhibit a strong spectral dependence in emission intensity and absorption coefficient. Maximum optical efficiency is obtained when the peaks of these spectra are aligned. The system is approximated by first assuming a Gaussian spectral distribution for the solid-state laser absorption and the diode emission as shown below:

$$\alpha(\lambda) = \alpha_o \exp\frac{[\lambda - \lambda_\alpha]^2}{2c_\alpha^2} \quad (2.1)$$

$$I(\lambda, T) = I_o \exp\frac{[\lambda - \lambda_I(T)]^2}{2c_I^2} \quad (2.2)$$

In these equations, T, $\alpha$, I, and $\lambda$ represent the temperature, absorption coefficient, emission intensity, wavelength, and variance, respectively.

To evaluate how well-aligned the solid-state laser absorption and diode emission spectra are, a spectral integral is applied to the product of these values. Normalizing this integral by its value at the optimal temperature, $T_o$, produces the following approximation for the effect of temperature on the efficiency of the optical transmission:

$$\eta(T) = \frac{\int_{-\infty}^{\infty} \alpha(\lambda) I(\lambda, T) d\lambda}{\int_{-\infty}^{\infty} \alpha(\lambda) I(\lambda, T_o) d\lambda} \quad (2.3)$$

The peak output wavelength of a laser diode is often assumed to shift linearly with the device temperature. Applying this assumption and integrating Eq. (2.3) using the Gaussian expressions for the absorption (Eq. 2.1) and emission (Eq. 2.2), yields the final form:

$$\eta(T) = \exp\left[-\frac{(T - T_o)^2}{2\theta^2}\right] \quad (2.4)$$

As shown in Eq. (2.4), the efficiency of optical transmission becomes a Gaussian function that depends on the temperature drift from the optimal value. The temperature tolerance, $\theta$, is defined as:

$$\theta = \frac{c_I}{\beta}\sqrt{\frac{c_I^2 + c_\alpha^2}{c_I^2 + .5c_\alpha^2}} \quad (2.5)$$

where $\beta$, is the temperature sensitivity of the diode emission spectrum.

For a system comprised of a GaAs quantum-well diode paired with a Nd:YAG laser, the peaks are near 808 nm when well-aligned, whereas the temperature sensitivity, $\beta$, is approximately 0.27 nm $°$ C.$^{-1}$. Using representative values for the spectral behavior, the full-width half-maximum of the GaAs diode bar emission and the Nd:YAG laser absorption spectra are assumed to be 3 nm and 2 nm, respectively. By applying these quantities to Eq. (2.5), the temperature tolerance, $\theta$, is found to be 5.13° C.

This analysis was intentionally simplified to produce Gaussian behavior in order to yield an expression applicable to analogous thermal systems. As a result, the above analysis is only valid when the optical path through the Nd:YAG crystal is relatively short and when the following effects are negligible: nearby absorption peaks in Nd:YAG, temperature on the absorption spectrum and the diode threshold current, and spectral broadening due to spatially varying temperature in an array of laser diodes.

By integrating Eq. (2.4) starting at the beginning of the heat pulse and dividing by the amount of time the heater has been on, the following time-dependent, dimensionless objective function is obtained:

$$F(t) = \frac{1}{t - t_h} \int_{t_h}^{t} \eta(T) dt \quad (2.6)$$

When using these temperature metrics (minima, maxima, and temperature sensitivity), the results can be compiled over various time windows. By breaking the evaluation metrics into segments, the performance of the cooling mechanism can be compared to applications with pulsed heat loads of varying length. This basis for analysis was utilized to evaluate the flash-boiling cooling techniques and methods of the present disclosure. It was also employed to characterize the inventive systems hereof.

Green's Function Solutions for the Cooling of Pulsed Thermal Loads

Typically, a cooling mechanism is implemented when a high-heat-flux device actuates to constrain the temperature. For the majority of cases, the objective of the cooling mechanism is to keep the temperature between a lower and upper extreme. In more demanding applications, such as for a diode-pumped solid-state laser, optimal performance is obtained when the temperature remains at an optimal value. In the steady-state limit, the temperature is stabilized when the rate of heating and cooling balance; however, in a dynamic thermal system, uniform temperature is more difficult to obtain.

The temperature of a pulsed high-heat-flux device fluctuates during start up. The magnitude of the temperature fluctuations is proportional to the temperature difference at steady state. For a one-dimensional, homogeneous thermal system, the steady-state temperature drop is $\Delta T = q''_h L/k$. As either the heat flux or the thermal resistance of the system increases, the temperature fluctuations become more significant, potentially impeding device operation unless transient performance is optimized.

In order to establish the design parameters for the cooling of pulsed heat loads in furtherance of the presently disclosed devices, systems, and methods, Green's functions were used to obtain the transient temperature within one- and two-dimensional heat conduction systems with dynamically actuated cooling and heating. The heat source is implemented as a pulsed heat-flux with constant magnitude. While temperature stability could be improved by varying the rate of heat generation, the implicit objective of a cooling mechanism is to achieve the required thermal performance without throttling the device.

Below, cooling is discussed as a Neumann (heat flux) boundary condition. While not representative of typical cooling mechanisms, the case elucidates the objective of a transient cooling mechanism. Namely, the thermal capacity of the device must be offset as quickly as possible. The additional cooling required can be implemented by either anticipating the heat load or optimizing the rate of cooling dynamically.

Furthermore, cooling was also applied as a Robin (convective) boundary condition. Approaches for reducing the temperature fluctuations during device start-up were established using the inventive devices, systems and methods of the present disclosure. The possible solutions for a dynamic cooling mechanism can be summarized as:

Anticipate the thermal load
Improve the heat transfer coefficient
Enhance the cooling during the start-up period
Match the time constant of the cooling mechanism to the device.

Figure 11:
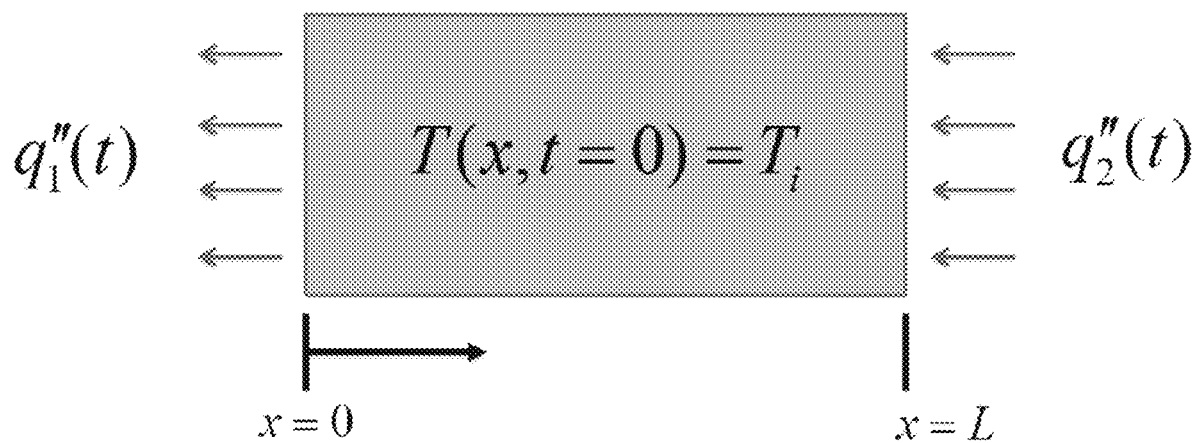
FIG. 11 is a schematic representative of the 1D conduction system with heat-flux boundary conditions.

Pulsed Cooling of a Pulsed Heat Load in a One-Dimensional System. The nature of the thermal transients and theoretical limits in performance were established by considering the idealized one-dimensional system with a pulsed transient heat load, $q''_2$ cooled by a matching pulse of cooling, $q''_1$, as displayed in FIG. 11. The system is assumed to be initially at a spatially uniform temperature, $T_i$.

To find the transient temperature throughout the homogeneous one-dimensional system, the representative Green's function is obtained:

$$G_{X22}(x, t|x', \tau) = \frac{1}{L}\left[1 + 2\sum_{m=1}^{\infty} e^{-m^2\pi^2\alpha(t-\tau)/L^2}\cos\frac{m\pi x}{L}\cos\frac{m\pi x'}{L}\right] \quad (2.7)$$

where L is the thickness of the 1D solid and $\alpha$ is the thermal diffusivity of the material. The symbols $x^1$ and $\tau$ are the spatial and temporal variables over which the kernel is integrated. The subscript of the Green's function, $G_{X22}$, indicates Cartesian coordinates with boundary conditions of the second type. The temperature in the one-dimensional transient system is obtained by solving:

$$T(x, t) - T_i = \quad (2.8)$$
$$-\frac{\alpha}{k}\int_{\tau=0}^{t} G_{X22}(x, t|0, \tau)q''_1(\tau)d(\tau) + \frac{\alpha}{k}\int_{\tau=0}^{t} G_{X22}(x, t|0, \tau)q''_2(\tau)d\tau$$

where $q''_1$ and $q''_2$ are the heat-flux boundary conditions on the left and right side, respectively.

Pulsed Cooling with Constant Magnitude. The solution was obtained for a simple case where both boundary conditions are constant and implemented in a stepwise manner. The left boundary condition begins at t=0 and has the constant value $q''_1(t)=q''_o$. The right boundary condition has the same magnitude but is delayed by a given amount of time, $q''_2(t)=q''_o H(t-t_{ant})$, where H represents the Heaviside function. The subscript 'ant' denotes the degree to which the cooling on the left side, $q''_1(t)$, "anticipates" the application of the heat source on the right, $q''_2(t)$. The resulting solution for the temperature is:

$$\frac{k(T(x, t) - T_i)}{q''_o L} = \quad (2.9)$$
$$-\frac{\alpha t}{L^2} - \frac{2}{\pi^2}\sum_{m=1}^{\infty}\frac{1}{m^2}\cos\left(\frac{m\pi x}{L}\right)\left(1 - e^{-m^2\pi^2\alpha t/L^2}\right) + \ldots H(t - t_1)$$

-continued
$$\left[\frac{\alpha(t - t_{ant})}{L^2} + \frac{2}{\pi^2}\sum_{m=1}^{\infty}\frac{(-1)^m}{m^2}\cos\left(\frac{m\pi x}{L}\right)\left(1 - e^{-m^2\pi^2\alpha(t-t_{ant})/L^2}\right)\right]$$

The notation can be simplified by forming the following non-dimensional groups:

$$T^*(x^*, Fo) = \frac{k[T(x, t) - T_i]}{q''_o L} \quad (2.10)$$

$$Fo = \frac{\alpha t}{L^2} \quad (2.11)$$

$$x^* = \frac{x}{L} \quad (2.12)$$

where T* is the non-dimensional temperature, Fo is the Fourier number, and x* is the non-dimensional spatial coordinate. The temperature is non-dimensionalized by the temperature drop across the one-dimensional system at steady state. The final form of the equation after non-dimensionalization is:

$$T^*_{2,o}(x^*, Fo) = -Fo - \frac{2}{\pi^2}\sum_{m=1}^{\infty}\frac{1}{m^2}\cos(m\pi x^*)\left(1 - e^{-m^2z^2 Fo}\right) + \quad (2.13)$$
$$H(Fo - Fo_{ant}) \times \ldots \left[(Fo - Fo_{ant}) + \frac{2}{2\pi^2}\sum_{m=1}^{\infty}\frac{(-1)^m}{m^2}\cos(m\pi x^*)\left(1 - e^{-m^2\pi^2(Fo-Fo_{ant})}\right)\right]$$

The subscript of the temperature, $T^*_{2,o}$, denoting the boundary condition for cooling is the second kind and has constant magnitude.

Figure 12:
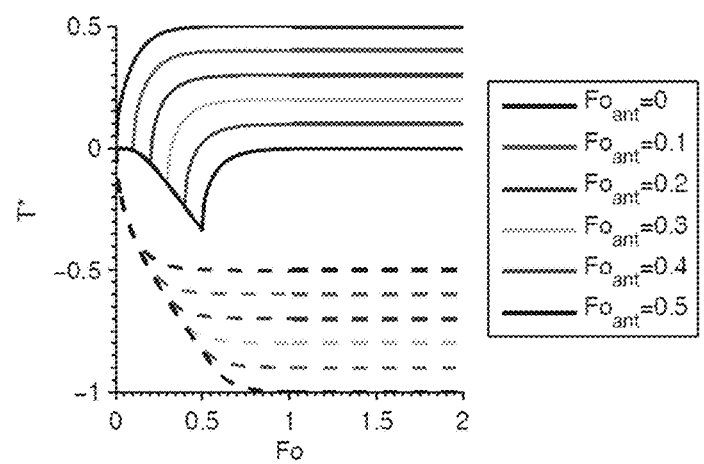
FIG. 12 illustrates a line graph representative of anticipating a pulsed heat load with pulsed cooling, with both the temperature on the heated side (solid) and the cooled side (dashed) shown.

The transient temperature was approximated by summing the first 100 terms of each series. The convergence of the solution was checked by increasing the number of terms to 1000, for which the solution varied by less than 0.5%, other than at very small time (Fo<0.05). The resulting transient profiles obtained while varying the anticipation are shown in FIG. 12. The solid and dashed curves represent the temperature on the heated and cooled sides, respectively.

For the case where $Fo_{ant}=0$, heating and cooling were applied simultaneously. The antisymmetric boundary conditions resulted in the same temperature trend on each side, reaching a magnitude of T*=0.5 at steady state. When the anticipation was varied, the average temperature of the system decreased in direct proportion to the anticipation, $T_{avg}=-Fo_{ant}$. This trend was confirmed by the terms outside the summations in Equation (2.13).

In at least one embodiment, the thermally sensitive components of the devices hereof reside at or near the heat source. In such a cases, the temperature of the heated side determines the performance of the cooling mechanism (i.e. a heat pulse is what drives when the heat transfer devices hereof are to be triggered). In order to ensure that the steady-state temperature on the heated side does not exceed the initial temperature, an anticipation of $Fo_{ant}=0.5$ is required. In other words, in certain cases, it may be beneficial to actively trigger a flash boiling event before a heat load is applied to ensure thermal latency (i.e. anticipate that heat load). The role of anticipation is to offset the initial thermal energy stored within the system sufficiently to achieve the desired steady-state temperature.

Pulsed Cooling with Assist Applied as an Exponential Decay. Presupposing that the desired steady-state temperature on the heated side is the initial temperature, $T_i$, the thermal capacity of the system must be offset, such as by anticipation. Alternatively, the rate of cooling can be dynamically controlled. To reflect such a system, the cooling is dynamically varied using an 'assist' term: $q''_c(t)=q''_o+q''_{assist}(t)$.

In practice, the rate of cooling could be dynamically controlled in a variety of ways. Relevant to the present disclosure, desorption from the foam (carbon or otherwise) might increase cooling performance during the start-up transients, provided desorption cooling is engineered to be both sufficiently large and fast. Perhaps more realizable with conventional technology, the saturation temperature of a phase-change cooling mechanism can be dynamically controlled by modulating the pressure. For example, a vacuum/low-pressure accumulator would induce a lower saturation temperature initially than at steady state. In either case, rate of cooling would initially be at a peak and then decrease with time. To represent the cooling assist generically, an exponential function, $q''_{assist}=q''_+\exp(-aFo)$, is chosen, where $q''_+$ is the initial magnitude of the cooling assist and a is the exponential decay constant.

When using Green's functions, the effects of each heat source and sink can be considered separately. For convenience, the assist term is separated from the constant cooling; hence, the new solution was obtained by adding the effects of the cooling assist to the previously derived solution, $T^*_{2,o}(x^*, Fo)$, in Equation (1.13). The resulting solution is:

$$T^*(x^*, Fo) = T^*_{2,o}(x^*, Fo) + \frac{q''_+/q''_o}{a}(1 - e^{-aFo}) + \ldots \quad (2.14)$$

$$\frac{2}{\pi^2} \sum_{m=1}^{\infty} \frac{q''_+/q''_o}{m^2 - a/\pi^2} \cos(m\pi x^*)\left(e^{-aFo} - e^{-m^2\pi^2 Fo}\right)$$

In order to sufficiently offset the thermal capacity of the system, the net cooling applied by the transient assist can be calculated as:

$$\int_0^\infty q''_{assist}/q''_o dFo = (0.5 - Fo_{ant}) \quad (2.15)$$

Figure 13A:
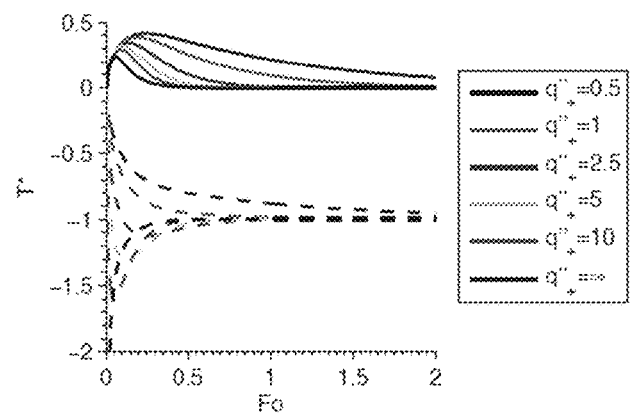
FIGS. 13A and 13B illustrate the results of reducing the temperature overshoot by dynamically controlling the cooling rate, with FIG. 13A displaying the temperature on the heated (solid) and cooled (dashes) sides and FIG. 13B displaying the maximum temperature experienced by the heated side (the asymptotic limit is the result for cooling applied as a delta function)

Using the above equation, the magnitude and duration of the cooling assist can be chosen such that $q''_+/q''_o=(0.5-Fo_{ant})a$. A larger value for the initial magnitude $q''_+$, increases exponential decay constant, a. As a result, the requisite cooling is applied more immediately. To show the effect on the device temperature, the anticipation was assumed to be zero, $Fo_{ant}=0$, and the initial magnitude of the assist was varied. The exponential decay constant was chosen to satisfy Equation (2.15). The transient temperature for this case is shown in FIG. 13A.

Figure 13B:
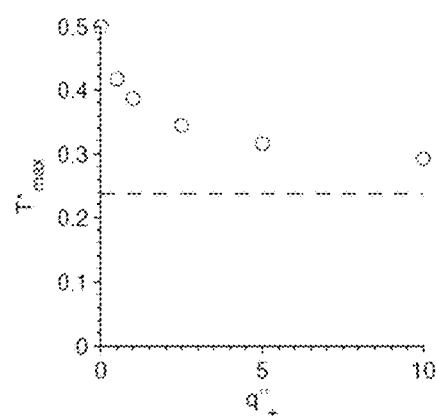

As the intensity of the cooling assist increases, the thermal overshoot is reduced. The peak temperature reached during the initial transient thermal overshoot is plotted in FIG. 13B.

Pulsed Cooling with Assist Applied as a Delta Function. The foregoing development demonstrates that additional cooling is the most effective when applied rapidly. In the extreme limit as $q''_+$ and a approach infinity, the cooling assist may be applied as a delta function $q''_{assist}=q''_+\delta(Fo=0)$, thereby minimizing the thermal overshoot. The requisite net cooling follows the same relation as in Equation (2.15). Solving Equation (2.7), the temperature can be calculated as:

$$T^*(x^*, Fo) = T^*_{2,o}(x^*, Fo) + \frac{q''_+}{q''_o} + 2\frac{q''_+}{q''_o}\sum_{m=1}^{\infty} \cos(m\pi x^*)e^{-m^2\pi^2 Fo} \quad (2.16)$$

Figure 14A:
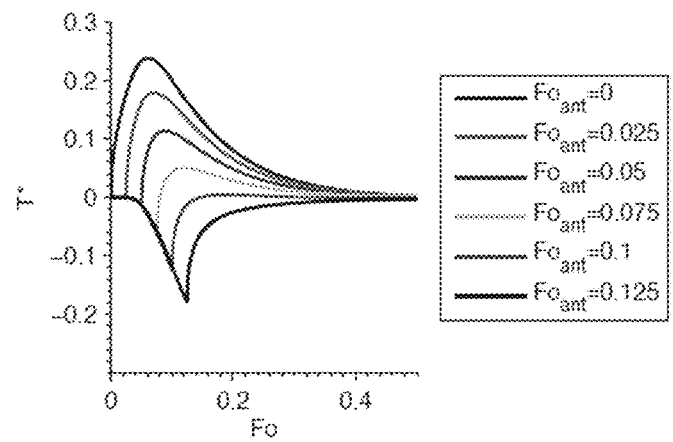
FIGS. 14A and 14B show graphs related to reducing the temperature overshoot using an idealized, delta-function cooling source, with FIG. 14A displaying the temperature on the heated side and FIG. 14B displaying the maximum and minimum temperatures experienced by the heated side.
Figure 14B:
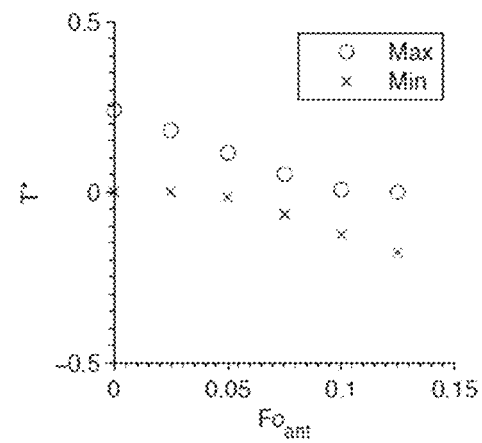

When the cooling assist is applied as a delta function, the transient temperature is that shown in FIG. 14A with the corresponding values for the extrema in FIG. 14B. This case was used to determine the asymptote for the temperature overshoot, max=0.238, shown in FIG. 13B.

Cooling applied as a delta function improves temperature stability and reduces the anticipation required to reduce the overshoot; however, even this idealized case is not sufficient to perfectly stabilize the temperature on the heated side, as illustrated in FIGS. 14A and 14B. Optimal temperature stability may be obtained when the anticipation is approximately $Fo_{ant}=0.075$.

While a delta function is not obtainable by realistic cooling mechanisms, the scenario provides a performance benchmark. Additionally, results are comparable to the idealized case if cooling is applied rapidly. For example, the cooling assist applied as an exponential decay begins to approach the asymptote once the initial magnitude is large (e.g., $q''_+>10$; see FIG. 4B). Theoretically, the temperature overshoot could be suppressed further by increasing the magnitude of the delta function and offsetting the excess cooling with heating, but such a scenario is impractical.

As previously described, the extrema are relevant to many applications, but do not fully describe the character of the transient temperature profiles. To further describe the temperature of the system, the temperature stability metric (Eq. (2.4)) may be applied after being non-dimensionalized as:

$$\eta(T) = \exp\left[\frac{T^{*2}}{2\theta^{*2}}\right] \quad (2.17)$$

where the non-dimensional temperature tolerance is: $\theta^*=k\theta/q''_oL$. In order to yield results that are sensitive to the transient performance, the non-dimensional temperature tolerance can be chosen to be $\theta^*=0.1$.

Figure 15A:
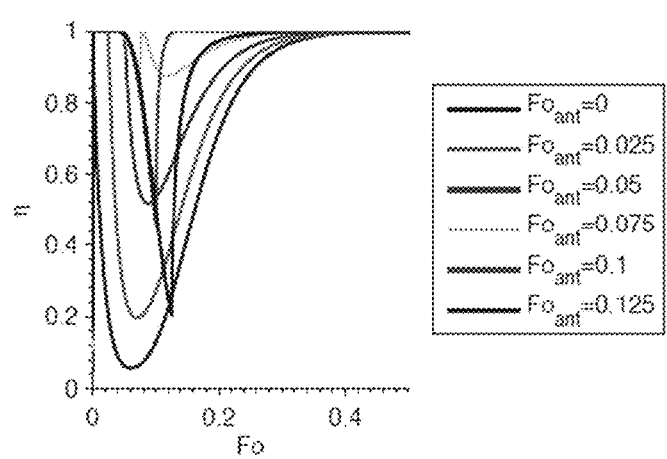
FIGS. 15A and 15B show graphs related to evaluating temperature stability when using an idealized, delta-function cooling source, with FIG. 15A showing the temperature stability metric for varying anticipation and FIG. 15B evaluating the cost function with varying start time, as shown in Eq. (2.18)

In FIG. 15A, the value of the temperature stability metric, η, is plotted with respect to time. Recall that the value of the temperature stability metric varies between zero and one, and represents the optical-transmission efficiency for an idealized diode-pumped solid-state laser. The optimal choice of anticipation significantly improves the temperature stability over the transient window, which may account for an appreciable fraction of the device operating period.

To analyze the expected performance over the entire transient start-up period, the temperature stability metric is implemented as the cost function:

$$C=\int_{Fo_i}^{\infty}[1-\eta(T)]dFo \quad (2.18)$$

When applied to a diode-pumped solid-state laser, the cost function represents the amount of energy that is lost during optical transmission due to temperature drift. Because the integral is performed with respect to time, the magnitude is the effective duration for which the device is inactive, by comparing the net energy transferred to a case with perfect temperature control. More generally, the cost function quantitatively describes the temperature drift from the desired value, and therefore should be minimized.

Figure 15B:
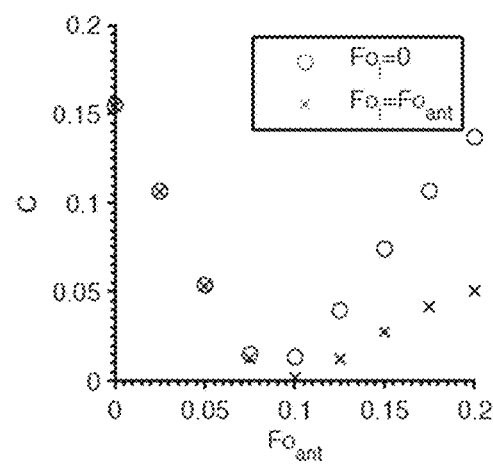

FIG. 15B displays the value of the cost function for various selected anticipation values with cooling assist applied as a delta function. Depending on the application, the temperature of the device before it actuates may or may not be of concern. To accommodate either scenario, the value of the cost function is displayed for cases where the integral, Equation (2.18), begins with either the cooling, $Fo_i=0$, or with the heat source, $Fo_i=Fo_{ant}$. The value of the cost function can be minimized when the anticipation is near $Fo_{ant}=0.1$. If temperature stability is only crucial when the device is on, it may be better to over-anticipate the heat load than to under-anticipate.

Convective Cooling of a Pulsed Heat Load in a One-Dimensional System. The previous section evaluated the performance of a simplified cooling system with a pulsed cooling flux. Optimal performance was obtained when the thermal mass was counteracted rapidly by dynamically controlled cooling. A performance benchmark for temperature stability was obtained using a delta function. However, convective cooling is more common for high-heat-flux management. This section addresses the mathematical framework associated with the optimal design for such a cooling mechanism. The new set of boundary conditions increases the complexity of the analysis, so the effects of various parameters will be considered individually. The Biot number and the rapidity of the cooling mechanism both impact the transient performance. Similar to pulsed cooling with assist applied as an exponential decay, the temperature can be stabilized by dynamically controlling the rate of cooling; however, in most cases, the time constant should match that of the device.

Figure 16:
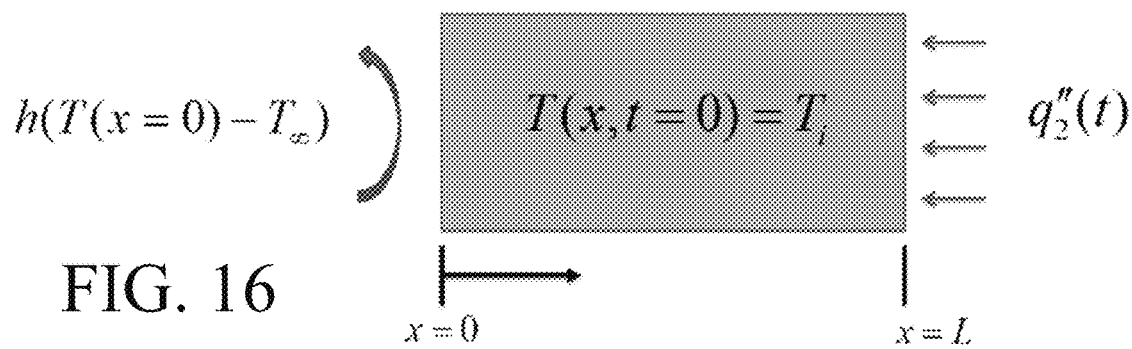
FIG. 16 shows a representation of the 1D conduction system with heat flux and convective boundary conditions.

The one-dimensional system depicted in FIG. 16 has a convective boundary condition applied at x=0 and a heat-flux boundary condition at x=L. The initial temperature is uniformly at $T_i$.

Given the change in boundary conditions, the Green's function for this homogenous system is:

$$G_{X32}(x, t|x', \tau) = \frac{2}{L} \sum_{m=1}^{\infty} e^{-\beta_m^2 \alpha(t-\tau)/L^2} \qquad (2.19)$$

$$\frac{\beta_m^2 + Bi^2}{\beta_m^2 + Bi^2 + Bi} \times \ldots \cos\left[\beta_m\left(1-\frac{x}{L}\right)\right]\cos\left[\beta_m\left(1-\frac{x'}{L}\right)\right]$$

where the term $\beta_m$ is determined by the transcendental equation:

$$\beta_m \tan \beta_m = Bi \qquad (2.20)$$

The Biot number, $Bi=hL/k$, is the ratio of the conductive and convective thermal resistances. The transcendental equation is solved beginning with the following approximate solution:

$$\beta_m = \begin{cases} \sqrt{\frac{3Bi}{3+Bi}\left[1-\frac{1}{45}\left(\frac{3Bi}{3+Bi}\right)^2\right]} & \text{for } m=1 \\ (m-1)\frac{\pi/2}{Bi+3}\left[2Bi+3+3\sqrt{1+\frac{4Bi(Bi+3)}{3\pi^2(m-1)^2}}\right] & \text{for } m>1 \end{cases} \qquad (2.21)$$

The series was then converged using the Newton-Raphson method, which provided reliable results for $Bi\leq40$, beyond which the converged solution would miss terms in the series. The converged solution for the series is within ±1% of the approximate form above for $Bi\leq10$.

The transient temperature of the system is calculated using:

$$T(x,t) - T_i = \frac{\alpha}{k}\int_{\tau=0}^{t} G_{X32}(x, t|0, \tau)h(T_\infty - T_i)d\tau + \ldots \qquad (2.22)$$

$$\frac{\alpha}{k}\int_{\tau=0}^{t} G_{X32}(x, t|L, \tau)q_2'' d\tau$$

By solving this equation and applying the non-dimensional values in Equations (2.10)-(2.12), the following solution can be obtained:

$$T_{3,o}^*(x,t) = \qquad (2.23)$$

$$2T_\infty^* Bi \sum_{m=1}^{\infty} \frac{\beta_m^2 + Bi^2}{\beta_m^2 + Bi^2 + Bi} \frac{\cos \beta_m}{\beta_m^2}\cos[\beta_m(1-x^*)]\left[1-e^{-\beta_m^2 Fo}\right] +$$

$$\ldots 2H(Fo - Fo_{ant})$$

$$\sum_{m=1}^{\infty} \frac{\beta_m^2 + Bi^2}{\beta_m^2 + Bi^2 + Bi} \frac{1}{\beta_m^2}\cos[\beta_m(1-x^*)]\left[1-e^{-\beta_m^2(Fo-Fo_{ant})}\right]$$

where the subscript of the non-dimensional temperature, $T^*_{3,o}$, indicates the solution is for a system with convective cooling and a constant fluid temperature.

Because the cooling boundary condition is of the third kind, the anticipation no longer affects the steady-state temperature. Instead, the steady-state temperature on the heated side, $T_{SS}$, is solely determined by the Biot number, Bi, and the fluid temperature, $T_\infty$, and is calculated by the following relation:

$$T_{SS} = T(x=L, t\to\infty) = T_\infty + q_h''\left(\frac{L}{k} + \frac{1}{h}\right) \qquad (2.24)$$

Temperature Overshoot When Approaching Steady State. The primary objective of most cooling systems is to keep the device temperature below a certain threshold. In order to aid convective heat transfer, a cooling system could be designed such that the device reaches its maximum temperature at steady state. To consider such a scenario, the desired steady-state temperature of the heated side, $T^*_{SS}$, was varied by adjusting the fluid temperature according to Equation (2.24) and assuming that Bi=1.

Figure 17A:
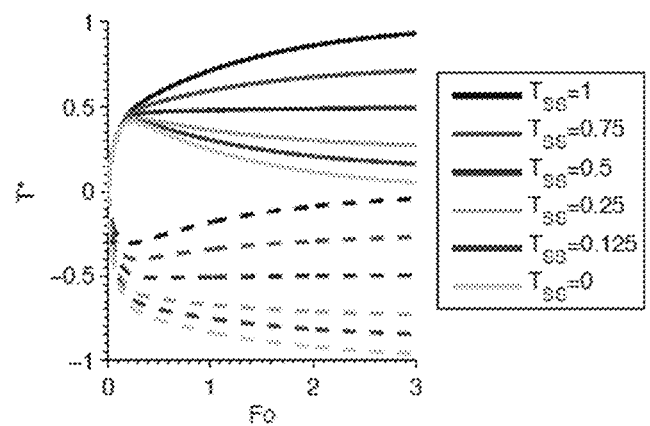
FIGS. 17A and 17B show graphs of data related to varying the steady-state design criteria for convective cooling, with FIG. 17A showing the temperature on the heated side (solid) and the cooled side (dashed) and FIG. 17B showing the temperature overshoot as a percentage of the steady-state value, with additional points to fill in the curve.
Figure 17B:
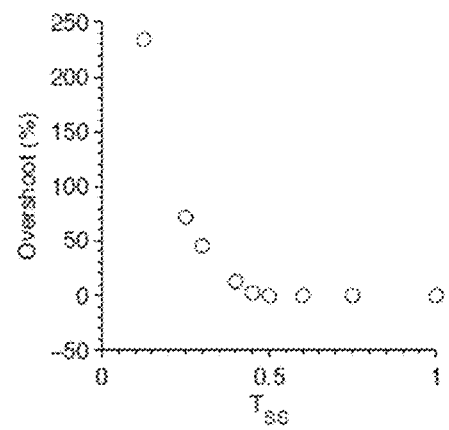

The resulting transient temperature profiles are shown in FIG. 17A. For the cases where the desired steady-state temperature is less than 0.5, the startup transients overshoot the steady-state value. FIG. 17B displays the magnitude of the overshoot as a percentage of the steady-state temperature.

The overshoot is only eliminated if the difference between the steady-state temperature and the initial temperature is at least half of the temperature drop across the device at steady-state. This analysis indicates that if the non-dimensionalized maximum device temperature, $T^*_{max}$, is less than 0.5, the transient regime may violate the upper temperature threshold. While this result was formulated for a one-dimensional, homogeneous conductive material, more complicated thermal systems with analogous geometry are expected to exhibit a similar trend.

Accordingly, the following guidelines are appropriate when considering the impact of transients on a device with a known temperature maximum:

if $T^*_{max} \gg 1$, transient performance can be neglected if $0.5 < T^*_{max} < 1$, transient performance may be important if $T^*_{max} < 0.5$, transient performance must be considered.

If the non-dimensionalized maximum device temperature is in the range $0.5 < T^*_{max}, 1$, the transient performance of the system should be evaluated to consider if any non-idealities, such as poor timing or a slowly actuating cooling mechanism, result in significant overshoot. Because the peak is reached at Fo≈0.25, any delay in the cooling mechanism must be less than this value to obtain the overshoot shown in FIG. 8B; otherwise, the overshoot could be much larger. For a 1 mm copper plate, a Fourier number of Fo=0.25 is equivalent to a time of t=2.3 ms, which is a difficult response time for most cooling systems to achieve.

In FIGS. 17A and 17B, the transient behavior is the most significant when the steady-state temperature is set to the initial temperature. To highlight the effects of transient design parameters, this concept is the focus of the remaining examples.

Figure 18:
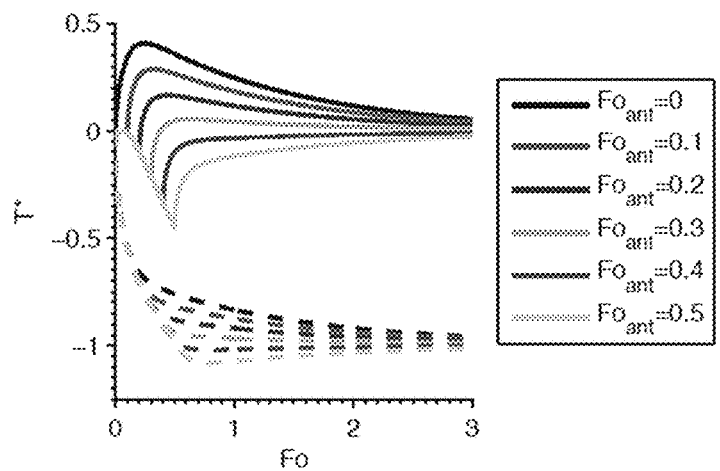
FIG. 18 shows a graph representative of data relating to anticipating a pulsed heat load with convective cooling, with both temperatures on the heated side (solid) and the cooled side (dashed) shown (Biot number assumed to be 1)
Figure 19A:
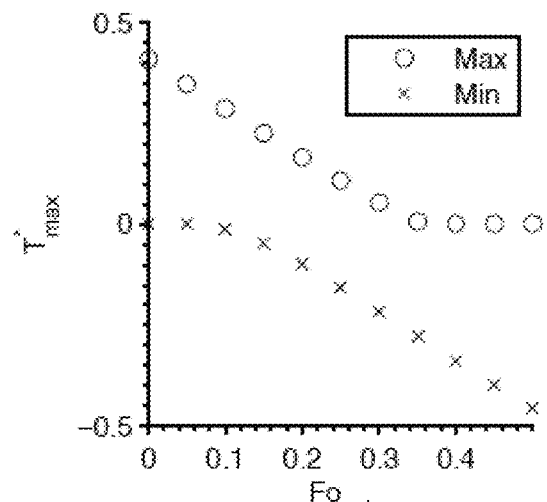
FIGS. 19A and 19B show graphs of data related to evaluating temperature stability when anticipating a pulsed heat load with convective cooling, with FIG. 19A showing the maximum and minimum temperature reached on the heated side and FIG. 19B showing the cost function evaluated with varying start time, as shown in Eq. (2.18)
Figure 19B:
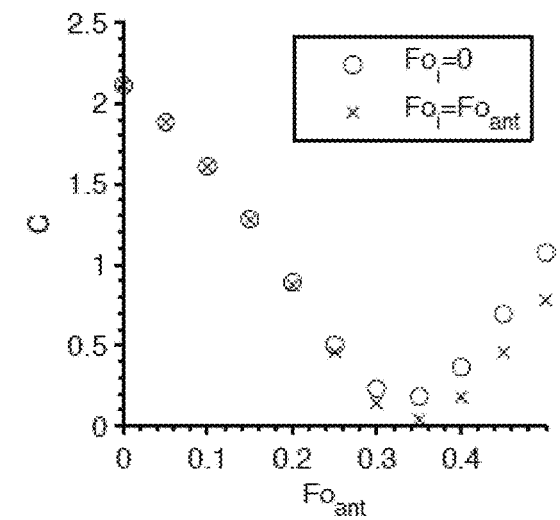

Convective Cooling with Anticipation. As shown previously, such as in FIG. 12, the temperature overshoot is reduced when the thermal load is anticipated. FIG. 18 displays the transient temperature as the anticipation is varied. Similar to previous cases, the variation in temperature can be minimized, but not entirely eliminated, by selecting an appropriate anticipation. The temperature extrema for varying anticipation are shown in FIG. 19A. The difference between the minimum and the maximum is reduced in the range of $0.2 < \text{Fo}_{ant} < 0.35$. The cost function in Equation (2.18) is evaluated in FIG. 19B, which shows that the function is minimized near Fo≈0.35. Unlike the previous case with idealized cooling shown in FIG. 15B, the system is still relatively sensitive to over-anticipation even if the cost function is only evaluated when the heat source is active.

Figures 20A, 20B, 20C:
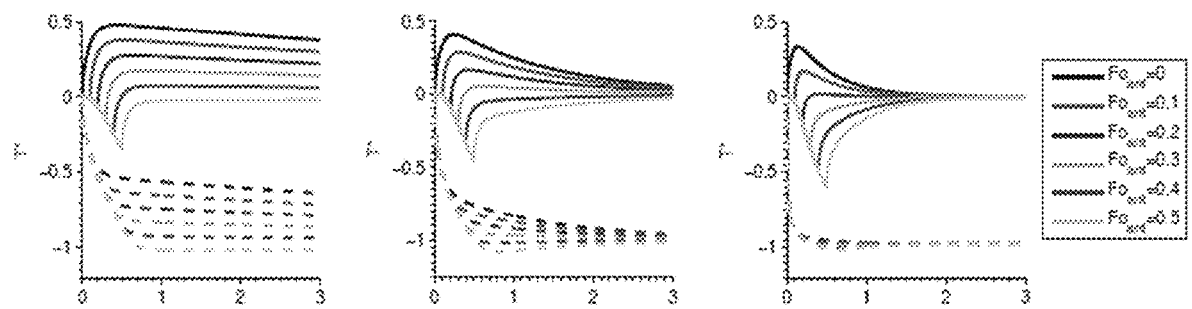
FIGS. 20A-20C show graphs representative of data resulting from varying the Biot number while balancing the steady-state cooling by varying $T_\infty$ using Eq. (2.24)

Convective Cooling with Varying Biot Number. In the previous two examples, the Biot number was assumed to be unity; however, it has a large effect on the thermal performance when varied. Varying the Biot number necessitates changing the fluid temperature to satisfy Equation (2.24). Although applying this equation negates the effects in the steady-state, the transient performance is modified. As displayed in FIGS. 20A-20C, an increase in the Biot number suppresses the transient temperature variation, causing the system to reach the steady-state condition more quickly. In contrast, a system with a very low Biot number has larger temperature overshoot and takes much longer to reach steady state (Fo≫1).

Figure 21A:
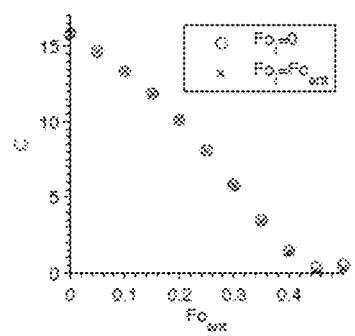
FIGS. 21A-21C show graphs related to evaluating temperature stability while varying the Biot number, where the steady-state temperature is maintained by applying Eq. (2.24)
Figure 21B:
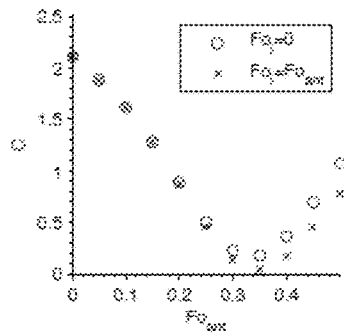
Figure 21C:
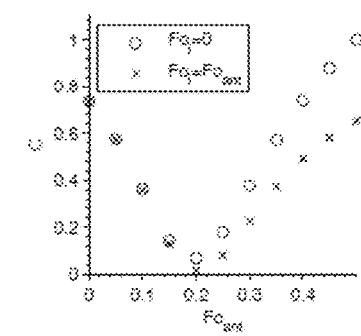

The cost function in Equation (2.18) is shown for varying Biot number in FIGS. 21A-21C. Accordingly, increasing the Biot number results in a reduction of both the magnitude of the cost function and the anticipation required.

Figure 22:
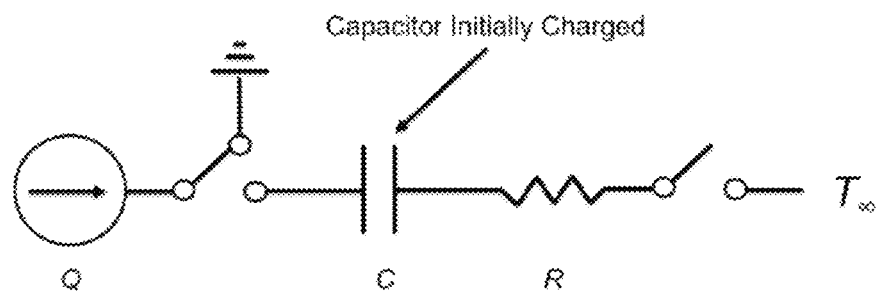
FIG. 22 illustrates a schematic diagram of a simplified thermal circuit representing a convectively cooled heat source separated by a solid (the sold represented as a charged capacitor and the convection represented as a resistor)

The impact of the Biot number on the transients is considered using the analogous, simplified thermal circuit schematic shown in FIG. 22. In the circuit, the heat source is activated at the same time as the sink by closing both contacts. The capacitor and the resistor represent the thermal capacity of the system and the convective resistance, respectively. As the conductance of the resistor increases, the circuit discharges the capacitor more quickly, despite a balancing increase of $T_\infty$. In the two extremes, if the conductance was infinite, the capacitor would discharge instantly even if $T_\infty = T_i$ and, conversely, if the conductance was zero, the capacitor would never discharge even if $T_\infty = -\infty$. In a similar manner, enhancing the convection by increasing the Biot number dissipates the thermal energy stored in the device more quickly, thereby suppressing the transients.

Figure 23:
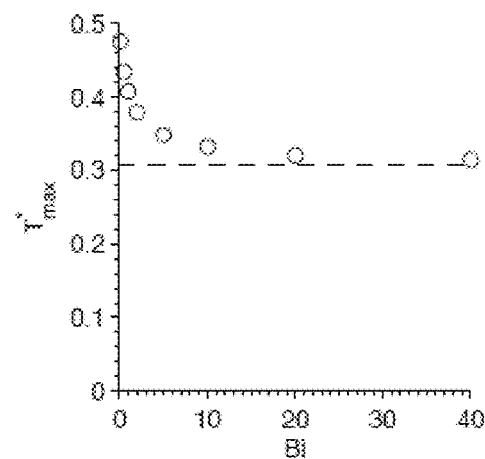
FIG. 23 shows a graph representing data related to maximum temperature reached on the heat side while varying the Biot number, with the asymptote predicted using a Dirichlet boundary condition.

As explained above, a system with a higher heat transfer coefficient (higher Biot number) removes the thermal energy more rapidly. As a result, the steady-state condition is obtained more quickly. When the Biot number becomes very large, the temperature behavior approaches the limit for a Dirichlet boundary condition imposed on the cooling side, which is the asymptote of 0.31 in FIG. 23. Performance close to the asymptotic limit can be obtained once Bi>10.

Convective Cooling with Dynamically Controlled Fluid Temperature. Similar to the examples described in connection with pulsed cooling with assist applied both as an exponential decay and as a delta function, the transient performance can be improved by dynamically controlling the rate of convective heat transfer. For the present case, the enhanced cooling is implemented as a further decrease in the temperature of the fluid, $T^*_\infty(Fo) = T^*_{\infty,o} + T^*_{\infty,assist}$.

As mentioned in connection with the examples where cooling assist is implemented as an exponential decay, the fluid temperature can be dynamically controlled by modulating the pressure of a phase-change cooling mechanism, actively or passively. The cooling assist is implemented as an exponential decay, $T^*_{\infty,assist} = T^*_{\infty,+} \exp(-aFo)$. The resulting solution suing the representative Green's function is:

$$T^*(x^*, Fo) = T^*_{3,o}(x^*, Fo) - 2T^*_{\infty,+} Bi \sum_{m=1}^{\infty} \frac{\beta_m^2 + Bi^2}{\beta_m^2 + Bi^2 + Bi} \quad (2.25)$$

$$\frac{\cos \beta_m}{\beta_m^2 - \alpha} \times \ldots \cos[\beta_m(1-x^*)]\left[e^{-aFo} - e^{-\beta_m^2 Fo}\right]$$

Figure 24A:
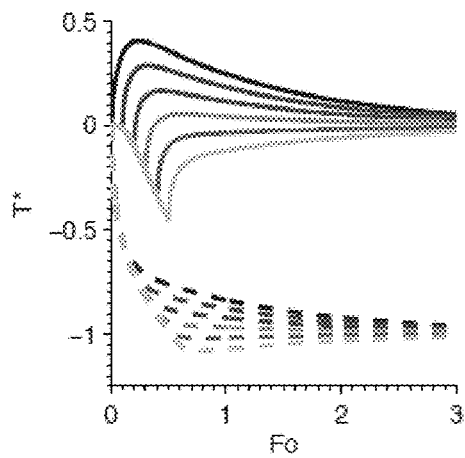
FIGS. 24A and 24B illustrate graphs showing data related to reducing the temperature overshoot by dynamically controlling the fluid with Bi=1, with the data in FIG. 24A assuming fluid temperature was constant and FIG. 24B assuming the fluid temperature was dynamically controlled.
Figure 24B:
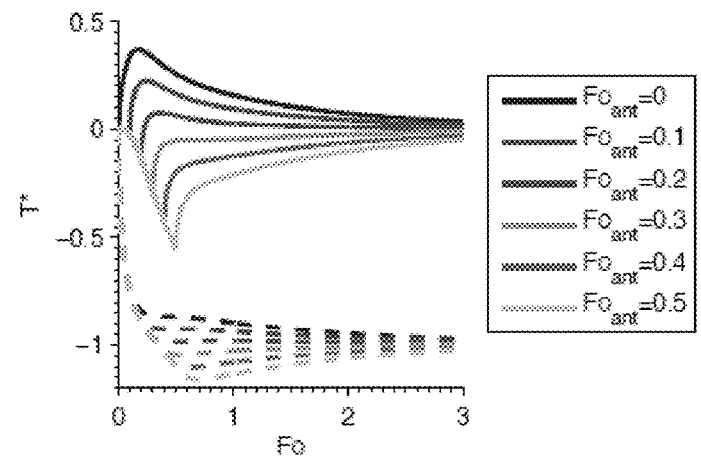

A comparison of the transient temperature with and without the transient cooling assist is displayed in FIG. 24. The Biot number is assumed to be unity and the cooling assist has a magnitude of $T^*_{\infty,+} = 0.5\, T^*_{\infty,o}$ and a decay rate of $a^{-1} = 0.2$. Both the temperature overshoot and the requisite anticipation are reduced.

The effectiveness of a system with an enhanced fluid temperature is dependent on how quickly the cooling assist is provided, analogous to the discussion on transient cooling assist for pulsed cooling where cooling assist is implemented as an exponential decay. The exponential decay constant, $a^{-1}$, must be comparable to or smaller than the rate at which the steady-state temperature is reached; otherwise, the fluid temperature is lowered for too long, causing the system to undershoot the desired value. Although theoretically the cooling assist is most effective when applied rapidly, as motivated by the examples where cooling assist is implemented as a delta function, the requisite fluid temperatures quickly become impractical as the decay rate decreases. Therefore, the rate of decay should be comparable to the expected duration of the transients, $a^{-1} \sim 0.1$.

An exception to the above exists when the Biot number is small. A low Biot number system take much longer to dissipate its thermal energy as demonstrated in the previous FIGS. 20A-20C; therefore, if the exponential decay rate is comparable to the amount of time that it takes for such a system to reach the steady state temperature, cooling assist with a large decay rate, $a^{-1} \geq 1$ may be viable.

Figure 25A:
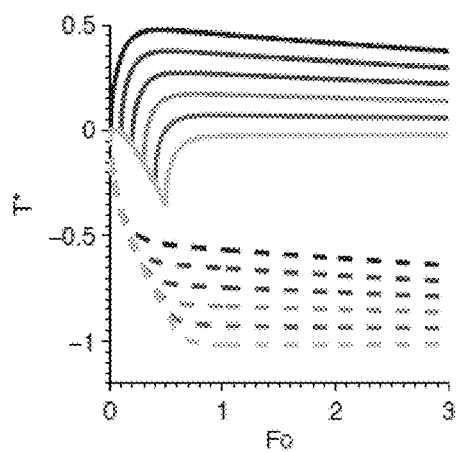
FIGS. 25A and 25B show graphs relating to the reduction of temperature overshoot by dynamically controlling the fluid temperature with Bi=0.1, with FIG. 25A assuming the fluid temperature was constant and FIG. 25B assuming the fluid temperature was time-varying to provide enhanced cooling during the start-up transients.
Figure 25B:
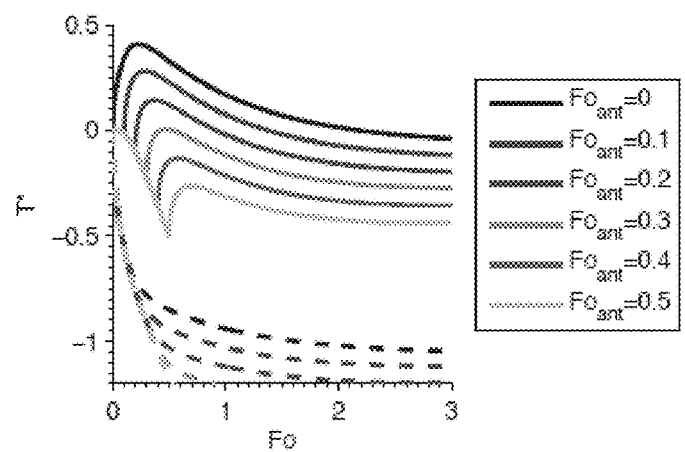

As shown in FIGS. 25A and 26B, the effect of enhanced fluid temperature was examined for a case where the fluid temperature was again initially 150% of the steady state value, but the decay rate was a−1=1. For the case without anticipation, the cooling assist forces the system to steady-state more quickly; however, with anticipation, the slow decay rate extends the transient period by causing the system to undershoot the value. Therefore, a relatively large decay rate, $a^{-1} \geq 1$, may only be beneficial when the Biot number is small and anticipating the heat load is not an option.

Convective Cooling with Delayed Fluid Temperature. In practice, convective cooling systems are likely to have reduced rather than enhanced transient performance during the start-up period. For example, when flow is initiated, the cooling fluid may be heated by the thermal mass of the manifold leading to the pulsed heat load, or it may take time for a phase-change process to chill the liquid sufficiently. Additionally, cooling solutions with an extended surface may experience delayed heat transfer if the thermal mass of the fin array is relatively large. It has been previously discussed that cooling is most effective at suppressing transients when provided quickly. The effectiveness of rapid cooling implies that delayed cooling magnifies the temperature overshoot during the start-up period.

Cases where convective cooling is delayed are represented by Equation (2.25) while setting the magnitude of the assist term to $T^*_{\infty,+} = T^*_{\infty,o}$. Under this set of conditions, the fluid temperature begins at the initial system temperature, $t^*_\infty(Fo=0)=0$, and approaches the steady state value after a delay determined by the exponential decay rate, $a^{-1}$.

If the magnitude of the delay is comparable to the duration of the transients ($a^{-1} \sim 0.1$), the performance is similar, but the overshoot and the requisite anticipation are both increased. This is demonstrated with an exponential decay rate of a−1=0.2 in FIGS. 26A and 26B.

Alternatively, the delay of the convective cooling mechanism may be large compared to the duration of the transients, $a^{-1} \geq 1$. In such cases, the overshoot was much larger and the requirement for the anticipation was no longer determined by the time constant of the device; instead, device actuation must wait until the cooling mechanism has reached the requisite temperature.

As an example, FIGS. 27A and 27B show the thermal performance for a case where $a^{-1}=5$. Eliminating the overshoot requires an anticipation of approximately three times the decay rate, $Fo_{ant}=3a^{-1}$. At this time, the entire device had nearly reached the temperature of the fluid, $T^*_{\infty,0}=-2$; meaning transient performance is analogous to cases where the cooling mechanism is always on.

Design of the Devices and Systems of the Present Disclosure. The transient temperature response resulting from a pulsed load is difficult to suppress; however, the magnitude of the temperature overshoot may not be of significant concern for a given application. The relevance of the transient performance can be ascertained by comparing the temperature sensitivity of the device to the expected magnitude of the transients by non-dimensionalizing the value, $T^*_{max} = k/T_{max}/q''_o L$, and evaluating its magnitude, as described herein.

If the above-described guideline indicates temperature overshoot is significant, i.e. $T^*_{max}<0.5$, there are several possible design considerations. Generally speaking, the objective is to dissipate the initial thermal energy of the system as quickly as possible; however, the ability to accomplish this has theoretical limits (as previously discussed). One possible technique is to anticipate the thermal load by activating the cooling device at a prior time such that $Fo_{ant} \sim 0.1$ for most systems.

The Biot number also has a strong effect on the transient temperature of the system. If the Biot number is large (Bi~10), the transient temperature overshoot is suppressed. As a result, the temperature stability is improved, as evaluated by the extrema and the temperature stability metric (Eq. (1.4). Note that increasing the Biot number is already a goal of most cooling mechanisms. A high heat transfer coefficient reduces the requisite temperature difference between the surface and the fluid, thereby decreasing the irreversibilities in the system.

The effective heat transfer coefficient can be increased using an extended surface, but if the thermal mass of the extended surface is comparable to the thermal mass of the heat spreader, the extended surface may delay the rate at which cooling is provided, analogous to convective cooling with delayed fluid temperature cases. When considering a material for an extended surface, high thermal diffusivity is desired. Similarly, high thermal diffusivity in the heat spreader will reduce the duration of the start-up transients and the requisite anticipation.

If additional improvements are required, the fluid temperature can also be dynamically controlled. Such an approach uses an initially-at-peak fluid temperature to dissipate the thermal mass, afterwards the temperature reduces to the appropriate steady state value for energy balance. Such an approach requires that the exponential decay rate of the transient cooling profile be $a^{-1} \sim 0.1$. Otherwise, the additional cooling is either insignificant (if $a^{-1}<<0.1$) or improperly timed (if $a^{-1}>>0.1$). An exception exists for systems with a small Biot number (Bi~0.1) that also cannot anticipation the heat load, in which case the transients are extended.

Unfortunately, many conventional cooling mechanisms are delayed rather than enhanced during the transient start-up period. For adequate transient temperature control, the delay of the cooling mechanism must be equivalent to—or less than—the duration of the temperature transients, $a^{-1} </\sim 0.1$. Otherwise, if the delay is relatively large (e.g., $a^{-1}>>0.1$), the ability to control the temperature is severely reduced.

Graphic Foams in Convective Cooling Applications

Graphitic foams are one option for use as the porous medium 515 as they have favorable properties for convective heat transfer; however, it will be appreciated that the porous medium 515 of the present inventive devices, systems, and methods may extend beyond solid foams to include other extended surfaces such as micro/minichannels and surface fins. Accordingly, the concepts of the following section shall apply as appropriate to these other extended surface embodiments.

Similar to porous metal foams, a large amount of surface area is exposed for convection in graphitic foams; however, the effective thermal conductivity of graphitic foams is typically six times higher at equivalent densities. The enhanced performance is a result of the high thermal conductivity (>1300 W m$^{-1}$ K$^{-1}$) of the ligaments. Here, graphitic foams were utilized to promote desorption (described in additional detail below) and flash boiling. The properties of these foams and their performance in the thermal applications of the present disclosure will now be discussed.

Thermal and Geometric Properties. The thermal conductivity of graphitic foam is the highest in a single direction. Thermal conductivity perpendicular to this direction is generally significantly less (<50%). Increased foam density results in higher thermal conductivity. While originally ranging from 40-150 W m$^{-1}$ K$^{-1}$ for a density range of 0.2-0.6 g cm$^{-3}$, commercial foams presently available can obtain 240 m$^{-1}$ K$^{-1}$ with a density of 0.68 g cm$^{-3}$ and 65% porosity (KFOAM® P1 HD).

The pore diameter of these foams is typically on the order of 100 μm. Typically, >95% of the pores are open (percentage of total void volume). However, the flow resistance is higher for graphitic foams than their metallic counterparts. The pore walls exhibit micro-cracking, but these cracks are aligned with the basal planes and consequently do not significantly impact the thermal performance. On the contrary, the presence of these cracks may increase the area available for adsorption.

Values for the internal-surface-area-to-volume ratio (i.e., internal area) are commonly given in the literature to be around 5000-50,000 m$^2$ m$^{-3}$. This value is calculated by assuming smooth pore walls and, therefore, represents the surface area available for convection. However, the term "specific surface area," as used herein, means the entire surface area of a material, including micro- and meso-pores. Specific surface area measurements, such as by BET data, show that the true value for the specific surface area is actually much greater than the values given for the internal surface area.

As previously mentioned, the flow resistance of graphitic foams is larger than for metal foams, primarily because the metal foams tend to have narrow ligaments while the graphitic foams have well-defined pore walls with smaller holes connecting adjacent pores. The Darcy-Forchheimer law is commonly implemented to calculate the pressure drop:

$$\frac{dP}{dx} = \frac{\mu}{K}u + \frac{c_f}{\sqrt{K}}\rho u^2 \tag{2.26}$$

where μ, ρ, u, K, and $c_f$, are the viscosity, density, filter velocity, permeability, and Forchheimer coefficient, respectively. The second term in Equation (2.26) accounts for inertial effects, which are generally significant in engineered applications involving these foams.

The permeability for water flowing through various graphitic foams is known to be between K=2.41×10$^{-10}$ and 6.13×10$^{-10}$ m$^2$, and the Forchheimer coefficient for water flowing through various graphitic foams is known to be between $c_f$=0.45-0.74. These properties depend on the porosity and pore diameter of the foam, which, for these values is in the ranges of 82-86% and 350-500 μm, respectively.

The Nusselt number quantifies the rate of convective heat transfer in graphitic foams. Using the geometry of the channel to calculate the Nusselt number is simpler; however, the Nusselt number is more representative of the underlying physics when normalized by the geometric properties of the foam (area factor, pore diameter, and pore-wall thickness). The former yields an fin-base heat transfer coefficient for the base, $h_{fin}$, but the latter describes the heat transfer coefficient at the pore wall, $h_{sf}$.

To obtain the Nusselt number at the pore wall, the following relationship is used for convective cooling with foam in a channel:

$$Nu = h_{sf}\frac{D_e}{k_f} = \frac{q/A_{eff}}{\Delta T_{LM}}\frac{D_e}{k_f} \tag{2.27}$$

where $k_f$ is the thermal conductivity of the fluid, $D_e$ is the equivalent solid-sphere particle diameter, q is the rate of heating at the foam base, and $A_{eff}$ is an effective area. $\Delta T_{LM}$ is the log mean temperature difference, $\Delta T_{LM}=(\Delta T_{out}-\Delta T_{in})/\log(\Delta T_{out}/\Delta T_{in})$, where the reference temperature is that of the wall. The equivalent solid-sphere particle diameter is calculated as:

$$D_e = \frac{6(1-\varepsilon)}{A_{sf}} \tag{2.28}$$

where $A_{sf}$ is the internal surface area and ε is the porosity.

The effective area of the foam, $A_{eff}$ in Equation (2.27) accounts for the fin efficiency of the porous medium by treating the walls as microfins. The resulting effective area is: $A_{eff}=\varepsilon A_{base}+\eta_f A_{sf} V_{foam}$, where $A_{base}$ is the area of the heated wall to which the foam is adhered and $V_{foam}$ is the total volume of the porous medium.

The expression for fin efficiency is:

$$\eta_f = \frac{\tanh\left(\sqrt{2h_{sf}/k_s L_{fin}}\, L_s\right)}{\sqrt{2h_{sf}/k_s L_{fin}}\, L_s} \tag{2.29}$$

where $k_s$ is the thermal conductivity of the foam ligaments, $L_{fin}$ is the equivalent fin thickness, and $L_s$ is the height of the foam structure. The equivalent fin thickness is determined using the Taylor model:

$$L_{fin} = \frac{(1-\varepsilon)}{\varepsilon}\sqrt{\frac{12K}{\varepsilon}} \tag{2.30}$$

Using the above derivation, correlations for the Nusselt number have been reported in the literature. The correlation for the Nusselt number takes the form:

$$Nu = CRe^m Pr^n \tag{2.31}$$

For the variant of POCOFoam® used in the above work, which had a porosity of 82%, a pore diameter of 500 μm, and an effective thermal conductivity of 120 W m$^{-1}$ K$^{-1}$, the following values for the above correlation were reported: C=0.018, m=0.27, and n=0.33.

Graphitic Foams in Boiling Heat Transfer. To characterize the behavior of boiling in porous medium the Bond (Bo), capillary (Ca), and Grashof (Gr) numbers are traditionally applied. The Bond number (Bo~0.1) indicates the surface tension inhibits bubble departure; as a result, working fluids with lower surface tension are suspected to be preferable for pool boiling.

Given the large internal surface area and conductivity of the graphitic foams, the fin-base heat transfer coefficient, $h_{fin}$, is relatively low for both single-phase convection and pool-boiling. This is the result of the relatively low values for the pore-wall heat transfer coefficient. The low value of the pore-wall heat transfer co-efficient is attributed to the predominance of surface tension, which inhibits local convection near the pore wall.

Analysis of Graphitic Foam as an Extended Surface for Flash Boiling. To establish a performance baseline for comparison to flash boiling, the standards known in the art was compared to the case of liquid methanol flowing through the graphitic foam, KFOAM® P1. However, this analysis accounts for neither the additional flow resistance expected from two-phase flow, nor the effect of micro-convection (i.e., enhanced convective heat transfer).

The μ properties of graphitic foam KFOAM® P1 are similar to POCOFoam®. The graphitic foam is approximately 75% porous, and the average pore diameter is 300 μm. A conventional geometric model indicates the internal surface area is approximately 9000 m$^2$ m$^{-3}$. The effective thermal conductivity is 120 W m$^{-1}$ K. The thermal conductivity of the solid phase is not reported, but the ligaments of similar foams have a conductivity of 1300 W m$^{-1}$ K.

The porous medium is assumed to extend far from the surface, such that it acts an infinitely long fin. To simplify the analysis, the temperature is assumed to be uniform both orthogonal and parallel to the heated surface. Under these conditions, the porous medium is treated as a 1-dimensional fin, for which the temperature distribution is:

$$\frac{T(x) - T_\infty}{T_b - T_\infty} = \exp\left(-\sqrt{\frac{h_{sf}}{k_s L_{fin}}} x\right) \quad (2.32)$$

where $T_l$ is the constant liquid temperature and $T_b$ is the temperature at the base of the foam. The effective fin thickness, $L_{fin}$, is calculated using Equation (2.30), where the permeability is assumed to be the same as reported for POCOFoam®, K=6.13×10$^{-10}$ m$^2$. The corresponding heat flux at the base of the foam is calculated as:

$$q'' = q''_{fin} + q''_b = (h_{sf} A_{sf}^2 k_s L_{fin} + \varepsilon h_{sf})(T_b - T_\infty) \quad (2.33)$$

Figure 28A:
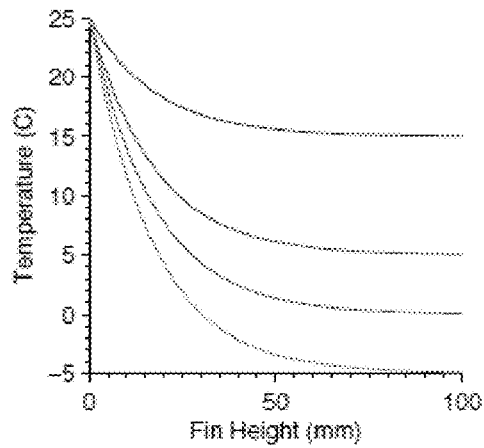
FIGS. 28A and 28B show graphs of the performance of an infinite fin for liquid methanol assuming the base is 25° C., with FIG. 28A showing the local temperature for the extended surface and FIG. 28B showing the net heat flux at the base of the extended surface.
Figure 28B:
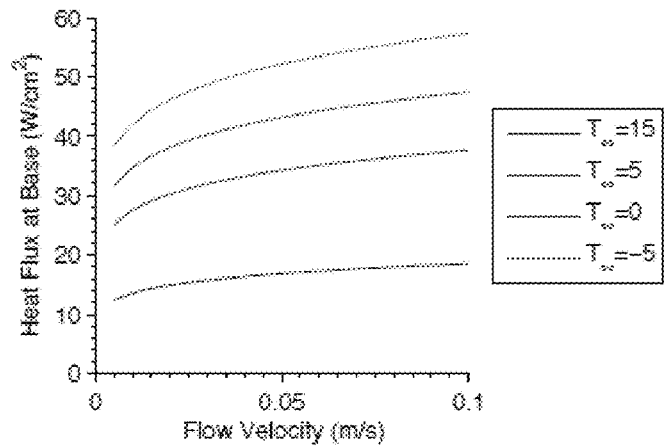

Using the Nusselt number correlation in Equation (2.27), the heat transfer coefficient at the pore wall, $h_{sf}$, is determined. The temperature at the base is assumed to be 25° C. and the temperature of the liquid is varied. Using the range of valid Reynolds numbers for Equation (2.27), Re=1-12, the base heat flux is plotted against flow velocity in FIG. 28B. In FIG. 28A, the temperature profile is plotted at the maximum flow velocity, u=0.1 m/s.

In this scenario, the temperature of the foam approaches the fluid temperature once the foam height is greater than 5 cm, which is an order of magnitude larger than the foam height in the experiments (5 mm). The relatively long active length of the extended surface is due to the relatively low values for the pore-wall heat transfer coefficient (50-150 W m$^{-2}$ K$^{-1}$).

To make the results for liquid convection cooling more comparable to the flash boiling experimental setup, the height of the foam, $L_h$, is now assumed to be 5 mm. Due to the relatively small surface area available, the upper surface of the foam is assumed to be adiabatic. Due to the imposed constraint on height, the temperature profile of the foam is:

$$\frac{T(x) - T_\infty}{T_b - T_\infty} = \frac{\cosh\left[\sqrt{\frac{h_{sf}}{k_s L_{fin}}}(x - L_h)\right]}{\cosh\left[\sqrt{\frac{h_{sf}}{k_s L_{fin}}} L_h\right]} \quad (2.34)$$

and the resulting heat flux at the base is:

$$q'' = \quad (2.35)$$
$$q''_{fin} + q''_h = \left(\sqrt{h_{sf} A_{sf}^2 k_s L_{fin}} \tanh\left(\sqrt{\frac{h_{sf}}{k_s L_{fin}}} L_h\right) + \varepsilon h_{sf}\right)(T_b - T_{(x)})$$

Figure 29A:
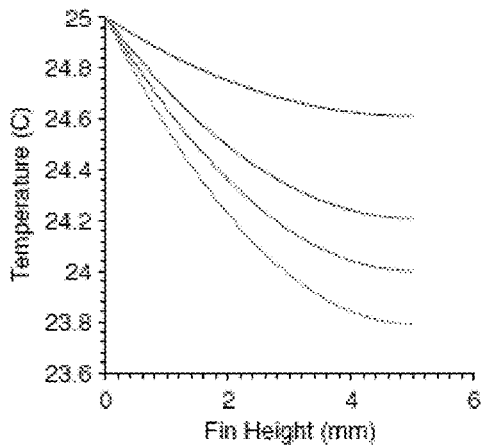
FIGS. 29A and 29B show graphs of the performance of a 5 mm fin for liquid methanol assuming the base is 25° C., with FIG. 29A showing the local temperature for the extended surface and FIG. 29B showing the net heat flux at the base of the extended surface.
Figure 29B:
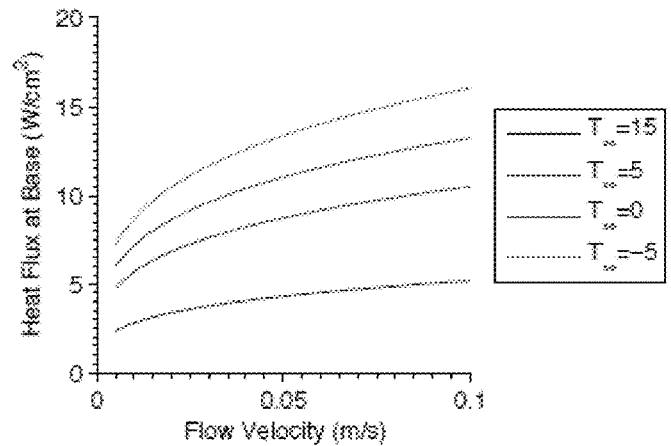

The resulting temperature and heat flux under the same conditions are shown in FIGS. 29A and 29B. Because the foam is much shorter than the active length (≈50 mm) in FIGS. 28A and 28B, the heat flux is reduced considerably, and the porous medium does not reach the liquid temperature.

Surface Engineering for Rapid Desorption Cooling

The enthalpy of adsorption is used to assist heat transfer processes, such as in adsorption heat pumps/engines. To increase the effectiveness of such systems, adsorbents are commonly engineered to maximize the amount of adsorption per unit weight and/or volume; consequently, the materials are generally beds of powders or porous media with a microporous (<2 nm) structure, which have very high surface area. However, a traditional adsorbent structure is unlikely to be optimal for use in conjunction with high-heat-flux liquid-vapor phase-change cooling. Generally, microporous materials have relatively low thermal conductivity and poor properties for the convection and diffusion of mass.

The material properties relevant to adsorption must be examined in order to design and/or identify an optimal porous medium appropriate for flash-boiling. The amount of adsorption is dependent on the surface area available; therefore, the net desorption energy is the product of the desorption enthalpy and the total area available in the porous medium. Increasing either the desorption enthalpy or the surface area increases the amount of cooling obtained from this mechanism, but both have limits before impeding performance.

Engineering the Adsorptive Bond for a Thermal Process. Adsorption is categorized as either chemisorption or physisorption. In chemisorption, the electronic energy levels of the adsorbate-adsorbent pair are rearranged. Typically, these bonds are strongly energetically favored, but difficult to reverse due to the high binding energy. In physisorption, the binding of the adsorbate molecule to the adsorbent is solely via van der Waals interactions. Due to the nature of van der Waals bonding, the binding energies are usually relatively small and, as such, the bonds are easier to break.

For applications focused on the thermal energy transport, the energy of the adsorbent-adsorbate bond may optimally be comparable to the thermal energy of the system. If the bond is relatively weak, little adsorption may occur. If the bond is too strong, then varying the temperature and pressure of the system may not induce a significant amount of desorption. The optimal value of the adsorption enthalpy depends on the anticipated temperature and pressure through which the system is required to cycle. Typically, physisorption has the appropriate binding energy for thermal applications and is considered exclusively in this work.

Energy and Rate of the Adsorption Process. The physical processes governing adsorption will first be addressed in order to characterize the rate and magnitude of desorption cooling. Consider a single adsorbate molecule that is interacting with an infinite, crystalline adsorbent surface without defects. Due to van der Waals forces, the molecule will experience a potential well where the attractive and repulsive interactions with the surface are balanced. The depth of this potential well is the binding energy, $u_o$.

The adsorbate molecule is comparable in size to the lattice of the adsorbent; as a result, the binding energy varies when the molecule is moved parallel to the surface. Locations where adsorption is most energetically favorable are referred to as adsorption sites.

The adsorption process is dependent on the temperature of the system. If the thermal energy is very small compared to the difference in binding energy between adsorption sites ($k_bT \ll \Delta u_o$), the adsorbate molecule is bound to a specific adsorption site. Assuming the surface is crystalline, the adsorbed phase forms a two-dimensional crystal on the adsorbent surface. If the thermal energy is comparable to the variation in binding energy along the surface of the adsorbent, the adsorbate molecule is mobile and, in the limit of relatively high temperature ($k_bT \gg \Delta u_o$), can be modeled as a two-dimensional gas.

Similar to a liquid-vapor interface, the population of an adsorbed phase in equilibrium with the vapor phase is determined by a rate balance of molecules entering and leaving the adsorbed phase. In a simple compressible system, the rate at which molecules leave the adsorbed phase is determined by the temperature of the system. More specifically, the greater the thermal energy, kT, compared to the binding energy, $u_0$, the more quickly adsorbate molecules leave the surface. Conversely, the pressure of the system affects the population of the adsorbed phase governing the rate at which molecules strike the surface of the adsorbent, and thereby have the opportunity to become absorbed (referred to as the sticking rate).

The adsorption and desorption rates are comparable to the rate at which molecules strike the surface; therefore, the process is typically limited by the local thermodynamic state rather than molecular exchange. For example, adsorption in a microporous adsorbent is often limited by diffusion. The expected rate of adsorption and desorption in a non-equilibrium liquid-vapor mixture is discussed in further detail below.

In an engineering system, the adsorbent surface is rarely a pristine crystal. Features such as grain boundaries and functional groups influence the adsorbed phase. Generally, adsorption to such features is more energetically favorable; as result, adsorption at low pressures predominately occurs at these sites until they are entirely occupied and only the pristine surface remains. When the adsorbent is microporous, the adsorbed molecule may be close enough to interact with multiple surfaces, resulting in higher the binding energy.

Additionally, when a larger fraction of the surface becomes covered, interactions between the adsorbate molecules (i.e., adsorbate-adsorbate interactions) can become significant. When the adsorbate molecule is polar, such as for water and methanol, the adsorbate-adsorbate interactions are more influential. Adsorbate-adsorbate interactions result in uniquely impact methanol adsorption isotherms.

The binding energy is closely related to the adsorption enthalpy. Since results obtained from density functional theory (DFT) yield the binding energy rather than the adsorption enthalpy, comparing computational results to experimental values requires the use of the equation:

$$\Delta h = -u_o + \Delta ZPE + \Delta e_{th} - kT \quad (3.1)$$

The first term, $u_o$, is the binding energy, which has been discussed previously. The second term, $\Delta ZPE$, is the zero-point-energy associated with the bond, which is generally small compared to the other terms. The third term, $\Delta e_{th}$, results from a change in the translational, vibration, and rotational degrees of freedom of the molecule upon adsorption. The final term, kT, is due to the change in volume between the gas and the adsorbed phase (since $\Delta h = \Delta u + p\Delta v$), where the gas phase is assumed to be an ideal gas and the volume of the adsorbed phase is negligible.

To further explain the second term in the above equation, $\Delta e_{th}$, consider a monatomic adsorbed phase that behaves as a two-dimensional gas. In this case, the molecule loses one degree of translational freedom and gains a vibrational energy level, both due to the new constraint on movement perpendicular to the adsorbent surface.

Assuming both modes are fully excited, the change in thermal energy is $\Delta e_{th} = -1 \times \frac{1}{2}kT + 1 \times kT$, where the first term is due to the loss of the translational mode and the second term is the gained vibrational mode. Less-idealized cases (polyatomic molecule, adsorbate-adsorbate interactions, $kT \approx \Delta u_o$) require a more detailed analysis, such as by the partition function.

The enthalpy change due to the interaction between the adsorbate and the adsorbent is experimentally derived by the either the adsorption enthalpy, commonly obtained via adsorption isotherms, or the wetting enthalpy (heat of immersion) obtained by immersion calorimetry. Adsorption enthalpy is associated with a transition from the gas to the adsorbed phase and is typically reported per unit of adsorbate and is a function of surface coverage. Adsorption enthalpy is usually the highest at low coverage and approaches the enthalpy of vaporization after the first monolayer is formed. The enthalpy of immersion is associated with a transition from the liquid to the adsorbed phase and is typically reported per unit area of adsorbent. The quantity is the total energy change resulting from the formation of the adsorbed layer.

Surface Analysis via Isotherms. Adsorption isotherms are a standard for characterizing the surface of various common adsorbents. By analyzing the low- and high-pressure trends of an isotherm, typically using nitrogen, geometric information about the sample can be determined, such as the approximate surface area, micropore volume, and mesopore volume. The chemical nature of the surface, such as bond polarity, can be determined by comparing the low-pressure uptake to a reference material. Isotherms with the intended adsorbate (e.g., methanol) yield similar information about the interactions with the adsorbent, as well as the isosteric heat of adsorption.

Surface Area via Nitrogen Isotherms: BET Method. The technique pioneered by Brunauer, Emmet and Teller is broadly used for determining the surface area of a wide range of materials. BET theory is an extension of Langmuir theory that, instead of accounting for adsorption of only a single molecular layer, allows for multilayer growth of the adsorbate at the interface. The theory has various shortcomings when describing adsorption; however, the BET method is still very useful as an empirical procedure.

The BET method is universally applicable for surface characterization primarily because after the first monolayer is formed, the unique chemical nature of the surface is screened out. The subsequent range of multilayer adsorption depends mostly on the properties of the adsorbate.

Figure 30A:
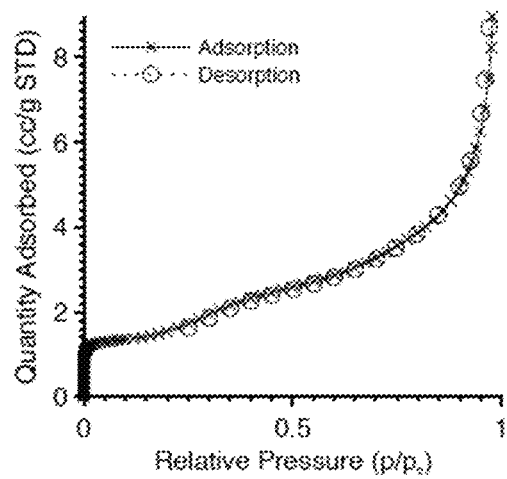
FIGS. 30A and 30B illustrate graphical data obtained on the ASAP2000 for a reference absorbent, Carbopack F, with FIG. 30A showing a nitrogen isotherm at 77.4K and FIG. 30B showing a BET plot with linear fit based on the data points indicated by the arrow.

When applying the BET method, the surface area is determined by applying the data from a standard nitrogen isotherm to the BET equation:

$$\frac{p/p_o}{n(1 - p/p_o)} = \frac{1}{n_m C} + \frac{C-1}{n_m C}\left(\frac{p}{p_o}\right) \quad (3.2)$$

in which $p_o$ is the saturation pressure, n is the surface coverage, $n_m$ is the BET monolayer capacity, and C is derived from the net energy of adsorption in BET theory. The relative pressure, $p/p_o$, and the amount adsorbed, n, are experimental quantities known from the obtained isotherm. In the form shown, the predicted trend of BET theory is recast as a linear equation with $1/n_mC$ as the intercept and $(C-1)/n_mC$ as the slope. To determine these parameters, the experimental data is often displayed in a BET plot. A nitrogen isotherm and the corresponding BET analysis are shown in FIGS. 30A and 30B.

Figure 30B:
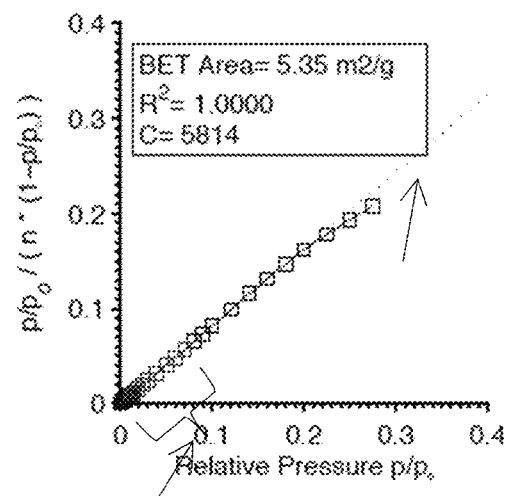

Surfaces with significant multilayer adsorption (type II and type IV isotherms), typically have a linear BET plot, as shown in FIG. 30B. The values $n_m$ and C are determined by fitting the BET plot to a subset of the data in the range of 0.01-0.35 relative pressure. The range is generally chosen to match where the adsorbed phase transitions from single-layer to multilayer growth. The value for nm is used to estimate the surface area of the adsorbent, conventionally by assuming a molecular cross-sectional area of 0.162 $n_m^2$ for nitrogen.

Figure 31A:
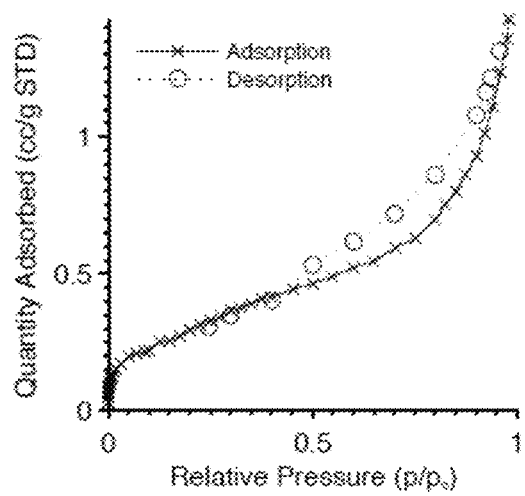
FIGS. 31A and 31B show plots of data obtained on the ASAP2000 for a petal-decorated carbon foam (sample B-3), with FIG. 31A showing data for nitrogen isotherm at 77.4K and FIG. 31B showing a BET plot with linear fit based on the initial data points indicated by the arrow.
Figure 31B:
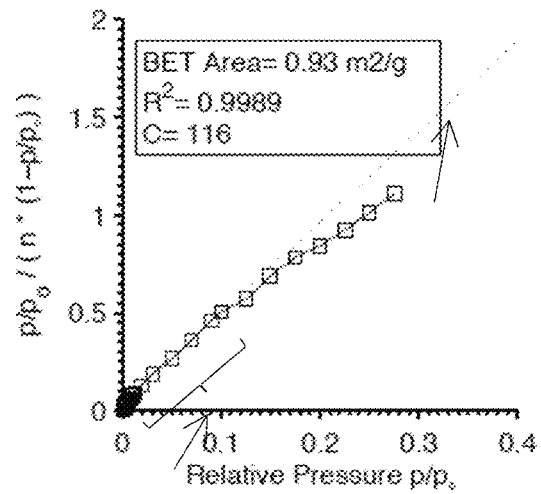

Since the BET plot may not be linear for the entire range from $0.01p/p_o$ to $0.35p/p_o$, arbitrarily fitting to the whole range is not recommended. The appropriate linear region of the plot must be chosen; however, as in the isotherm shown in FIG. 31B, multiple linear regions may exist. If the linear fit of FIG. 31B was instead applied to the relative pressure range 0.2-0.3, the area would be calculated to be 1.25 m$^2$ g$^{-1}$, which is over 30% larger than the given value.

To improve repeatability, selection criteria has been suggested to determine the appropriate range to use for the BET plot. These criteria ensure the fit obtained by the chosen range in the BET plot is valid. Using the criteria mentioned, the proper range in FIG. 31B was determined to be the points indicated by the arrow with the fit shown as the dashed line indicated by the arrow.

Caution is advised when dealing with values of C outside of the approximate range of 50-150. This value is proportional to the strength of the adsorbent-adsorbate bond. Therefore, at low values of C, the adsorption is predicted to be relatively weak, meaning the growth of the multilayer, which is the basis for BET theory, may be occurring before completion of the monolayer. This set of conditions compromises the surface-independent nature of the measurement. Meanwhile high values of C indicate the measurement could be dominated by micropore-filling. Exceptions to the stated range exist, such as the non-porous reference material in FIGS. 30A, for which C is almost 6000.

Surface Area via Nitrogen Isotherms: $\alpha_s$ Method. While the BET method is the standard for surface area measurements, the results can be confirmed by consulting with a second method to confirm the surface area estimates. The $\alpha_s$ method determines the surface area of a sample by comparing the obtained isotherm to that of a non-porous reference material with known surface area and the same surface chemistry.

Figure 32:
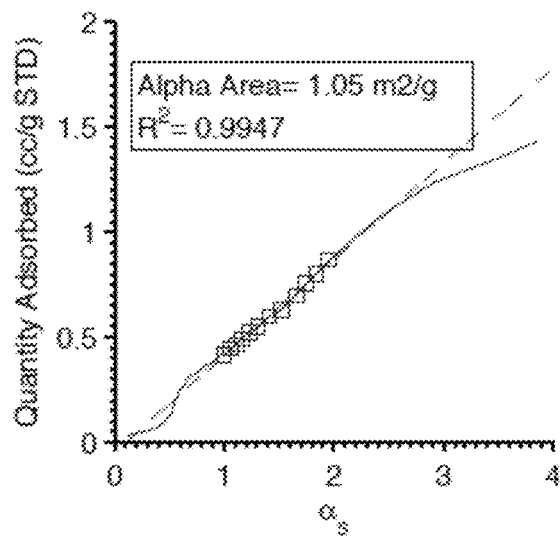
FIG. 32 shows an alpha plot obtained on the ASAP2000 for a petal-decorated carbon foam.

To obtain $\alpha_s$, the surface coverage on the reference sample is normalized by its value when the relative pressure is 0.4: $\alpha_s(p/p_o) = n_{ref}(p/p_o)/n_{ref}(0.4)$. The surface coverage of the sample, $n(p/p_o)$ is then plotted against $\alpha_s(p/p_o)$ at equivalent values of relative pressure. The resulting plot is shown in FIG. 32 using the petal-decorated carbon foam (FIGS. 31A and 31B) as the sample and Carbopack F (FIGS. 30A and 30B), as the reference material.

By obtaining the slope of the linear region, the area of the sample can be calculated as:

$$A_\alpha = \frac{A_{ref}}{n_{ref}(0.4)} \frac{\Delta n}{\Delta \alpha_s} \quad (3.3)$$

Using this approach, the results of BET analysis can be confirmed. The area obtained by the $\alpha_s$ method for the petal-decorated foam is near the BET area shown in FIGS. 31A and 31B. The agreement between the values confirms both the selected pressure range in the BET analysis and the validity of the experimental data presented herein.

Pore Structure Analysis via Nitrogen Isotherms. The shape of the nitrogen isotherm provides information on the nature of the pore structure. Macropores (>50 nm) are not expected to alter the shape of the isotherm. Micropores (<2 nm) result in increased adsorption at low pressure, and are typically evaluated using $\alpha_s$ plots to compare sample uptake to a non-porous reference material. Mesopores (2-50 nm) affect nitrogen isotherms at high relative pressure ($p/p_o$>0.4) and typically exhibit hysteresis.

Relevant to the present disclosure, H3 and H4 hysteresis both indicate the presence of slit-shaped pores. The limit at high pressure seen in H4 hysteresis is representative of a system also containing micropores. Although methods exist for analyzing the size of mesopores using the hysteresis, this practice is not recommended for samples with type H3 hysteresis. Typically, hysteresis is caused by capillary condensation, in which case, the curves are expected to converge by $p/p_o \approx 0.42$. Hysteresis below this value indicates the pore structure changed during the measurement, such as in a loose powder.

Isosteric Enthalpy of Adsorption. Assuming the adsorption process occurs at constant temperature, pressure, and surface area, the isosteric enthalpy of adsorption can be derived using the expression:

$$\Delta h = -RT^2 \left[\frac{\partial \ln p}{\partial T}\right]_n = R \left[\frac{\partial \ln p}{\partial (1/T)}\right]_n \quad (3.4)$$

The isosteric enthalpy of adsorption defines the energy change at constant surface coverage. Experimentally, this quantity is determined by obtaining isotherms at multiple temperatures and integrating Equation (3.4) to obtain:

$$\Delta h = -R \frac{T_1 T_2}{T_2 - T_1} \ln \frac{p_2}{p_1} \quad (3.5)$$

Adsorption of Methanol on Graphitic Materials. The methanol molecule is well-suited for adsorption applications. The small size of the molecule allows denser surface configurations as well as the filling of smaller pores. Additionally, the hydroxyl group results in dipole-dipole and dipole-induced-dipole bonding, each of which have higher binding energies. The adsorption enthalpy for methanol on graphite is the combination of the adsorbate-adsorbate and the adsorbate-adsorbent interactions. Isotherm models that do not account for polarity, such as the Langmuir and BET models, are not valid for describing the adsorption of methanol.

Figure 33:
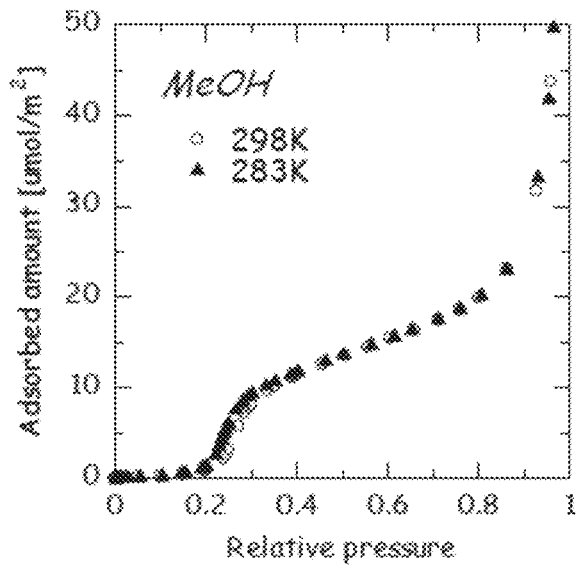
FIG. 33 shows a plot of adsorption isotherms for methanol on Carbopack F.

Studies have been done featuring both experimental and computational data examining the surface interactions of methanol on a highly graphitized carbon black. Such studies displayed delayed uptake at about 0.2 relative pressure, which is common for methanol isotherms on graphitic surfaces. The numerical solution was obtained by a grand canonical Monte Carlo method. The results reveal bonding configurations and separate the contributions of adsorbate-adsorbate and adsorbate-adsorbent interactions to the isosteric enthalpy, as shown in FIG. 33. The adsorbate-adsorbate interactions account for a large fraction of the overall isosteric enthalpy, which is not much greater than the latent heat of vaporization. This lack of strong interactions with the surface is due to the inert nature of the basal plane of graphite, and is partially the reason for the delayed uptake exhibited in methanol isotherms.

Studies have also been done with high-resolution methanol isotherms on a graphitic reference material, Carbopack F, to determine the isosteric heat of adsorption. The isosteric heat appears to resolve the enthalpy associated with various interactions, including those with grain boundaries and other adsorbate molecules, as the adsorbed phase grows. The data appears to be uniquely reliable at low pressure and coverage. The surface chemistry of carbon can be modified to increase adsorbate-adsorbent interactions.

Surface Characterization of Hierarchical Carbon Foams via Nitrogen Isotherms. In order to obtain appreciable desorption cooling during a flash-boiling event, the surface area of the foam must by increased significantly while maintaining an open macroporous structure. To achieve this goal, a hierarchical porous structure is grown within the graphitic foams via the roll-to-roll microwave plasma-enhanced chemical vapor deposition system. To evaluate the area of the unmodified graphitic foams as well as that of the hierarchical foams, nitrogen isotherms are employed to measure the specific surface area of the samples.

As previously mentioned, the internal surface area, $A_{sf}$, is determined assuming smooth pore walls and is the appropriate value to use for convective heat transfer; however, it is not necessarily representative of the specific surface area, $A_{sf}$, which will includes the area of the slit-shaped pores along the wall of the foam due to microcracking.

It is known to utilize microwave plasma enhanced chemical vapor deposition to fabricate carbon nanotubes on a graphitic carbon foam. In at least one embodiment, the nanotubes may have an estimated diameter of 15 nm and length of 20 µm and to be grown uniformly inside the porous medium. The hierarchical pore structure results in a specific surface area of approximately 3 $m^2$ $g^{-1}$. The reported isotherms were type II with no visible hysteresis, indicating that sample surface is not dominated by micropores or mesopores.

Fabrication of Petal-Decorated Carbon Foam. Similar to above, it is also known to grow graphitic petals on the pore walls of the carbon foam. In at least one embodiment, the substrate for growth may be KFOAM® P1 graphitic foam shaped into a 50 mm by 10 mm by 5 mm blocks that matched the internal dimensions of the flash chamber (e.g., inner chamber 514).

The petal-decorated samples may be fabricated at varying growth conditions, shown in Table 1.1. For validation, three experimental series were performed on different run dates (A, B, & C). In each run, the foam block was one of the electrodes in the roll-to-roll plasma enhanced chemical vapor deposition system. Significant petal growth occurred near the outer surfaces of the foam block, forming what appear to be vertical columns of graphitic petals. SEM images indicated the growth results in a mesoporous network (~10 nm). The density of petals was larger near the ends of the 50 mm length of the foam block. However, growth into the foam beyond the first pore diameter was decreased, resulting in isolated graphitic petals directly on the surface of the pore walls. Near the center of the foam thickness (2.5 mm from the surface), no petal growth was observed.

TABLE 1.1

Petal growth conditions.

| Sample | Power W | Pressure mbar | H2 (%) | CH4 (%) | N2 (%) | O2 (%) | Ar (%) | Growth time (min) |
|---|---|---|---|---|---|---|---|---|
| A-1 | 750 | 20 | 50 | 30 | 0 | 5 | 15 | 30 |
| B-1 | 550 | 25 | 30 | 30 | 5 | 5 | 30 | 40 |
| B-2 | 650 | 25 | 30 | 30 | 5 | 5 | 30 | 40 |
| B-3 | 750 | 25 | 30 | 30 | 5 | 5 | 30 | 40 |
| C-1 | 350 | 20 | 30 | 30 | 5 | 5 | 30 | 20 |
| C-2 | 400 | 20 | 30 | 30 | 5 | 5 | 30 | 20 |
| C-3 | 450 | 20 | 30 | 30 | 5 | 5 | 30 | 20 |
| C-4 | 500 | 20 | 30 | 30 | 5 | 5 | 30 | 20 |
| C-5 | 450 | 20 | 40 | 40 | 0 | 0 | 20 | 20 |

Preparations for Low-Surface-Area Nitrogen Isotherms. Obtaining nitrogen isotherms of samples with relatively low surface area (<1 $m^2$/g) is particularly challenging. The amount of nitrogen adsorbed to a surface is determined by comparing the amount of adsorbate dosed by the instrument to the amount that remains in the gas state (i.e., the free space). If the total surface area of a sample is small, the surface coverage becomes comparable to errors in the calculations associated with the free space, thereby making the adsorbed phase more difficult to detect. More sample can be added to the tube to correct for this, but in the case of super-macroporous carbon foams, the volume of the tube becomes a constraint. Free-space errors typically cause the desorption isotherm to diverge from the adsorption isotherm in an unexpected manner.

To reduce free-space error, care was taken to fill the liquid nitrogen dewar to the same level for every run and to optimize the conditions of the experiment. The chosen value for the non-ideality constant was $5.7 \times 10^{-5}$. The surface area was assessed by assuming a molecular cross-sectional area of 0.162 $nm^2$ for nitrogen. Samples were degassed for at least 6 h at 200° C. in high vacuum.

Although not employed in this work, alternate techniques for obtaining higher quality data for low surface area samples are available. These include at least using krypton as the adsorbate and enhanced free-space analysis (e.g., Micromertics Gemini Analysis).

The nitrogen isotherms were obtained using a Micromeritics ASAP2000 instrument. A reference sample, Carbopack F, was used to compare the instrument performance at high and low total surface area. This procedure determined the accuracy of the instrument when total coverage was low. The first experiment used 1.056 g of the reference sample, which has a specific surface area of 4.9-6.2 $m^2$ $g^{-1}$. The results are shown in Table 1.2. The $\alpha_s$ analysis was performed using published isotherm data.

TABLE 1.2

Surface area measurements of the reference sample, demonstrating the instrument accuracy on low-surface-area samples.

| Run | Mass (g) | Tot. Area ($m^2$) | BET: Area ($m^2g^{-1}$) | BET: C | $\alpha_S$: Area ($m^2g^{-1}$) |
|---|---|---|---|---|---|
| Ref-1 | 1.056 | 5.65 | 5.35 | 5814 | 5.44 |
| Ref-2 | 0.108 | 0.58 | 7.08 | 605 | 7.23 |

For the first run on Carbopack F, the $\alpha_s$ plot was very linear until surface coverage is in excess of 5.5 cc/g, which means the isotherm is in strong agreement with the published reference data until the relative pressure is above 0.9. Since this upper pressure limit is well above the range relevant for surface area analysis, the system will perform very well when the sample has at least 5 m² of total area. Moreover, the BET and $\alpha_s$ areas derived from the obtained isotherm are in agreement. Since the quality appears to be high, this isotherm obtained on the ASAP2000 with 1.056 g of Carbopack F is used as the reference sample for all future runs on the same instrument. The second isotherm on Carbopack F reduced the sample quantity to 0.108 g, decreasing the total surface area by an order of magnitude. As a result, the isotherm appears to be of lesser quality. A noticeable free space error develops, visible by the erroneous drop of the desorption curve below that of adsorption. Also, higher coverages are predicted, resulting in an overestimation of the BET surface area by 32%. The value for C is also reduced considerably. The $\alpha_s$ area also over-predicts the surface area, such that the BET and $\alpha_s$ areas are self-consistent.

These reference isotherms indicate that (1) area measurements have reduced reliability (±50%) when the total sample area is ~0.1 m², (2) comparison of the BET and as areas may not detect this discrepancy, and (3) decreased values of C and visible free-space error may indicate when measurement fidelity is reduced.

Surface Analysis of Unmodified and Petal-Decorated Carbon Foams. Nitrogen isotherms were obtained on the unmodified graphitic foam as well as the petal-decorated samples. The isotherms were all type II. The petal-decorated carbon foam samples seem to have H3 hysteresis. Surface area was determined via BET and $\alpha_s$ analysis, and the results are shown in Table 1.3. The $\alpha_s$ plots for the petal decorated samples indicate that the resultant pore structure is not dominated by micropores. The BET area matched the $\alpha_s$ area and the criteria recommended by Roquerol best over the relative pressure range of 0.01-0.1 To keep results consistent, this range was used for all samples. Using 0.1-0.3 for the BET range typically yielded higher values for the BET area, but had poor agreement with the $\alpha_s$ area and abnormally low values for C (<20).

TABLE 1.3

BET and $\alpha_s$ data on petal-decorated and unmodified graphitic foam.

| Sample | Tot. Area (m²) | BET: Area (m²g⁻¹) | BET: C | $\alpha_s$: Area (m²g⁻¹) |
|---|---|---|---|---|
| CF | 0.3 | 32 | 49 | .35 |
| A-1 | 0.4 | 0.7 | 45 | 0.87 |
| A-1* | 0.2 | 2.2 | 20 | 2.4 |
| B-1 | 0.5 | 0.93 | 116 | 1.02 |
| B-2 | 0.7 | 0.89 | 289 | 0.90 |
| B-3 | 0.4 | 0.75 | 73 | 0.57 |
| C-1 | 0.4 | 0.37 | 90 | 0.39 |
| C-2 | 0.3 | 0.36 | 52 | 0.42 |
| C-3 | 0.4 | 0.55 | 26 | 0.51 |
| C-4 | 0.4 | 0.48 | 85 | 0.59 |
| C-5 | 0.3 | 0.37 | 90 | 0.39 |

As a measure of the expected accuracy of each measurement, the total sample area for each nitrogen isotherm is also shown in Table 1.3. All samples had a total area near 0.5 m²; therefore, the accuracy is expected to be comparable to that determined by the reference sample. As a result, the true surface area may be approximately 33% lower than the values shown. While the accuracy is no better than ±33%, repeat runs performed on the unmodified graphitic foam show that the precision is sufficient for qualitative comparison (±10%).

The data indicate that the specific surface area, $A_{sa}$, of unmodified graphitic carbon foam is higher than the internal surface area, $A_{sf}$, which is assumes smooth pore walls. The contribution of the 300 µm-diameter pore walls can be calculated as: $A_s/\rho_{eff}$ where the effective density, $\rho_{eff}$, of KFOAM P1 graphitic foam is 0.45 g cm⁻³. Given that KFOAM is approximately 80% porous and the average pore diameter is 300 µm, the geometric model of conventional reference indicates the internal surface area will be approximately 9000 m² m⁻³. This gives a mass-weighted value for the internal surface area of 0.02 m² g⁻¹. The disparity between this calculation and the value in Table 1.3 indicates that the microcracks within the graphitic foam increase the surface area of the foam by approximately one order of magnitude.

The sample from the first run date, A-1, approximately doubled the surface area of the entire foam block; however, as previously noted, the density of petals was larger near the ends of the 50 mm length of the foam block. The second isotherm analysis for the same sample, denoted by the asterisk, used only the portion of the sample nearest the end. The specific surface area at this location is much higher than the rest of the foam; however, since the total sample area has been reduced, the measurement may not have high accuracy.

The objective was to obtain uniform growth throughout the foam, in order to obtain appreciable surface area for desorption cooling. The remaining samples used the bulk of the foam, rather than just the ends, in order to be representative of the specific surface area of the entire sample. To find the best run conditions for petal growth, the power was parametrically increased (550, 650, and 750 W) during the second series (B-1, B-2, and B-3) while keeping the other parameters constant. The surface areas in Table 1.3 indicated that better growth occurred at lower power (550 W).

Because the above indicates surface area increased with decreasing power, the third test series (C-1 through C-5) probed growth in a lower power range (350-500 W) with half of the growth time (20 min). Maximum surface area was found at the higher plasma power, namely at 450 and 500 W, but disagreement between the BET and $\alpha_s$ areas for sample C-4 obfuscates which set of growth parameters was superior. Overall, the surface area produced by the third test series (C-1 through C-5) was less than that in the second test series (B-1, B-2, and B-3). The reduction of surface area may be the result of the shorter growth time. The final sample in this series attempted growth at different gas concentrations (40%/40%/20% H2/CH4/Ar); however, results were not favorable.

Given that the surface area increases substantially despite the fact that dense petal growth only occurred within the first pore diameter (300 µm), petal growth may be a viable method for increasing surface area. The first pore diameter only accounts for ~10% of the foam volume. Given that the specific surface area of the entire sample can be doubled despite limited penetration, more evenly distributed petal growth could increase surface area by more than an order of magnitude. Moreover, since the pore-structure appears to be mesoporous rather than microporous, the pore size may be optimal for increased adsorption capacity without making the adsorbed label too stable for desorption cooling.

Requirements for Rapid Desorption Cooling Appropriate for High-Heat-Flux Loads. The graphitic foam has relatively small surface area (~0.1 m² g⁻¹) when compared to common adsorbents (10-1000 m² g⁻¹). This is primarily because graphitic foam has been engineered to act as an extended surface for convective heat transfer, and to achieve this, the foam must have an open-macroporous structure. In a flash-boiling cooling system, the majority of cooling will be provided via convective heat transfer; therefore, achieving maximal desorptive cooling is desired so long as it does not inhibit fluid flow or the conductivity of the porous medium. A hierarchical pore structure is seen as at least one exemplary approach to achieve this end. To consider the effect of desorption on such a system, the net desorption enthalpy and the rate at which desorption occurs must be considered.

Net Enthalpy of Desorption. If desorption cooling is to be implemented for the present goal of moderating temperatures of transient, high-heat flux loads, the net enthalpy change due to desorption must be increased significantly. The most viable method for accomplishing this is to increase the specific surface area of the porous medium.

Green's Functions, previously discussed, showed that additional cooling can offset the thermal mass of the system during a pulsed heat load. The 'cooling assist' lowered the temperature overshoot during the initial transient start-up period. To establish the requirements of desorption cooling, the purpose of the desorption cooling mechanism is, for the present case, to provide this additional transient cooling.

For a case without cooling anticipation, the optimal net cooling provided by the transient cooling assist was given as: $\int_0^\infty q''_{assist}/q''_o dFo=0.5$. By evaluating the integral, the required net cooling will be:

$$Q^*_{assist} = \frac{\alpha_p Q''_{assist}}{L_p^2 q''_0} = 0.5 \tag{3.6}$$

where $\alpha_p$ and $L_p$ are the thermal diffusivity and thickness of the plate.

The area-weighted net cooling provided by desorption from the foam is:

$$Q''_d = h_w A_{sa} L_h \tag{3.7}$$

where $L_h$ is the height of the foam block and $A_{sa}$ is the volume-weighted interfacial area between the solid and adsorbed phases (i.e., the volume-weighted specific surface area). The wetting enthalpy, $h_w$, is chosen here because it represents the amount of cooling in excess of that provided by the latent heat of methanol (i.e., the primary cooling mechanism). It may be appropriate to instead use the adsorption enthalpy, $h_{ads}$, if desorption cooling is expected to occur more quickly than cooling via convection.

The viability of desorption cooling for offsetting the thermal mass of the plate is evaluated by:

$$Q^*_d = \frac{\alpha_p h_w A_{sa} L_h}{L_p^2 q''_0} = 0.5 \tag{3.8}$$

From results in the literature, the wetting enthalpy of pristine graphitic surfaces is approximately 100 mJ/m². This value can be increased by modifying the surface, such as by oxidation; however, increased adsorption enthalpy will generally increase the stability of the adsorbed phase, requiring higher temperatures and/or lower pressures to induce desorption.

Assuming the plate is made of copper, the thermal diffusivity is 1.11 cm² s⁻¹. Additionally assume the porous medium is 1 cm high and the plate is 0.5 cm thick (solely for the case of this explanatory example). By applying these values to Equation (3.8), the following expression is obtained:

$$\frac{A_{sa}}{q''_0} = 0.5 \frac{L_p^2}{\alpha_p} \frac{1}{h_w L_h} = 2.25 \times 10^4 \text{ cm } W^{-1} \tag{3.9}$$

Assuming that the heat load, $q''_o$, is 10 W cm⁻², the required volume-weighted specific surface area will be 2.25×10⁷ m² m⁻³. Given that the effective density of KFOAM® P1 is 0.45 g cm⁻³, this is equivalent to a mass-weighted specific surface area of 50 m² g⁻¹.

Instead of normalizing the desorption requirement by the duration/magnitude of temperature transients, it is informative to instead consider performance based on the amount of time the desorption mechanism can cool the heat load. For the above value of volume-weighted specific surface area, 2.25×10⁷ m² m⁻³, the net desorption cooling is sufficient to cool the 10 W cm⁻² load for:

$$t_d = \frac{Q''_d}{q''_0} = \frac{h_w A_{sa} L_h}{q''_0} = 0.23 \text{ s} \tag{3.10}$$

The above analysis makes the assumption that the adsorbed phase over the entirety of the porous medium is desorbed; however, this assumption may not be valid. To induce desorption, the pressure of the fluid must be sufficiently low, and the local temperature of the porous medium must be sufficiently high.

Pressure Drop Required to Induce Desorption. The pressure drop required to induce desorption can be estimated using the information provided by adsorption isotherms. Assuming that the porous medium has a pristine graphitic surface and the adsorbate is methanol, the isotherm will take the form shown in FIG. 33. An approximately step-wise transition in surface coverage occurs over a relatively narrow window between about 0.25-0.3 relative pressure where surface coverage increases from near zero to 10 mol m⁻². The same range of surface coverage accounts for the majority of the desorption enthalpy in excess of the latent heat. In terms of energy content, surface coverage beyond this point ($p/p_o$>0.3) is effectively condensation. Therefore, the majority of desorption cooling is obtained at this step-wise transition.

For the purpose of establishing design parameters, the surface coverage is approximated by a step function occurring at a transition pressure. To induce desorption cooling, the pressure of the vapor phase must drop below this transition pressure. For example, if the porous medium is assumed to have a uniform temperature of 25° C., desorption of the entire adsorbed layer approximately occurs once the pressure falls below: $p_\infty$<0.27 $p_o$. Since the saturation pressure at 25° C. is 17.0 kPa, the system pressure must be reduced to 4.59 kPa or lower.

The saturation temperature at the foregoing transition pressure is 2.0° C. Assuming the desorption system is paired with a phase-change cooling mechanism, this is equivalent to a superheat of 23° C. This value is comparable to the wall superheat requirement for a cooling system based on flash, flow, or pool boiling.

However, as the wetting enthalpy is increased, such as by surface oxidation, desorption does not occur until lower absolute pressures (increasing the requisite pressure drop). For example, even though the wetting enthalpy may be increased by over 50% through oxidation, the relative pressure required to desorb half of the initial monolayer reduced from approximately 0.3 to 0.1. As a result, the pressure drop required for equivalent desorption is increased significantly. Depending on the pressure and temperature of the application, the lesser desorption may offset any gains in the enthalpy, and in extreme cases, prevents significant desorption from occurring. Multi-wall adsorbate-adsorbent interactions enhance the stability of the adsorbed phase; therefore, a similar argument can be made against a porous medium dominated by micropores.

Active-Desorption Length of the Porous Medium. If desorption cooling is assisting a primary cooling mechanism driven by phase-change, the foam is acting as an extended surface for convective heat transfer. As discussed in Section 5.4, the temperature of the porous medium approaches the fluid temperature as the distance from the base increases. As a result, only a limited amount of the porous medium is at a sufficient local temperature to cause desorption at a given pressure condition.

Assuming the height of the porous medium is relatively large, it acts as an infinitely long fin. To simplify the analysis, it is further assumed that the pressure is uniform throughout the domain, $p_\infty$. Additionally, the phase-change process is assumed to keep the fluid at constant temperature, $T_1=T_{sat}(p_\infty)$. In this case, the porous medium can be treated as a 1-dimensional fin, and has the temperature distribution in Equation (2.32).

Far away from the heated surface, the temperature of the porous medium is equal to the temperature of the fluid, $T_1$, which is be sufficient to induce desorption since the local H relative pressure is equal to unity ($p_o(T_1)=p_\infty$). Nearer the heated surface, the temperature of the porous medium increases. The temperature and pressure at which desorption occurs is determined using the expression for isosteric enthalpy:

$$\Delta h_{ads} = -R \frac{T_{ref} T(x)}{T(x) - T_{ref}} \ln \frac{p_n(T(x))}{p_{n,ref}} \quad (3.11)$$

Recall the above equation is formulated for constant surface coverage. By again assuming that surface coverage is approximately a step function, the pressure, $p_n(x)$, at which desorption occurs for a given temperature, $T(x)$, can be determined by knowing when desorption occurs at a reference state, $T_{ref}$, $p_{n,ref}$. The reference state for desorption is determined experimentally from an adsorption isotherm.

Equation (3.11) can be rearranged into the following form:

$$T(x) = \left[ \frac{1}{T_{ref}} + \frac{R}{h_{ads}} \ln \frac{p_{n,ref}}{p_n(T(x))} \right]^{-1} \quad (3.12)$$

The objective is to find the location, $x_{crit}$, where the temperature is sufficient to induce desorption. This occurs when $p_n(T(x_{crit})) \approx p_\infty$.

$$T(x_{crit}) = \left[ \frac{1}{T_{ref}} + \frac{R}{h_{ads}} \ln \frac{p_{n,ref}}{p_\infty} \right]^{-1} \quad (3.13)$$

In order to write the above expression in terms of the saturation temperature, the Clausius-Clapeyron equation is applied:

$$\frac{dp}{dT} = \frac{h_{fg}}{T \Delta v} \quad (3.14)$$

Assuming the specific volume of methanol is much greater than the liquid phase, and is approximated by an ideal gas, the Equation (3.14) reduces to:

$$\Delta h_{fg} = -R \frac{T_{ref} T_\infty}{T_\infty - T_{ref}} \ln \frac{p_\infty}{p_{o,ref}} \quad (3.15)$$

which relates the thermodynamic variables between a reference state ($T_{ref}$, $p_{o,ref}$) and that of the saturated fluid ($T_\infty$, $p_\infty$). Here, the temperature of the reference state is chosen to be the same as in Equation (3.11) for convenience.

The logarithm in Equation (3.13) can be rewritten to include the saturation pressure at the reference state:

$$\ln \frac{p_{n,ref}}{p_\infty} = \ln \frac{p_{n,ref}}{p_{o,ref}} - \ln \frac{p_{o,ref}}{p_\infty} \quad (3.16)$$

The quantity, $p_{n,ref}/p_{o,ref}$ is simply the relative pressure at which desorption occurs at the reference temperature.

By applying Equation (3.16) and Equation (3.15) to the equation for the temperature at which desorption occurs (Eq. (3.13)), the following relation is identified:

$$T(L_{act}) = \frac{T_{ref}}{1 + \frac{RT_{ref}}{h_{ads}} \ln \frac{p_{n,ref}}{p_{o,ref}} + \frac{h_{fg}}{h_{ads}} \left( \frac{T_{ref}}{T_\infty} - 1 \right)} \quad (3.17)$$

The effective height of the foam for which desorption is active (i.e. the active-desorption length), $L_{act}$, is found by applying the above equation to a known temperature profile resultant of the primary convective cooling mechanism. Using Equation (2.32), the height of the foam that is active for desorption is calculated as:

$$L_{act} = -\sqrt{\frac{k_s L_{fin}}{h_{sf}}} \ln \left[ \frac{-T_\infty}{T_b - T_\infty} + \frac{T_{ref}/T_b - T_\infty}{1 + \frac{RT_{ref}}{h_{ads}} \ln \frac{p_{n,ref}}{p_{o,ref}} + \frac{h_{fg}}{h_{ads}} \left( \frac{T_{ref}}{T_\infty} - 1 \right)} \right] \quad (3.18)$$

If the above analysis needs to be more accurate or applied to an adsorbate that does not have an approximately stepwise transition, Equation (3.17) could instead be integrated over the expected temperature distribution of the porous medium, accounting for the temperature dependence of the term $p_{n,ref}/p_{o,ref}$ and the surface coverage dependence of the adsorption enthalpy, $h_{fg}$. The present form is chosen for conceptual clarity, i.e., a distinct length-scale ($L_{act}$).

Figure 34A:
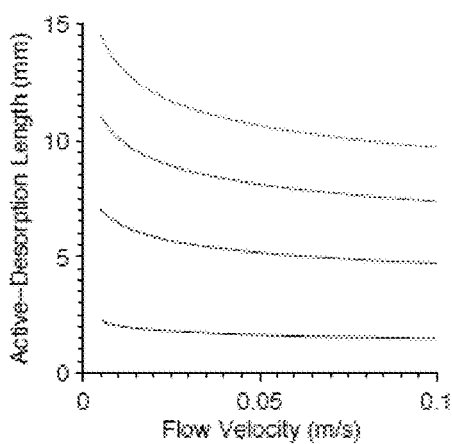
FIGS. 34A and 34B show line graphs of an analysis of the active-desorption length in a system with convective cooling via liquid methanol, with FIG. 34A showing the length of the foam that is active for desorption and FIG. 34B showing the heat flux due to convective cooling.
Figure 34B:
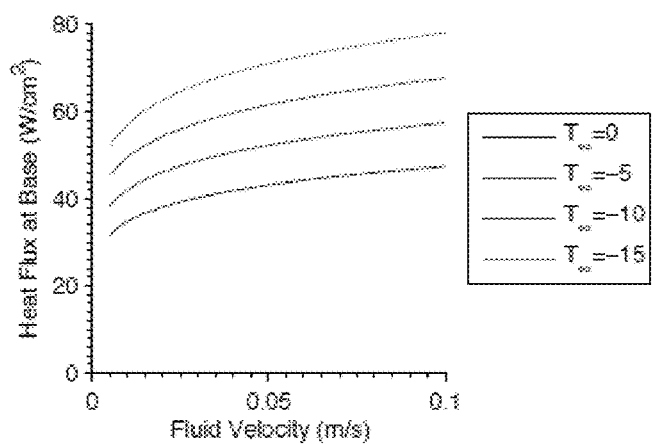

All of the factors in the Equation (3.18) are determined by the properties of the adsorbate and the adsorbent other than the temperatures of the fluid and the wall, and the pore-wall heat transfer coefficient, $h_{sf}$. As a performance baseline, consider the case where the heat transfer coefficient is that predicted by liquid-methanol flow. The temperature at the base is 25° C., and the temperature of the fluid is varied. The foam is assumed to be KFOAM® P1, and the surface is assumed to be graphitic with the reference state for stepwise desorption being at 15° C. and a relative pressure of 0.25. The results are shown in FIGS. 34A and 34B.

Recall that the pressure must drop below 4.59 kPa to induce desorption at the base temperature of 25° C. The corresponding saturation temperature is 2.0° C.; therefore, results are only meaningful if the fluid temperature is below this value. The active-desorption length increases as the temperature of the liquid decreases, despite the enhancement to convective cooling, which further suppresses the temperature of the fin.

When utilizing a phase-change cooling mechanism, the heat transfer coefficient may vary significantly from that of single-phase convection cooling. Therefore, it is informative to instead consider the active-desorption length as a function of the Nusselt number.

Figure 35A:
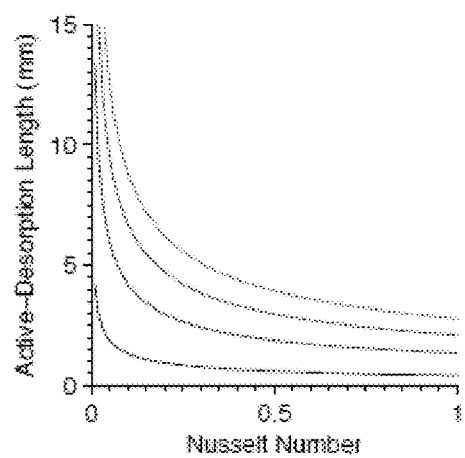
FIGS. 35A and 35B show line graphs of an analysis of the active desorption length in systems with an enhanced heat transfer coefficient; Nusselt number based on effective pore diameter, with FIG. 35A showing the length of the foam that is active for desorption and FIG. 35B showing the heat flux due to convective cooling.
Figure 35B:
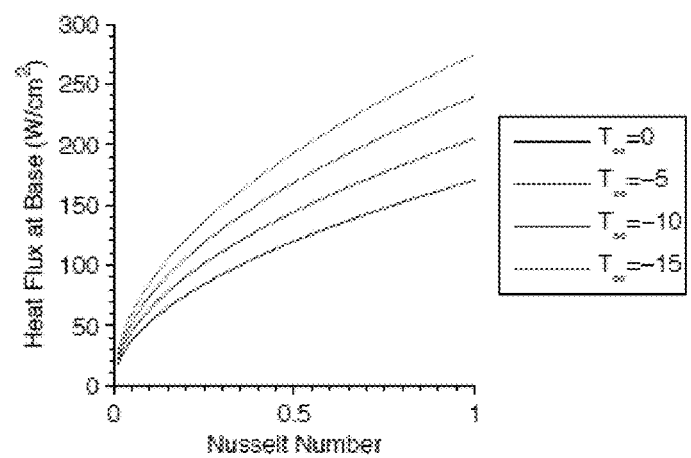

As the heat transfer coefficient increases, the effect of desorption cooling is suppressed for two reasons. First, the active-desorption length is reduced (as in FIG. 35A). Second, since convection is enhanced, the relative magnitude of the desorption cooling is decreased. In Equation (3.8), these effects are accounted for by the foam height, which is now the active-desorption length, and the cooling flux of the primary cooling mechanism, $q''_o$.

Provided that convective cooling is dominated by the fin, the resultant cooling flux will be proportional to $\sqrt{h_{sf}}$, as shown in Equation (2.33). The active-desorption length will be inversely proportional to $\sqrt{h_{sf}}$, as shown in Equation (3.18). As a result, the previously introduced metric for desorption cooling is inversely proportional to the heat transfer coefficient:

$$Q^*_d = \frac{\alpha_p h_w A_{sa}}{L_p^2} \frac{L_{crit}}{q''_0} \propto \frac{1}{h_{sf}} \tag{3.19}$$

Therefore, desorption cooling is more viable in systems with a lesser heat transfer coefficient. Unfortunately, the heat transfer coefficient for phase-change cooling mechanisms, with which desorption desorption is most likely to paired, tend to be fairly high. As a result, the requirement for specific surface area may be further increased if desorption cooling is applied to high-heat-flux applications.

Rate of Desorption in a Non-Equilibrium Liquid-Vapor System. The analysis of the net desorption enthalpy in the previous section utilizes adsorption isotherms. Isotherms provide the surface coverage at varying pressure under equilibrium conditions; however, the surface coverage in a highly non-equilibrium liquid-vapor system will not necessarily match. To consider the coverage in the presence of a two-phase fluid, the physical mechanisms by which desorption and adsorption occur need to be considered.

Previously, the rate of adsorption and desorption was discussed. When in equilibrium with the vapor phase, the temperature determines the rate at which molecules desorb, while the pressure determines the rate at which molecules adsorb. Generally, these rates are very large, so the typical adsorbed phase is in local equilibrium is maintained when the temperature or pressure of the system changes. The same is true for liquid-vapor phase change, other than near the thermodynamic superheat limit.

In order to obtain appreciable surface area, the system likely contains many small pores (<1 μm), which will dominate the adsorption characteristics of the system. Therefore the 'local' fluid phase relevant to adsorption is that inside the small pores, rather than that outside the porous medium, or in large pores ~100 μm in graphitic foam).

The pressure of the local fluid phase is primarily relevant because it indicates how often molecules strike the surface. If the fluid in direct contact with the surface is in the vapor phase, the surface concentration is likely to be that predicted by an isotherm by using on the local pressure and temperature.

However, if the fluid in contact with the solid surface is in the liquid phase, desorption is unlikely to occur regardless of what the pressure of the liquid may be, since the rate at which molecules arrive at the surface will be equivalent to that expected at the saturation pressure in an equilibrium system. In the latter case, the surface should be completely covered.

The surface coverage of the sample and the rate at which it changes is determined by whether the pores are liquid-filled or vapor-filled. Adsorption theory asserts that the adsorbate condenses within these pores as the pressure of the system approaches the saturation pressure, indicating that the pores are likely to be initially filled with liquid. However, the pores could be gas-filled if the liquid-vapor system is not pure (e.g., including non-condensing gas).

However, once liquid-vapor phase change is initiated by nucleation, the presence of the vapor phase may allow these small-scale pores to begin emptying. If the pores are emptied of liquid, desorption will likely occur rapidly, provided that the local pressure and temperature predict lesser coverage in the equilibrium state. However, the liquid meniscus might be preserved along the pore walls, covering these small-scale pores. If the meniscus is preserved, desorption will likely not occur until the foam dewets.

Experimental Parameters. The experimental data was obtained via two experimental series of runs. Both were designed using the Design Expert® (Stat-Ease, Inc.) software. Experimental series A examined four experimental parameters: heater power, methanol volume, vacuum pressure, and cooling anticipation. The experimental design was generated by varying the raw values of the experimental parameters within lower and upper limits that define the boundaries of the design space. The original design consisted of 22 runs. Based on the predictions of the original data set, two additional runs were performed, P1 and P2.

Data gathered from the first experimental series indicated that the cooling mechanism performed the best when the amount of methanol was minimized (2 mL). In response, experimental series B examined behavior in a lower volume range (0.2-3 mL). In addition, the volume of the vacuum tank was varied as well by either closing or opening the isolation valve between the 11.4 L and 114 L vacuum tanks. As a method of constraining to the design space to only the most relevant conditions, the experimental series B was designed using two non-dimensional design parameters:

$$q^* = \frac{q_c}{q_h} = \frac{A_{base}}{A_h} \frac{h(T_i - T_{sat})}{q''_h} \tag{3.20}$$

and $$Fo_{ant} = \frac{\alpha t_{ant}}{L^2} \tag{3.21}$$

where $q^*$ is the estimated ratio of the cooling and heating fluxes, and determines the saturation temperature (vacuum pressure). The cooling flux is approximated using 25000 W m$^{-2}$ K$^{-1}$ as the effective heat transfer coefficient. The area of the foam base is four times that of the heaters ($A_{base}/A_h=4$). The Fourier number for anticipation is varied between 0 and 2. Heater power, methanol volume, and vacuum-tank pressure were scaled based on their raw values. For reference, a third non-dimensional value is shown in Table 1.5 for the methanol volume, namely:

$$Q^*_{vap} = \frac{V_{liq}\rho_l h_{fg}}{q_h t_h} \quad (3.22)$$

where $t_h$ is the time the heater is active, 5 s. The quantity $Q^*_{vap}$ is the ratio of latent cooling available to the total energy imparted by the heater.

TABLE 1.4

Experimental design for experimental series A. All tests in this series utilized the 11.4 L vacuum tank.

| Run | $q_h$ (W) | $V_{liq}$ (ml) | $P_{vac}$ (kPa) | $t_{ant}$ (ms) |
|---|---|---|---|---|
| A-1 | 100 | 2 | 2.90 | 0 |
| A-2 | 50 | 2 | 9.86 | 128 |
| A-3 | 72 | 10 | 9.86 | 440 |
| A-4 | 100 | 6 | 9.86 | −60 |
| A-5 | 0 | 10 | 9.86 | 0 |
| A-6 | 50 | 6 | 6.41 | 190 |
| A-7 | 100 | 10 | 6.41 | 128 |
| A-8 | 0 | 10 | 4.83 | 440 |
| A-9 | 0 | 6 | 2.90 | 128 |
| A-10 | 50 | 6 | 6.41 | −60 |
| A-11 | 50 | 6 | 6.41 | 190 |
| A-12 | 50 | 6 | 6.41 | 190 |
| A-13 | 100 | 10 | 6.41 | 128 |
| A-14 | 27.5 | 2 | 2.90 | 440 |
| A-15 | 50 | 10 | 2.90 | −60 |
| A-16 | 88 | 6.8 | 2.90 | 115 |
| A-17 | 71 | 2 | 4.48 | 250 |
| A-18 | 100 | 2 | 7.93 | 440 |
| A-19 | 0 | 2 | 6.41 | −60 |
| A-20 | 100 | 7.8 | 2.90 | 440 |
| A-21 | 50 | 6 | 6.41 | 190 |
| A-22 | 0 | 4.2 | 9.86 | 440 |
| A-P1 | 82 | 2 | 2.90 | 179 |
| A-P2 | 46 | 5.4 | 7.20 | 200 |

TABLE 1.5

Experimental design for experimental series B.

| Run | $q_h$ (W) | $V_{liq}$ (ml) | $P_{vac}$ (kPa) | $t_{ant}$ (ms) | $V_{vac}$ (L) | $Q^*_{vap}$ | $q^*$ | $Fo_{ant}$ |
|---|---|---|---|---|---|---|---|---|
| B-1 | 25.8 | 0.35 | 10.9 | 120 | 125 | 2.6 | 2 | 0.8 |
| B-2 | 75.3 | 1.60 | 6.6 | 140 | 11.4 | 4.0 | 1.38 | 1 |
| B-3 | 33.4 | 0.20 | 13.0 | 200 | 11.4 | 1.1 | 0.94 | 1.4 |
| B-4 | 126 | 0.20 | 5.9 | 180 | 11.4 | 0.30 | 0.91 | 1.2 |
| B-5 | 25.8 | 1.25 | 13.3 | 290 | 125 | 9.2 | 1.13 | 2 |
| B-6 | 46.2 | 3.00 | 12.6 | 120 | 125 | 12.3 | 0.75 | 0.8 |
| B-7 | 110 | 3.00 | 6.8 | 0 | 11.4 | 5.1 | 0.91 | 0 |
| B-8 | 42.0 | 0.20 | 8.4 | 290 | 11.4 | 0.90 | 1.88 | 2 |
| B-9 | 126 | 3.00 | 1.4 | 40 | 125 | 4.5 | 2 | 0.3 |
| B-10 | 126 | 1.40 | 7.2 | 0 | 125 | 2.1 | 0.75 | 0 |
| B-11 | 75.3 | 1.60 | 6.6 | 140 | 11.4 | 4.0 | 1.38 | 1 |
| B-12 | 80.3 | 0.20 | 5.8 | 0 | 1.25 | 0.47 | 1.47 | 0 |
| B-13 | 79.2 | 0.20 | 10.1 | 250 | 125 | 0.48 | 0.75 | 1.7 |
| B-14 | 25.8 | 3.00 | 12.9 | 210 | 11.4 | 22.0 | 1.28 | 1.4 |
| B-15 | 126 | 2.90 | 1.4 | 280 | 11.4 | 4.3 | 2 | 1.9 |
| B-16 | 126 | 0.54 | 1.4 | 290 | 125 | 0.8 | 2 | 2 |
| B-17 | 75.3 | 1.60 | 6.6 | 140 | 125 | 4.0 | 1.38 | 1 |
| B-18 | 53.0 | 3.00 | 6.5 | 290 | 125 | 10.7 | 2 | 2 |
| B-19 | 25.8 | 0.20 | 14.4 | 0 | 11.4 | 1.5 | 0.75 | 0 |
| B-20 | 31.4 | 2.15 | 9.9 | 0 | 11.4 | 12.9 | 2 | 0 |

TABLE 1.5-continued

Experimental design for experimental series B.

| Run | $q_h$ (W) | $V_{liq}$ (ml) | $P_{vac}$ (kPa) | $t_{ant}$ (ms) | $V_{vac}$ (L) | $Q^*_{vap}$ | $q^*$ | $Fo_{ant}$ |
|---|---|---|---|---|---|---|---|---|
| B-21 | 75.3 | 1.60 | 6.6 | 140 | 11.4 | 4.0 | 1.38 | 1 |
| B-22 | 127 | 0.20 | 1.4 | 0 | 11.4 | 0.30 | 2 | 0 |
| B-23 | 25.8 | 2.90 | 12.4 | 0 | 125 | 21.2 | 1.43 | 0 |
| B-24 | 75.3 | 1.60 | 6.6 | 140 | 125 | 4.0 | 1.38 | 1 |
| B-25 | 76.4 | 1.90 | 10.3 | 290 | 11.4 | 4.7 | 0.75 | 2 |
| B-26 | 76.4 | 1.90 | 10.3 | 290 | 11.4 | 4.7 | 0.75 | 2 |
| B-27 | 127 | 3.00 | 5.0 | 290 | 125 | 4.5 | 1.06 | 2 |

While various embodiments of compositions, systems, and methods hereof have been described in considerable detail, the embodiments are merely offered by way of non-limiting examples. Many variations and modifications of the embodiments described herein will be apparent to one of ordinary skill in the art in light of the disclosure. It will therefore be understood by those skilled in the art that various changes and modifications may be made, and equivalents may be substituted for elements thereof, without departing from the scope of the disclosure. Indeed, this disclosure is not intended to be exhaustive or too limiting. The scope of the disclosure is to he defined by the appended claims, and by their equivalents.

Further, in describing representative embodiments, the disclosure may have presented a method and/or process as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps disclosed herein should not be construed as limitations on the claims. In addition, the claims directed to a method and/or process should not be limited to the performance of their steps in the order written, and one skilled in the art can readily appreciate that the sequences may be varied and still remain within the spirit and scope of the present disclosure.

It is therefore intended that this description and the appended claims will encompass, all modifications and changes apparent to those of ordinary skill in the art based on this disclosure.

The invention claimed is:

1. A heat transfer device comprising:
    a first chamber defining an interior and comprising a top, a bottom, and at least one inlet port;
    at least one second chamber, each of the at least one second chambers in fluid communication with the first chamber via one or more transverse ports, and each of the at least one second chambers in fluid communication with an exit port;
    a heat exchanger thermally coupled with the first chamber, affixed to a baseplate positioned outside of the first chamber, and configured to distribute heat energy from one or more heat sources in thermal communication therewith into at least one of the second chambers; and
    a first low pressure reservoir in fluid communication with the exit port via a first tubing and a vacuum pump via a second tubing, the first tubing comprising at least one first valve for isolating the first low pressure reservoir from the at least one second chamber when closed;
    wherein when fluid is received within the interior of the first chamber and the chamber is depressurized, a flash boiling event can occur within the first chamber.

2. The heat transfer device of claim 1, wherein the first chamber is positioned within an interior of at least one of the second chambers.

3. The heat transfer device of claim 2, wherein the at least one second chamber comprises at least three second chambers, with two of the at least three second chambers and the first chamber positioned within the interior of the third second chamber.

4. The heat transfer device of claim 1, further comprising one or more heat sources in thermal communication with the heat exchanger.

5. The heat transfer device of claim 1, wherein the heat exchanger is positioned within the first chamber and further comprising a storage reservoir in fluid communication with the at least one inlet port of the first chamber and the vacuum pump via a fourth tubing such that vapor pulled from the exit port can flow through the vacuum pump, the fourth tubing, and into the storage reservoir.

6. The heat transfer device of claim 1, wherein:
the at least one inlet port of the first chamber is positioned to promote a flow of fluid into the interior of the first chamber, toward the bottom of the first chamber, and through the one or more transverse ports; and
the exit port is in communication with the vacuum pump such that suction can be applied therethrough.

7. The heat transfer device of claim 1, further comprising a porous medium positioned within the interior of the first chamber, the porous medium comprising a morphology that provides enhanced nucleate boiling characteristics.

8. The heat transfer device of claim 2, further comprising a porous medium positioned within the interior of the first chamber, the porous medium comprising pores, channels, microchannels, minichannels, fins, surface fins, and/or slate fins that provide enhanced nucleate boiling characteristics.

9. The heat transfer device of claim 7, wherein:
the porous medium comprises a body extending between a first end and a second end;
the morphology of the porous medium comprises a hierarchical pore size distribution ranging from a smallest pore size to a largest pore size along the length of the porous medium, with the smallest pore size positioned at the second end of the porous medium; and
the second end of the porous medium is directly adjacent to the heat exchanger.

10. The heat transfer device of claim 7, wherein the porous medium is coupled with the heat exchanger by a braze joint.

11. A heat transfer system comprising:
a heat transfer device comprising:
a first chamber defining in interior and comprising a top, a bottom, and at least one inlet port,
at least one second chamber, each of the at least one second chambers in fluid communication with the first chamber via one or more transverse ports, each of the at least one second chambers in fluid communication with an exit port, and at least one of the at least one second chambers defining an interior in which the first chamber is positioned,
a heat exchanger thermally coupled with the first chamber and configured to distribute heat energy from one or more heat sources in thermal communication therewith to at least one of the second chambers,
wherein when fluid is received within the interior of the first chamber and the chamber is depressurized, a flash boiling event can occur within the first chamber; and
a first low pressure reservoir in fluid communication with the exit port of the heat transfer device via a first tubing and a vacuum pump via a second tubing, the first tubing comprising at least one first valve for isolating the first low pressure reservoir from the heat transfer device when closed.

12. The heat transfer system of claim 11, wherein the at least one first valve of the first tubing comprises a pneumatically actuated valve.

13. The heat transfer system of claim 11, wherein the at least one second chamber comprises at least three second chambers, with two of the at least three second chambers and the first chamber positioned within the interior of the third second chamber.

14. The heat transfer system of claim 11, wherein the heat exchanger of the heat transfer device is positioned within the first chamber and the system further comprises a storage reservoir in fluid communication with the at least one inlet port of the first chamber of the heat transfer device and the vacuum pump, the storage reservoir housing a supply of phase change fluid.

15. The heat transfer system of claim 11, further comprising a second low pressure reservoir in fluid communication with the first low pressure reservoir via a third tubing, the third tubing comprising a second valve for isolating the second low pressure reservoir from the first low pressure reservoir when closed, and wherein the second low pressure reservoir comprises a greater volume than the first low pressure reservoir.

16. The heat transfer system of claim 14, further comprising one or more balance-of-plant components for rapidly refilling the first chamber of the heat transfer device to allow for a cyclic introduction of phase change fluid from the storage reservoir into the heat transfer device in synchrony with a cyclic heating event of one or more heat sources in thermal communication with the heat transfer device.

17. A method for rapidly cooling a heat source comprising:
providing a heat transfer device comprising:
a first chamber defining an interior and comprising a top, a bottom, and at least one inlet port,
at least one second chamber, each of the at least one second chambers in fluid communication with the first chamber via one or more transverse ports, and each of the at least one second chambers in fluid communication with an exit port,
a heat exchanger thermally coupled with one or more heat sources and the first chamber, the heat exchanger configured to distribute heat energy from the one or more heat sources to at least one of the second chambers, and
a first low pressure reservoir in fluid communication with the exit port via a first tubing and a vacuum pump via a second tubing, the first tubing comprising at least one first valve for isolating the first low pressure reservoir from the heat transfer device when closed,
wherein when fluid is received within the interior of the first chamber and the chamber is depressurized, a flash boiling event can occur within the first chamber and a convective transfer of heat energy from the one or more heat sources into the fluid results,
filling the first chamber of the heat transfer device with an amount of a phase change fluid; and
rapidly cooling the one or more heat sources through convective heat transfer by rapidly depressurizing the first chamber of the heat transfer device such that a rapid temperature drop in the phase change fluid results;

wherein rapidly cooling the one or more heat sources is actively triggered in connection with an actual or anticipated heat pulse from the one or more heat sources and the one or more heat sources maintains a at or about an even temperature during the heat pulse.

18. The method of claim 17, wherein:

the heat transfer device further comprises a porous medium positioned within the interior of the first chamber, the porous medium comprising a morphology that provides enhanced nucleate boiling characteristics; and the amount of phase change fluid used to fill the first chamber only partially fills the first chamber of the heat transfer device such that the fluid partially immerses the porous medium within the interior of the first chamber; and further comprising promoting the flow of the phase change fluid through the interior of the first chamber from the top of the chamber to the bottom of the chamber such that the rapid temperature drop occurs at or adjacent to the bottom of the first chamber, wherein the one or more heat sources are positioned directly adjacent to the bottom of the first chamber.

19. The method of claim 17, wherein rapidly depressurizing the first chamber of the heat transfer device is actively triggered in advance of the heat pulse by 10-1000 milliseconds.

\* \* \* \* \*